(12) United States Patent
Oikawa et al.

(10) Patent No.: US 11,682,733 B2
(45) Date of Patent: Jun. 20, 2023

(54) SEMICONDUCTOR DEVICE, MANUFACTURING METHOD OF THE SEMICONDUCTOR DEVICE, OR DISPLAY DEVICE INCLUDING THE SEMICONDUCTOR DEVICE

(71) Applicant: Semiconductor Energy Laboratory Co., Ltd., Atsugi (JP)

(72) Inventors: Yoshiaki Oikawa, Atsugi (JP); Nobuharu Ohsawa, Zama (JP); Masami Jintyou, Shimotsuga (JP); Yasutaka Nakazawa, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 58 days.

(21) Appl. No.: 17/330,463

(22) Filed: May 26, 2021

(65) Prior Publication Data

US 2021/0288183 A1    Sep. 16, 2021

Related U.S. Application Data

(63) Continuation of application No. 16/704,416, filed on Dec. 5, 2019, now Pat. No. 11,038,065, which is a
(Continued)

(30) Foreign Application Priority Data

Nov. 20, 2015  (JP) ................................. 2015-227399

(51) Int. Cl.
*H01L 29/786* (2006.01)
*H01L 27/12* (2006.01)
(Continued)

(52) U.S. Cl.
CPC .......... *H01L 29/7869* (2013.01); *H01L 21/28* (2013.01); *H01L 27/124* (2013.01);
(Continued)

(58) Field of Classification Search
CPC ..... H01L 29/7869; H01L 29/04; H01L 29/45; H01L 29/4908; H01L 29/78648;
(Continued)

(56) References Cited

U.S. PATENT DOCUMENTS

| 6,853,078 B2 | 2/2005 | Yamaya et al. |
| 8,076,239 B2 | 12/2011 | Kawamura et al. |

(Continued)

FOREIGN PATENT DOCUMENTS

| CN | 102005449 A | 4/2011 |
| CN | 103872259 A | 6/2014 |

(Continued)

OTHER PUBLICATIONS

International Search Report (Application No. PCT/IB2016/056761) dated Jan. 31, 2017.
(Continued)

*Primary Examiner* — Dao H Nguyen
(74) *Attorney, Agent, or Firm* — Robinson Intellectual Property Law Office; Eric J. Robinson

(57) ABSTRACT

The transistor includes a first gate electrode, a first insulating film over the first gate electrode, an oxide semiconductor film over the first insulating film, a source electrode over the oxide semiconductor film, a drain electrode over the oxide semiconductor film, a second insulating film over the oxide semiconductor film, the source electrode, and the drain electrode, and a second gate electrode over the second insulating film. The first insulating film includes a first opening. A connection electrode electrically connected to the first gate electrode through the first opening is formed over the first insulating film. The second insulating film includes a second opening that reaches the connection electrode. The second gate electrode includes an oxide conductive film and a metal film over the oxide conductive
(Continued)

film. The connection electrode and the second gate electrode are electrically connected to each other through the metal film.

8 Claims, 40 Drawing Sheets

Related U.S. Application Data continuation of application No. 15/775,960, filed as application No. PCT/IB2016/056761 on Nov. 10, 2016, now Pat. No. 10,559,697.

(51) Int. Cl.
- *H01L 21/28* (2006.01)
- *H01L 29/49* (2006.01)
- *H01L 29/04* (2006.01)
- *H01L 29/45* (2006.01)

(52) U.S. Cl.
CPC ...... *H01L 27/1225* (2013.01); *H01L 27/1255* (2013.01); *H01L 29/04* (2013.01); *H01L 29/45* (2013.01); *H01L 29/4908* (2013.01); *H01L 29/78648* (2013.01); *H01L 29/78696* (2013.01)

(58) Field of Classification Search
CPC .............. H01L 29/78696; H01L 21/28; H01L 27/1225; H01L 27/124; H01L 27/1255
USPC .......................................................... 257/43
See application file for complete search history.

(56) References Cited

U.S. PATENT DOCUMENTS

| | | | |
|---|---|---|---|
| 8,115,883 B2 | 2/2012 | Yamazaki et al. | |
| 8,274,079 B2 | 9/2012 | Yamazaki | |
| 8,421,068 B2 | 4/2013 | Yamazaki et al. | |
| 8,488,077 B2 | 7/2013 | Yamazaki et al. | |
| 8,492,840 B2 | 7/2013 | Yamazaki et al. | |
| 8,624,240 B2 | 1/2014 | Sato et al. | |
| 8,698,970 B2 | 4/2014 | Yamazaki et al. | |
| 8,737,109 B2 | 5/2014 | Yamazaki et al. | |
| 8,766,372 B2 | 7/2014 | Kuhn et al. | |
| 8,879,011 B2 | 11/2014 | Yamazaki et al. | |
| 8,994,889 B2 | 3/2015 | Yamazaki et al. | |
| 9,024,317 B2 | 5/2015 | Endo et al. | |
| 9,171,803 B2 * | 10/2015 | Koezuka ........... H01L 23/53238 | |
| 9,276,128 B2 | 3/2016 | Nakazawa et al. | |
| 9,306,074 B2 | 4/2016 | Yamazaki et al. | |
| 9,312,353 B2 | 4/2016 | Jeong et al. | |
| 9,331,207 B2 * | 5/2016 | Yamazaki ............ H01L 29/201 | |
| 9,349,751 B2 | 5/2016 | Yamazaki et al. | |
| 9,443,984 B2 | 9/2016 | Yamazaki | |
| 9,508,861 B2 | 11/2016 | Yamazaki et al. | |
| 9,530,856 B2 | 12/2016 | Miyairi | |
| 9,595,541 B2 | 3/2017 | Yamazaki et al. | |
| 9,640,669 B2 | 5/2017 | Yamazaki et al. | |
| 9,666,678 B2 | 5/2017 | Yamazaki et al. | |
| 9,673,234 B2 | 6/2017 | Yamazaki et al. | |
| 9,748,403 B2 | 8/2017 | Koezuka et al. | |
| 9,773,815 B2 | 9/2017 | Yamazaki et al. | |
| 9,837,547 B2 | 12/2017 | Koezuka et al. | |
| 9,876,118 B2 | 1/2018 | Yamazaki et al. | |
| 9,893,203 B2 * | 2/2018 | Bang ..................... H01L 29/786 | |
| 9,929,279 B2 | 3/2018 | Yamazaki et al. | |
| 10,032,929 B2 | 7/2018 | Koezuka et al. | |
| 10,249,764 B2 | 4/2019 | Yamazaki | |
| 10,373,843 B2 | 8/2019 | Yamazaki et al. | |
| 10,566,455 B2 | 2/2020 | Yamazaki et al. | |
| 10,714,625 B2 | 7/2020 | Yamazaki | |
| 2003/0107023 A1 * | 6/2003 | Chae ..................... H01L 29/458 | |
| | | | 257/E21.309 |
| 2005/0122443 A1 | 6/2005 | Kim et al. | |
| 2006/0108636 A1 | 5/2006 | Sano et al. | |
| 2007/0155157 A1 | 7/2007 | Chou et al. | |
| 2009/0283763 A1 | 11/2009 | Park et al. | |
| 2011/0089414 A1 | 4/2011 | Yamazaki et al. | |
| 2011/0284844 A1 | 11/2011 | Endo et al. | |
| 2011/0287580 A1 | 11/2011 | Yamazaki et al. | |
| 2012/0007086 A1 * | 1/2012 | Oh ..................... H01L 29/66765 | |
| | | | 257/E29.291 |
| 2012/0161125 A1 | 6/2012 | Yamazaki | |
| 2012/0280238 A1 | 11/2012 | Kimura | |
| 2013/0207111 A1 * | 8/2013 | Yamazaki ........... H01L 29/7869 | |
| | | | 438/158 |
| 2013/0334533 A1 | 12/2013 | Yamazaki | |
| 2014/0027762 A1 | 1/2014 | Tsurume et al. | |
| 2014/0126271 A1 | 5/2014 | Aoki et al. | |
| 2014/0159008 A1 | 6/2014 | Jeong et al. | |
| 2014/0203275 A1 | 7/2014 | Kim | |
| 2014/0361292 A1 | 12/2014 | Yamazaki et al. | |
| 2015/0171115 A1 | 6/2015 | Yamazaki et al. | |
| 2015/0179675 A1 | 6/2015 | Yamazaki et al. | |
| 2015/0187953 A1 | 7/2015 | Koezuka et al. | |
| 2015/0200208 A1 * | 7/2015 | Lee ....................... H01L 27/124 | |
| | | | 257/43 |
| 2015/0221678 A1 | 8/2015 | Yamazaki et al. | |
| 2015/0221774 A1 | 8/2015 | Yamazaki et al. | |
| 2015/0255310 A1 | 9/2015 | Yamazaki et al. | |
| 2015/0263141 A1 | 9/2015 | Yamazaki et al. | |
| 2015/0263174 A1 | 9/2015 | Yamazaki et al. | |
| 2015/0270403 A1 | 9/2015 | Katayama et al. | |
| 2016/0005873 A1 | 1/2016 | Jintyou et al. | |
| 2016/0133348 A1 | 5/2016 | Kang et al. | |
| 2017/0025544 A1 | 1/2017 | Yamazaki et al. | |
| 2017/0092776 A1 | 3/2017 | Yamazaki et al. | |
| 2017/0125452 A1 | 5/2017 | Ide et al. | |
| 2017/0263497 A1 | 9/2017 | Yamazaki et al. | |
| 2018/0076333 A1 | 3/2018 | Koezuka et al. | |
| 2019/0355592 A1 | 11/2019 | Yamazaki et al. | |
| 2020/0381558 A1 | 12/2020 | Yamazaki | |

FOREIGN PATENT DOCUMENTS

| | | |
|---|---|---|
| JP | 2006-269696 A | 10/2006 |
| JP | 2007-096055 A | 4/2007 |
| JP | 2011-103458 A | 5/2011 |
| JP | 2012-033836 A | 2/2012 |
| JP | 2012-151460 A | 8/2012 |
| JP | 2013-179290 A | 9/2013 |
| JP | 2014-241404 A | 12/2014 |
| JP | 2015-026830 A | 2/2015 |
| JP | 2015-119175 A | 6/2015 |
| JP | 2015-133482 A | 7/2015 |
| JP | 2015-195327 A | 11/2015 |
| JP | 2015-195371 A | 11/2015 |
| JP | 2015-195372 A | 11/2015 |
| KR | 2012-0090000 A | 8/2012 |
| KR | 2012-0099432 A | 9/2012 |
| KR | 2013-0092463 A | 8/2013 |
| KR | 2015-0110340 A | 10/2015 |
| TW | 201123452 | 7/2011 |
| TW | 201539559 | 10/2015 |
| WO | WO-2011/046048 | 4/2011 |

OTHER PUBLICATIONS

Written Opinion (Application No. PCT/IB2016/056761) dated Jan. 31, 2017.

Chinese Office Action (Application No. 201680067710.3) dated Dec. 3, 2020.

* cited by examiner

9100

9200

9101

9201

9102

9201

9201

SEMICONDUCTOR DEVICE, MANUFACTURING METHOD OF THE SEMICONDUCTOR DEVICE, OR DISPLAY DEVICE INCLUDING THE SEMICONDUCTOR DEVICE

TECHNICAL FIELD

One embodiment of the present invention relates to a semiconductor device including an oxide semiconductor film and a display device including the semiconductor device. Alternatively, one embodiment of the present invention relates to a manufacturing method of the semiconductor device including an oxide semiconductor film.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition (a composition of matter). In particular, one embodiment of the present invention relates to a semiconductor device, a display device, a light-emitting device, a power storage device, a memory device, a driving method thereof, or a manufacturing method thereof.

Note that in this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

Attention has been focused on a technique for forming a transistor using a semiconductor thin film formed over a substrate having an insulating surface (also referred to as a field-effect transistor (FET) or a thin film transistor (TFT)). Such a transistor is used in a wide range of electronic devices such as an integrated circuit (IC) or an image display device (display device). A semiconductor material typified by silicon is widely known as a material for a semiconductor thin film that can be used for a transistor, and as another material, an oxide semiconductor has been attracting attention.

For example, a semiconductor device that suppresses formation of a parasitic channel due to gate BT stress by using a transistor having a dual gate structure in which an oxide semiconductor film is provided between two gate electrodes is disclosed (see Patent Document 1).

REFERENCE

[Patent Document]
[Patent Document 1] Japanese Published Patent Application No. 2014-241404

SUMMARY OF THE INVENTION

Problems to be Solved by the Invention

The field-effect mobility (simply referred to as mobility or µFE in some cases) of a transistor that uses an oxide semiconductor film in a channel region is preferably as high as possible. For example, as disclosed in Patent Document 1, on-state current and field-effect mobility of a transistor can be increased with the use of a transistor having a dual gate structure in which an oxide semiconductor film is provided between two gate electrodes.

Furthermore, in the case where a transistor having a dual gate structure is used, connection resistance between one gate electrode and the other gate electrode is preferably as low as possible. In the case where the connection resistance is high, there is a problem in that electrical characteristics of a transistor are unstable.

Furthermore, in a transistor that uses an oxide semiconductor film in a channel region, oxygen vacancies formed in the oxide semiconductor film affect the transistor characteristics and thus cause a problem. For example, when oxygen vacancies are formed in the oxide semiconductor film, the oxygen vacancies are bonded to hydrogen to serve as a carrier supply source. The carrier supply source generated in the oxide semiconductor film causes a change in the electrical characteristics, typically, a shift in the threshold voltage, of the transistor including the oxide semiconductor film. Furthermore, there is a problem in that electrical characteristics fluctuate among transistors. Therefore, it is preferable that the amount of oxygen vacancies in the channel region of the oxide semiconductor film be as small as possible.

In view of the foregoing problems, an object of one embodiment of the present invention is to suppress a change in electrical characteristics and to improve reliability of a transistor including an oxide semiconductor film. Alternatively, an object of one embodiment of the present invention is to provide a semiconductor device having stable electrical characteristics by reducing connection resistance between one gate electrode and the other gate electrode in a transistor having a dual gate structure with two gate electrodes. Alternatively, an object of one embodiment of the present invention is to provide a semiconductor device with reduced power consumption. Alternatively, an object of one embodiment of the present invention is to provide a novel semiconductor device. Alternatively, an object of one embodiment of the present invention is to provide a novel display device.

Note that the description of the above objects does not disturb the existence of other objects. Note that one embodiment of the present invention does not necessarily achieve all the objects. Objects other than the above will be apparent from the description of the specification and the like, and objects other than the above can be derived from the description of the specification and the like.

Means for Solving the Problems

One embodiment of the present invention is a semiconductor device including a transistor; the transistor includes a first gate electrode, a first insulating film over the first gate electrode, an oxide semiconductor film over the first insulating film, a source electrode over the oxide semiconductor film, a drain electrode over the oxide semiconductor film, a second insulating film over the oxide semiconductor film, the source electrode, and the drain electrode, and a second gate electrode over the second insulating film; the first insulating film includes a first opening; a connection electrode electrically connected to the first gate electrode through the first opening is formed over the first insulating film; the second insulating film includes a second opening that reaches the connection electrode; the second gate electrode includes an oxide conductive film and a metal film over the oxide conductive film; and the connection electrode and the second gate electrode are electrically connected to each other through the metal film.

Furthermore, another embodiment of the present invention is a semiconductor device including a transistor; the transistor includes a first gate electrode, a first insulating film over the first gate electrode, an oxide semiconductor film over the first insulating film, a source electrode over the oxide semiconductor film, a drain electrode over the oxide semiconductor film, a second insulating film over the oxide semiconductor film, the source electrode, and the drain electrode, and a second gate electrode over the second insulating film; the first insulating film includes a first opening; a connection electrode electrically connected to the first gate electrode through the first opening is formed over the first insulating film; the second insulating film includes a second opening that reaches the connection electrode and a third opening that reaches one of the source electrode and the drain electrode; the second gate electrode includes an oxide conductive film and a metal film over the oxide conductive film; a conductive film having the same composition as the metal film is formed in the third opening; and the connection electrode and the second gate electrode are electrically connected to each other through the metal film.

In any of the above embodiments, it is preferable that the source electrode and the drain electrode each include a first metal film, a second metal film over and in contact with the first metal film, and a third metal film over and in contact with the second metal film; the second metal film contain copper; the first metal film and the third metal film each contain a material that suppresses diffusion of copper; an end portion of the first metal film include a region located outward from an end portion of the second metal film; and the third metal film cover a top surface and a side surface of the second metal film and include a region in contact with the first metal film.

Furthermore, in any of the above embodiments, it is preferable that the metal film, the conductive film, the first metal film, and the third metal film each independently contain one or more selected from titanium, tungsten, tantalum, and molybdenum.

Furthermore, in any of the above embodiments, the oxide conductive film preferably contains at least one metal element contained in the oxide semiconductor film.

Furthermore, in any of the above embodiments, the oxide semiconductor film preferably contains In, M (M is Al, Ga, Y, or Sn), and Zn. Furthermore, in any of the above embodiments, it is preferable that the oxide semiconductor film include a crystal part and the crystal part have c-axis alignment.

Furthermore, another embodiment of the present invention is a display device including the semiconductor device according to any one of the above embodiments, and a display element. Furthermore, another embodiment of the present invention is a display module including the display device and a touch sensor. Furthermore, another embodiment of the present invention is an electronic device including the semiconductor device according to any one of the above embodiments, the display device, or the display module, and an operation key or a battery.

Effect of the Invention

According to one embodiment of the present invention, a change in electrical characteristics can be suppressed and reliability can be improved in a transistor including an oxide semiconductor film. Alternatively, according to one embodiment of the present invention, a semiconductor device having stable electrical characteristics by reducing connection resistance between one gate electrode and the other gate electrode in a transistor having a dual gate structure with two gate electrodes can be provided. Alternatively, according to one embodiment of the present invention, a semiconductor device with reduced power consumption can be provided. Alternatively, according to one embodiment of the present invention, a novel semiconductor device can be provided. Alternatively, according to one embodiment of the present invention, a novel display device can be provided.

Note that the description of these effects does not disturb the existence of other effects. Note that one embodiment of the present invention does not necessarily achieve all the effects. Note that other effects will be apparent from the description of the specification, the drawings, the claims, and the like, and other effects can be derived from the description of the specification, the drawings, the claims, and the like.

MODE FOR CARRYING OUT THE INVENTION

Figure 1A:
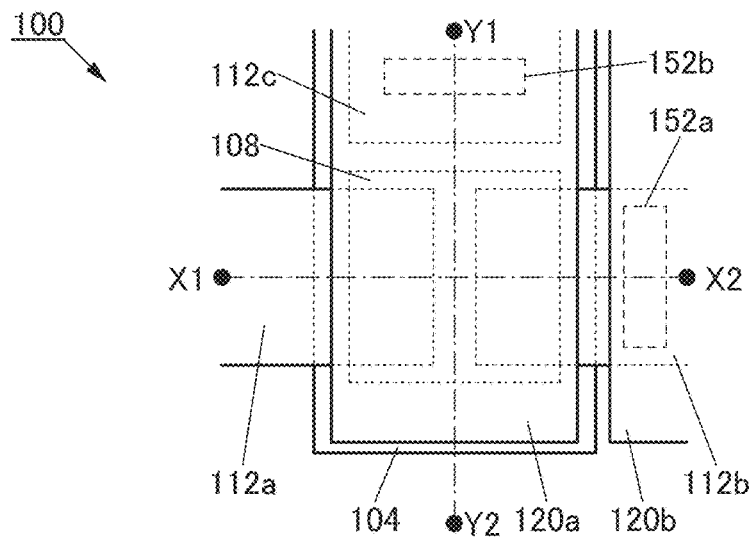
FIGS. 1A-C A top view and cross-sectional views illustrating one embodiment of a semiconductor device.

Hereinafter, embodiments will be described with reference to drawings. However, the embodiments can be implemented in many different modes, and it will be readily appreciated by those skilled in the art that modes and details thereof can be changed in various ways without departing from the spirit and scope thereof. Thus, the present invention should not be interpreted as being limited to the description in the following embodiments.

Furthermore, the size, the layer thickness, or the region in the drawings is exaggerated for clarity in some cases. Therefore, the present invention is not limited to such a scale. Note that the drawings schematically show ideal examples, and the present invention is not limited to shapes or values shown in the drawings.

Furthermore, in this specification, ordinal numbers such as "first", "second", and "third" are used in order to avoid confusion among components and do not limit the components numerically.

Furthermore, in this specification, terms for describing arrangement, such as "over" and "under", are used for convenience to describe a positional relationship between components with reference to drawings. Furthermore, the positional relationship between components is changed as appropriate in accordance with a direction in which each component is described. Thus, there is no limitation on terms described in this specification, and description can be made as appropriate depending on the situation.

Furthermore, in this specification and the like, a transistor is an element having at least three terminals of a gate, a drain, and a source. Moreover, a channel region is provided between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Furthermore, functions of a source and a drain might be switched when transistors having different polarities are employed or when a direction of current flow is changed in circuit operation, for example. Therefore, the terms "source" and "drain" can be switched in this specification and the like.

Furthermore, in this specification and the like, "electrically connected" includes the case where components are connected through an "object having any electric function". Note that there is no particular limitation on an "object having any electric function" as long as electric signals can be transmitted and received between the connected components. Examples of an "object having any electric function" include a switching element such as a transistor, a resistor, an inductor, a capacitor, and elements with a variety of functions as well as an electrode and a wiring.

Furthermore, in this specification and the like, "parallel" indicates that the angle formed between two straight lines is greater than or equal to −10° and less than or equal to 10°. Accordingly, the case where the angle is greater than or equal to −5° and less than or equal to 5° is also included. In addition, "perpendicular" indicates that the angle formed between two straight lines is greater than or equal to 80° and less than or equal to 100° Accordingly, the case where the angle is greater than or equal to 85° and less than or equal to 95° is also included.

Furthermore, in this specification and the like, the term "film" and the term "layer" can be interchanged with each other. For example, the term "conductive layer" can be changed into the term "conductive film" in some cases. For another example, the term "insulating film" can be changed into the term "insulating layer" in some cases.

Furthermore, unless otherwise specified, off-state current in this specification and the like refers to drain current of a transistor in an off state (also referred to as a non-conducting state or a cutoff state). Unless otherwise specified, the off state of an n-channel transistor means the state where the voltage Vgs between its gate and source is lower than the threshold voltage Vth, and the off state of a p-channel transistor means the state where the voltage Vgs between its gate and source is higher than the threshold voltage Vth. For example, the off-state current of an n-channel transistor sometimes refers to drain current that flows when the voltage Vgs between the gate and the source is lower than the threshold voltage Vth.

The off-state current of a transistor depends on Vgs in some cases. Thus, when there is Vgs with which the off-state current of the transistor is lower than or equal to I, it may be said that the off-state current of the transistor is lower than or equal to I. The off-state current of a transistor means the off-state current in an off state at predetermined Vgs, the off-state current in an off state at Vgs in a predetermined range, or the off-state current in an off state at Vgs with which sufficiently reduced off-state current is obtained, for example.

As an example, the assumption is made of an n-channel transistor where the threshold voltage Vth is 0.5 V and the drain current is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The drain current of the transistor is $1\times10^{-19}$ A or lower at Vgs of −0.5 V or at Vgs in the range of −0.5 V to −0.8 V; therefore, it is sometimes said that the off-state current of the transistor is $1\times10^{-19}$ A or lower. Since there is Vgs at which the drain current of the transistor is $1\times10^{-22}$ A or lower, it is sometimes said that the off-state current of the transistor is $1\times10^{-22}$ A or lower.

Furthermore, in this specification and the like, the off-state current of a transistor with a channel width W is sometimes represented by a current value per channel width W. Alternatively, it is represented by a current value per given channel width (e.g., 1 μm). In the latter case, the off-state current may be represented by the unit with the dimension of current per length (e.g., A/μm).

The off-state current of a transistor depends on temperature in some cases. Unless otherwise specified, the off-state current in this specification may be off-state current at room temperature, 60° C., 85° C., 95° C., or 125° C. Alternatively, the off-state current may be off-state current at a temperature at which reliability of a semiconductor device or the like including the transistor is ensured or a temperature at which the semiconductor device or the like including the transistor is used (e.g., any temperature in the range of 5° C. to 35° C.). When there is Vgs at which the off-state current of a transistor at room temperature, 60° C., 85° C., 95° C., 125° C., a temperature at which reliability of a semiconductor device including the transistor is ensured, or a temperature at which the semiconductor device or the like including the transistor is used (e.g., any temperature in the range of 5° C. to 35° C.) is lower than or equal to I, it may be said that the off-state current of the transistor is lower than or equal to I.

The off-state current of a transistor depends on voltage Vds between its drain and source in some cases. Unless otherwise specified, the off-state current in this specification may be off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current may be off-state current at Vds at which reliability of a semiconductor device or the like including the transistor is ensured or Vds used in the semiconductor device or the like including the transistor. When there is Vgs at which the off-state current of a transistor at Vds of 0.1 V, 0.8 V, 1 V, 1.2 V, 1.8 V, 2.5 V, 3 V, 3.3 V, 10 V, 12 V, 16 V, or 20 V, at Vds at which reliability of a semiconductor device including the transistor is ensured, or at Vds used in the semiconductor device or the like including the transistor is lower than or equal to I, it may be said that the off-state current of the transistor is lower than or equal to I.

In the above description of off-state current, a drain may be replaced with a source. That is, the off-state current sometimes refers to current that flows through a source of a transistor in the off state.

Furthermore, in this specification and the like, leakage current sometimes expresses the same meaning as off-state current. Furthermore, in this specification and the like, the off-state current sometimes refers to current that flows between a source and a drain of a transistor in the off state, for example.

Furthermore, in this specification and the like, a "semiconductor" has characteristics of an "insulator" in some cases when the conductivity is sufficiently low, for example. Furthermore, a "semiconductor" and an "insulator" cannot be strictly distinguished from each other in some cases because a border therebetween is not clear. Accordingly, a "semiconductor" in this specification and the like can be replaced with an "insulator" in some cases. Similarly, an "insulator" in this specification and the like can be replaced with a "semiconductor" in some cases. Alternatively, an "insulator" in this specification and the like can be replaced with a "semi-insulator" in some cases.

Furthermore, in this specification and the like, a "semiconductor" has characteristics of a "conductor" in some cases when the conductivity is sufficiently high, for example. Furthermore, a "semiconductor" and a "conductor" cannot be strictly distinguished from each other in some cases because a border therebetween is not clear. Accordingly, a "semiconductor" in this specification and the like can be replaced with a "conductor" in some cases. Similarly, a "conductor" in this specification and the like can be replaced with a "semiconductor" in some cases.

Furthermore, in this specification and the like, an impurity in a semiconductor refers to an element that is not a main component of a semiconductor film. For example, an element with a concentration of lower than 0.1 atomic % is an impurity. When an impurity is contained, DOS (Density of States) may be formed in a semiconductor, the carrier mobility may be decreased, or the crystallinity may be decreased, for example. In the case where the semiconductor contains an oxide semiconductor, examples of an impurity that changes the characteristics of the semiconductor include Group 1 elements, Group 2 elements, Group 14 elements, Group 15 elements, and transition metals other than the main components; specific examples include hydrogen (contained in water), lithium, sodium, silicon, boron, phosphorus, carbon, and nitrogen. In the case of an oxide semiconductor, oxygen vacancies may be formed by entry of impurities such as hydrogen. Furthermore, when the semiconductor contains silicon, examples of an impurity that changes the characteristics of the semiconductor include oxygen, Group 1 elements except hydrogen, Group 2 elements, Group 13 elements, and Group 15 elements.

Embodiment 1

In this embodiment, a semiconductor device of one embodiment of the present invention and a manufacturing method of the semiconductor device are described with reference to FIG. 1 to FIG. 12.

<1-1. Structure Example 1 of Semiconductor Device>

Figure 1B:
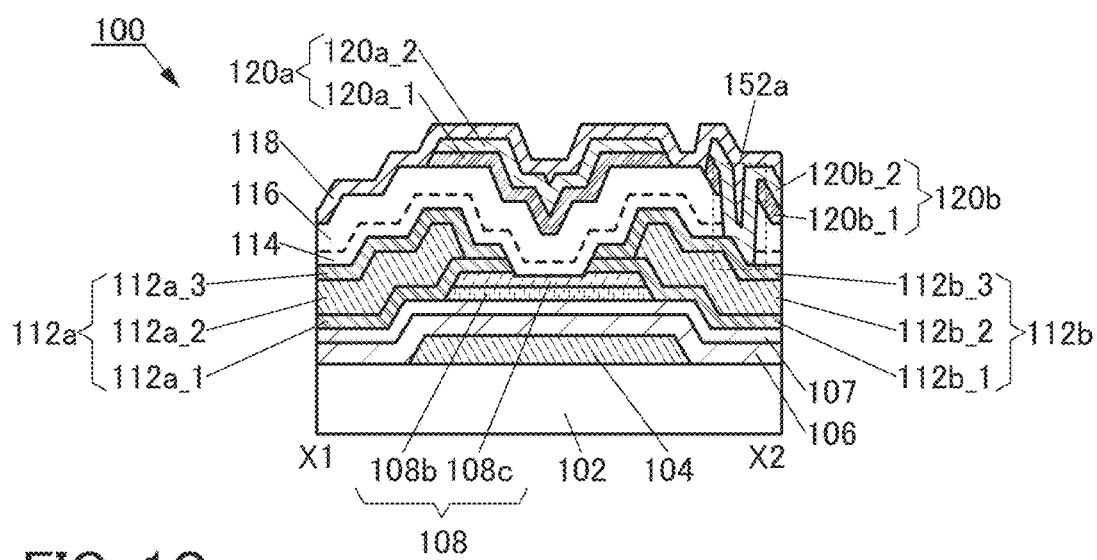
Figure 1C:
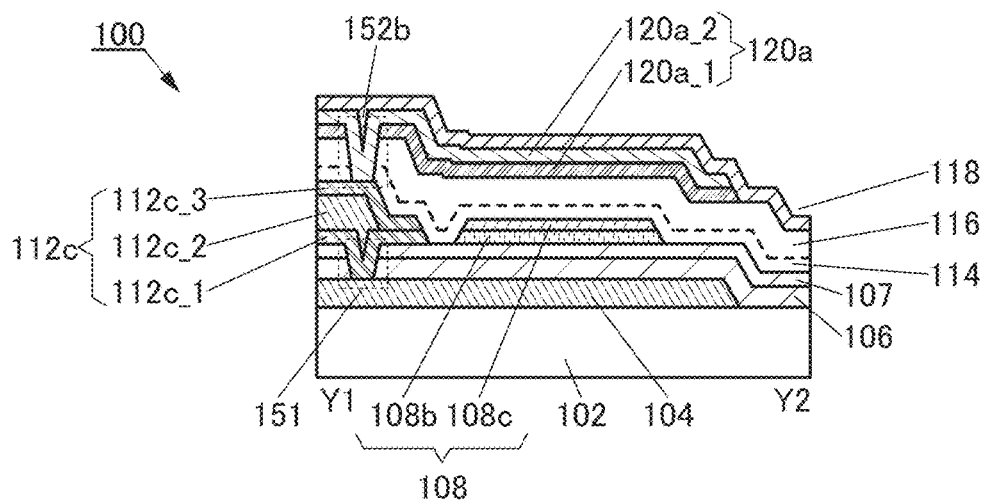

FIG. 1A is a top view of a transistor 100 that is a semiconductor device of one embodiment of the present invention, FIG. 1B corresponds to a cross-sectional view taken along the dashed-dotted line X1-X2 in FIG. 1A, and FIG. 1C corresponds to a cross-sectional view taken along the dashed-dotted line Y1-Y2 in FIG. 1A. Note that in FIG. 1A, some components of the transistor 100 (e.g., an insulating film functioning as a gate insulating film) are not illustrated to avoid complexity. Furthermore, the direction of the dashed-dotted line X1-X2 may be called a channel length direction, and the direction of the dashed-dotted line Y1-Y2 may be called a channel width direction. Note that some components are not illustrated in some cases in top views of transistors in the following drawings, as in FIG. 1A.

The transistor 100 includes a conductive film 104 over a substrate 102, an insulating film 106 over the substrate 102 and the conductive film 104, an insulating film 107 over the insulating film 106, an oxide semiconductor film 108 over the insulating film 107, a conductive film 112*a* over the oxide semiconductor film 108, a conductive film 112*b* over the oxide semiconductor film 108, an insulating film 114 over the oxide semiconductor film 108, the conductive film 112a, and the conductive film 112b, an insulating film 116 over the insulating film 114, a conductive film 120a over the insulating film 116, and a conductive film 120b over the insulating film 116.

Furthermore, the insulating film 106 and the insulating film 107 have an opening 151, and a conductive film 112c that is electrically connected to the conductive film 104 through the opening 151 is formed over the insulating film 106 and the insulating film 107. Furthermore, the insulating film 114 and the insulating film 116 have an opening 152a that reaches the conductive film 112b and an opening 152b that reaches the conductive film 112c.

Furthermore, the oxide semiconductor film 108 includes an oxide semiconductor film 108b on the conductive film 104 side and an oxide semiconductor film 108c over the oxide semiconductor film 108b. Furthermore, the oxide semiconductor film 108b and the oxide semiconductor film 108c each contain In, M (M is Al, Ga, Y, or Sn), and Zn.

For example, the oxide semiconductor film 108b preferably includes a region where the atomic proportion of In is larger than the atomic proportion of M. Furthermore, the oxide semiconductor film 108c preferably includes a region where the atomic proportion of In is smaller than that in the oxide semiconductor film 108b.

When the oxide semiconductor film 108b includes the region where the atomic proportion of In is larger than the atomic proportion of M, the field-effect mobility of the transistor 100 can be increased. Specifically, the field-effect mobility of the transistor 100 can exceed 10 cm$^2$/Vs, further preferably, the field-effect mobility of the transistor 100 can exceed 30 cm$^2$/Vs.

For example, when the transistor with high field-effect mobility is used for a gate driver that generates a gate signal (in particular, a demultiplexer connected to an output terminal of a shift register included in a gate driver), a semiconductor device or a display device whose frame is narrow (also referred to as a narrow frame) can be provided.

On the other hand, when the oxide semiconductor film 108b includes the region where the atomic proportion of In is larger than the atomic proportion of M, electrical characteristics of the transistor 100 are easily changed in light irradiation. However, in the semiconductor device of one embodiment of the present invention, the oxide semiconductor film 108c is formed over the oxide semiconductor film 108b. The oxide semiconductor film 108c includes the region where the atomic proportion of In is smaller than that in the oxide semiconductor film 108b and thus has larger Eg than the oxide semiconductor film 108b. For this reason, the oxide semiconductor film 108 that is a layered structure of the oxide semiconductor film 108b and the oxide semiconductor film 108c can have increased resistance to a negative bias stress test with light irradiation.

Furthermore, impurities such as hydrogen or moisture entering the oxide semiconductor film 108, particularly a channel region of the oxide semiconductor film 108b, affect the transistor characteristics and thus cause a problem. Therefore, it is preferable that the amount of impurities such as hydrogen or moisture in the channel region of the oxide semiconductor film 108b be as small as possible. Furthermore, oxygen vacancies formed in the channel region of the oxide semiconductor film 108b affect the transistor characteristics and thus cause a problem. For example, when oxygen vacancies are formed in the channel region of the oxide semiconductor film 108b, the oxygen vacancies are bonded to hydrogen to serve as a carrier supply source. The carrier supply source generated in the channel region of the oxide semiconductor film 108b causes a change in the electrical characteristics, typically, a shift in the threshold voltage, of the transistor 100 including the oxide semiconductor film 108b. Therefore, it is preferable that the amount of oxygen vacancies in the channel region of the oxide semiconductor film 108b be as small as possible.

In view of this, one embodiment of the present invention is a structure in which insulating films in contact with the oxide semiconductor film 108, specifically the insulating films 114 and 116 formed over the oxide semiconductor film 108, contain excess oxygen. Oxygen or excess oxygen is transferred from the insulating films 114 and 116 to the oxide semiconductor film 108, whereby the oxygen vacancies in the oxide semiconductor film can be reduced.

Furthermore, in one embodiment of the present invention, the conductive films 120a and 120b each have a stacked-layer structure so that excess oxygen is contained in the insulating films 114 and 116. Specifically, the conductive film 120a includes an oxide conductive film 120a_1 and a metal film 120a_2 over the oxide conductive film 120a_1, and the conductive film 120b includes an oxide conductive film 120b_1 and a metal film 120b_2 over the oxide conductive film 120b_1.

With the above structure, for example, an oxide conductive film is formed by a sputtering method in an atmosphere containing an oxygen gas in a step of forming the oxide conductive film 120a_1 and the oxide conductive film 120b_1, whereby oxygen or excess oxygen can be added to the insulating film 116 over which the oxide conductive film is formed. Furthermore, owing to the metal film 120a_2 and the metal film 120b_2, the oxide semiconductor film 108 can be prevented from being irradiated with light from above.

Furthermore, the conductive film 112c is electrically connected to the conductive film 120a through the metal film 120a_2, and the conductive film 112b is electrically connected to the conductive film 120b through the metal film 120b_2.

For example, in the case where the conductive film 120a is formed only of the oxide conductive film 120a_1, a structure in which the oxide conductive film 120b_1 is connected to the conductive film 112c is obtained. In the case of this structure, the connection resistance between the conductive film 112c and the conductive film 120a is increased in some cases. On the other hand, in one embodiment of the present invention, a structure in which the conductive film 112c is connected through the metal film 120a_2 is obtained; thus, the connection resistance between the conductive film 112c and the conductive film 120a can be reduced.

Similarly, in the case where the conductive film 120b is formed only of the oxide conductive film 120b_1, a structure in which the oxide conductive film 120b_1 is connected to the conductive film 112b is obtained. In the case of this structure, the connection resistance between the conductive film 112b and the conductive film 120b is increased in some cases. On the other hand, in one embodiment of the present invention, a structure in which the conductive film 120b is connected through the metal film 120b_2 is obtained; thus, the connection resistance between the conductive film 112b and the conductive film 120b can be reduced.

Note that the metal film 120a_2 included in the conductive film 120a and the metal film 120b_2 included in the conductive film 120b are formed by processing the same metal film. In other words, the metal film 120b_2 having the same composition as the metal film 120a_2 is formed in the opening 152a.

Furthermore, an insulating film 118 is provided over the transistor 100. The insulating film 118 is formed to cover the insulating film 116, the conductive film 120a, and the conductive film 120b.

Note that in the transistor 100, the insulating films 106 and 107 function as a first gate insulating film of the transistor 100, the insulating films 114 and 116 function as a second gate insulating film of the transistor 100, and the insulating film 118 functions as a protective insulating film of the transistor 100. Furthermore, in the transistor 100, the conductive film 104 functions as a first gate electrode, the conductive film 120a functions as a second gate electrode, and the conductive film 120b functions as a pixel electrode used in the display device. Furthermore, in the transistor 100, the conductive film 112a functions as a source electrode, and the conductive film 112b functions as a drain electrode. Furthermore, in the transistor 100, the conductive film 112c functions as a connection electrode. Note that in this specification and the like, the insulating films 106 and 107 are referred to as a first insulating film, the insulating films 114 and 116 are referred to as a second insulating film, and the insulating film 118 is referred to as a third insulating film in some cases.

Furthermore, the conductive film 112a includes a metal film 112a_1, a metal film 112a_2 over and in contact with the metal film 112a_1, and a metal film 112a_3 over and in contact with the metal film 112a_2. Furthermore, the conductive film 120b includes a metal film 112b_1, a metal film 112b_2 over and in contact with the metal film 112b_1, and a metal film 112b_3 over and in contact with the metal film 112b_2.

The metal film 112a_2 and the metal film 112b_2 each contain copper, and the metal film 112a_1, the metal film 112b_1, the metal film 112a_3, and the metal film 112b_3 each contain a material that suppresses diffusion of copper. Furthermore, an end portion of the metal film 112a_1 includes a region located outward from an end portion of the metal film 112a_2, and the metal film 112a_3 covers a top surface and a side surface of the metal film 112a_2 and includes a region in contact with the metal film 112a_1. Furthermore, an end portion of the metal film 112b_1 includes a region located outward from an end portion of the metal film 112b_2, and the metal film 112b_3 covers a top surface and a side surface of the metal film 112b_2 and includes a region in contact with the metal film 112b_1. Furthermore, an end portion of a metal film 112c_1 includes a region located outward from an end portion of a metal film 112c_2, and a metal film 1120 covers a top surface and a side surface of the metal film 112c_2 and includes a region in contact with the metal film 112c_1.

When the conductive film 112a and the conductive film 112b have the above-described structures, the wiring resistance can be reduced. Furthermore, outward diffusion of copper elements contained in the conductive films 112a and 112b can be prevented. Thus, a semiconductor device having stable electrical characteristics can be provided.

Furthermore, as illustrated in FIG. 1C, the conductive film 120a functioning as the second gate electrode is electrically connected to the conductive film 104 functioning as the first gate electrode through the conductive film 112c functioning as the connection electrode. Accordingly, the conductive film 104 and the conductive film 120a are supplied with the same potential.

Furthermore, as illustrated in FIG. 1C, the oxide semiconductor film 108 is positioned to face each of the conductive film 104 functioning as the first gate electrode and the conductive film 120a functioning as the second gate electrode, and is sandwiched between the two films functioning as the gate electrodes. The length in the channel length direction of the conductive film 120a and the length in the channel width direction of the conductive film 120a are longer than the length in the channel length direction of the oxide semiconductor film 108 and the length in the channel width direction of the oxide semiconductor film 108, respectively, and the whole oxide semiconductor film 108 is covered with the conductive film 120a with the insulating films 114 and 116 positioned therebetween.

In other words, in the channel width direction of the transistor 100, the conductive film 104 functioning as the first gate electrode and the conductive film 120a functioning as the second gate electrode surround the oxide semiconductor film 108 with the insulating films 106 and 107 functioning as the first gate insulating film and the insulating films 114 and 116 functioning as the second gate insulating film provided therebetween.

With such a structure, the oxide semiconductor film 108 included in the transistor 100 can be electrically surrounded by electric fields of the conductive film 104 functioning as the first gate electrode and the conductive film 120a functioning as the second gate electrode. A device structure of a transistor, such as the transistor 100, in which electric fields of a first gate electrode and a second gate electrode electrically surround an oxide semiconductor film where a channel region is formed can be referred to as a Surrounded channel (S-channel) structure.

Since the transistor 100 has the S-channel structure, an electric field for inducing a channel can be effectively applied to the oxide semiconductor film 108 by the conductive film 104 functioning as the first gate electrode; therefore, the current drive capability of the transistor 100 can be improved and high on-state current characteristics can be obtained. Furthermore, since the on-state current can be increased, the transistor 100 can be miniaturized. Furthermore, since the transistor 100 has a structure surrounded by the conductive film 104 functioning as the first gate electrode and the conductive film 120a functioning as the second gate electrode, the mechanical strength of the transistor 100 can be increased.

As described above, in the semiconductor device of one embodiment of the present invention, the conductive film functioning as the second gate electrode has the stacked-layer structure of the oxide conductive film and the metal film; thus, oxygen can be added to the surface over which the conductive film functioning as the second gate electrode is formed, and the connection resistance can be reduced by using the metal film for the connection to the connection electrode. The use of such a structure can achieve a semiconductor device in which the variation in electrical characteristics is suppressed.

<1-2. Components of Semiconductor Device>

Components included in the semiconductor device of this embodiment will be described in detail below.

[Substrate]

There is no particular limitation on the property of a material and the like of the substrate 102 as long as it has heat resistance enough to withstand at least heat treatment to be performed later. For example, a glass substrate, a ceramic substrate, a quartz substrate, or a sapphire substrate may be used as the substrate 102. Alternatively, a single crystal semiconductor substrate or a polycrystalline semiconductor substrate made of silicon or silicon carbide, a compound semiconductor substrate made of silicon germanium or the like, an SOI substrate, or the like can be used, or any of these substrates provided with a semiconductor element may be used as the substrate 102. Note that in the case where a glass substrate is used as the substrate 102, a large substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm); thus, a large-sized display device can be manufactured.

Alternatively, a flexible substrate may be used as the substrate 102, and the transistor 100 may be formed directly on the flexible substrate. Alternatively, a separation layer may be provided between the substrate 102 and the transistor 100. The separation layer can be used when part or the whole of a semiconductor device formed thereover is separated from the substrate 102 and transferred onto another substrate. In such a case, the transistor 100 can be transferred to a substrate having low heat resistance or a flexible substrate as well.

[Conductive Film]

The conductive film 104 functioning as the first gate electrode, the conductive film 112a functioning as the source electrode, the conductive film 112b functioning as the drain electrode, the conductive film 112c functioning as the connection electrode, the conductive film 120a functioning as the second gate electrode, and the conductive film 120b functioning as the pixel electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy containing any of these metal elements as its component; an alloy containing a combination of any of these metal elements; or the like.

Furthermore, for each of the conductive films 104, 112a, 112b, 112c, 120a, and 120b, an oxide conductor such as an oxide containing indium and tin, an oxide containing tungsten and indium, an oxide containing tungsten, indium, and zinc, an oxide containing titanium and indium, an oxide containing titanium, indium, and tin, an oxide containing indium and zinc, an oxide containing silicon, indium, and tin, or an oxide containing indium, gallium, and zinc can be used.

In particular, any of the above-described oxide conductors can be suitably used for the oxide conductive film 120a_1 included in the conductive film 120a and the oxide conductive film 120b_1 included in the conductive film 120b. Furthermore, a structure in which the oxide conductive films 120a_1 and 120b_1 and the oxide semiconductor film 108 (the oxide semiconductor film 108b and the oxide semiconductor film 108c) contain the same metal element is suitable. With the structure, manufacturing costs can be reduced.

Here, an oxide conductor is described. In this specification and the like, an oxide conductor may be referred to as OC (Oxide Conductor). The oxide conductor is obtained in the following manner, for example: oxygen vacancies are formed in an oxide semiconductor and hydrogen is added to the oxygen vacancies to form a donor level in the vicinity of the conduction band. As a result, the oxide semiconductor has increased conductivity to be a conductor. The oxide semiconductor having become a conductor can be referred to as an oxide conductor. An oxide semiconductor generally has a visible light transmitting property because of its large energy gap. On the other hand, an oxide conductor is an oxide semiconductor having a donor level in the vicinity of the conduction band. Therefore, the influence of absorption due to the donor level is small in an oxide conductor, and it has a visible light transmitting property comparable to that of an oxide semiconductor.

Furthermore, a Cu—X alloy film (X is Mn, Ni, Cr, Fe, Co, Mo, Ta, or Ti) may be used as the conductive films 104, 112a, 112b, 112c, 120a, and 120b. The use of a Cu—X alloy film enables manufacturing costs to be reduced because processing can be performed by a wet etching process.

In particular, the Cu—X alloy film can be suitably used for the metal film 112a_2 included in the conductive film 112a, the metal film 112b_2 included in the conductive film 112b, and the metal film 112c_2 included in the conductive film 112c. As the Cu—X alloy film, a Cu—Mn alloy film is particularly preferable. Note that one embodiment of the present invention is not limited thereto as long as the metal film 112b_2 and the metal film 112c_2 contain at least copper.

Furthermore, it is particularly suitable that among the above-described metal elements, one or more selected from titanium, tungsten, tantalum, and molybdenum be contained in the metal films 112a_1 and 112a_3 included in the conductive film 112a, the metal films 112b_1 and 112b_3 included in the conductive film 112b, and the metal films 112c_1 and 1120 included in the conductive film 112c. When the metal films 112a_1, 112a_3, 112b_1, 112b_3, 112c_1, and 1120 contain one or more selected from titanium, tungsten, tantalum, and molybdenum, outward diffusion of copper contained in the metal films 112a_2 and 112b_2 can be suppressed. That is, the metal films 112a_1, 112a_3, 112b_1, 112b_3, 112c_1, and 1120 each function as what is called a barrier metal.

As the metal films 112a_1 and 112a_3 and the metal films 112b_1, 112b_3, 112c_1, and 1120, what is called a tantalum nitride film, which contains nitrogen and tantalum, is suitably used. The tantalum nitride film has conductivity and a high barrier property against copper or hydrogen. Furthermore, the tantalum nitride film can be used most suitably as a metal film in contact with the oxide semiconductor film 108 or a metal film in the vicinity of the oxide semiconductor film 108 because little hydrogen is released from itself.

Furthermore, when the metal films 112a_3 and 112b_3 each have a structure in which one or more selected from titanium, tungsten, tantalum, and molybdenum are contained, the connection resistance with the metal films 120a_2 and 120b_2 can be reduced. Note that it is suitable that the metal films 120a_2 and 120b_2 contain the same kind of material as the metal films 112a_3 and 112b_3, in which case the connection resistance can be further reduced.

[Insulating Films Functioning as First Gate Insulating Film]

As each of the insulating films 106 and 107 functioning as the first gate insulating film of the transistor 100, an insulating layer including at least one of the following films formed by a plasma enhanced chemical vapor deposition (PECVD: (Plasma Enhanced Chemical Vapor Deposition)) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that a stacked-layer structure of the insulating films 106 and 107 is not necessarily employed, and an insulating film of a single layer selected from the above materials or an insulating film of three or more layers may be used.

Furthermore, the insulating film 106 functions as a blocking film that inhibits penetration of oxygen. For example, in the case where excess oxygen is supplied to the insulating films 107, 114, 116, and/or the oxide semiconductor film 108, the insulating film 106 can inhibit penetration of oxygen.

Note that the insulating film 107 that is in contact with the oxide semiconductor film 108 functioning as a channel region of the transistor 100 is preferably an oxide insulating film and further preferably includes a region containing oxygen in excess of the stoichiometric composition (oxygen-excess region). In other words, the insulating film 107 is an insulating film capable of releasing oxygen. Note that in order to provide the oxygen-excess region in the insulating film 107, the insulating film 107 is formed in an oxygen atmosphere, for example. Alternatively, the formed insulating film 107 is subjected to heat treatment in an oxygen atmosphere.

Furthermore, in the case where hafnium oxide is used for the insulating film 107, the following effect is attained. Hafnium oxide has a higher dielectric constant than silicon oxide and silicon oxynitride. Therefore, the thickness of the insulating film 107 can be large compared with the case of using silicon oxide; thus, leakage current due to tunnel current can be low. That is, a transistor with low off-state current can be obtained. Moreover, hafnium oxide with a crystal structure has a higher dielectric constant than hafnium oxide with an amorphous structure. Therefore, it is preferable to use hafnium oxide with a crystal structure in order to obtain a transistor with low off-state current. Examples of the crystal structure include a monoclinic crystal structure and a cubic crystal structure. Note that one embodiment of the present invention is not limited thereto.

Note that in this embodiment, a silicon nitride film is formed as the insulating film 106, and a silicon oxide film is formed as the insulating film 107. The silicon nitride film has a higher dielectric constant than a silicon oxide film and needs a larger thickness for capacitance equivalent to that of the silicon oxide film; thus, when the silicon nitride film is included as the gate insulating film of the transistor 100, the thickness of the insulating film can be increased. Consequently, a decrease in withstand voltage of the transistor 100 can be reduced and furthermore the withstand voltage can be improved, thereby reducing electrostatic discharge damage to the transistor 100.

[Oxide Semiconductor Film]

The oxide semiconductor film 108 can be formed using the materials described above.

In the case where the oxide semiconductor film 108b is In-M-Zn oxide, it is preferable that the atomic ratio of metal elements of a sputtering target used for forming the In-M-Zn oxide satisfy In>M. The atomic ratio of metal elements in such a sputtering target is, for example, In:M:Zn=2:1:3, In:M:Zn=3:1:2, or In:M:Zn=4:2:4.1.

Furthermore, in the case where the oxide semiconductor film 108c is In-M-Zn oxide, it is preferable that the atomic ratio of metal elements of a sputtering target used for forming the In-M-Zn oxide satisfy In M. The atomic ratio of metal elements in such a sputtering target is, for example, In:M:Zn=1:1:1, In:M:Zn=1:1:1.2, In:M:Zn=1:3:2, In:M:Zn=1:3:4, or In:M:Zn=1:3:6.

Furthermore, in the case where the oxide semiconductor film 108b and the oxide semiconductor film 108c are each In-M-Zn oxide, it is preferable to use a target including polycrystalline In-M-Zn oxide as the sputtering target. The use of the target including polycrystalline In-M-Zn oxide facilitates formation of the oxide semiconductor film 108b and the oxide semiconductor film 108c having crystallinity. Note that the atomic ratio of each of the oxide semiconductor film 108b and the oxide semiconductor film 108c varies from the above atomic ratio of metal elements contained in the sputtering target within a range of plus or minus 40%. For example, when a sputtering target of the oxide semiconductor film 108b with an atomic ratio of In:Ga:Zn=4:2:4.1 is used, the atomic ratio of the formed oxide semiconductor film 108b may be In:Ga:Zn=4:2:3 or in the neighborhood thereof.

Furthermore, the energy gap of the oxide semiconductor film 108 is 2 eV or more, preferably 2.5 eV or more, and further preferably 3 eV or more. With the use of an oxide semiconductor having such a wide energy gap, the off-state current of the transistor 100 can be reduced. In particular, an oxide semiconductor film having an energy gap of 2 eV or more, preferably 2 eV or more and 3.0 eV or less, is suitably used as the oxide semiconductor film 108b, and an oxide semiconductor film having an energy gap of 2.5 eV or more and 3.5 eV or less is suitably used as the oxide semiconductor film 108c. Furthermore, the oxide semiconductor film 108c preferably has a higher energy gap than the oxide semiconductor film 108b.

Furthermore, the thickness of each of the oxide semiconductor film 108b and the oxide semiconductor film 108c is more than or equal to 3 nm and less than or equal to 200 nm, preferably more than or equal to 3 nm and less than or equal to 100 nm, and further preferably more than or equal to 3 nm and less than or equal to 50 nm.

Furthermore, an oxide semiconductor film with low carrier density is used as the oxide semiconductor film 108c. For example, the carrier density of the second oxide semiconductor film 108c is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, and still further preferably lower than or equal to $1\times10^{11}$ cm$^{-3}$.

Note that without limitation to the above, a material with an appropriate composition can be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108b and the oxide semiconductor film 108c be set to be appropriate.

Note that it is preferable to use, as each of the oxide semiconductor film 108b and the oxide semiconductor film 108c, an oxide semiconductor film in which the impurity concentration is low and the density of defect states is low, in which case the transistor having more excellent electrical characteristics can be manufactured. Here, the state in which impurity concentration is low and the density of defect states is low (the amount of oxygen vacancies is small) is referred to as highly purified intrinsic or substantially highly purified intrinsic. A highly purified intrinsic or substantially highly purified intrinsic oxide semiconductor film has few carrier generation sources; thus, the carrier density can be lowered. Thus, a transistor in which a channel region is formed in the oxide semiconductor film rarely has electrical characteristics in which the threshold voltage is negative (also referred to as normally on). Furthermore, the highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width of $1\times10^6$ µm and a channel length L of 10 µm, the off-state current can be less than or equal to the measurement limit of a semiconductor parameter analyzer, i.e., less than or equal to $1\times10^{-13}$ A, at voltage (drain voltage) between a source electrode and a drain electrode of from 1 V to 10 V.

Accordingly, the transistor in which the channel region is formed in the highly purified intrinsic or substantially highly purified intrinsic oxide semiconductor film can be a transistor in which a variation in electrical characteristics is small and reliability is high. Note that charge trapped by the trap states in the oxide semiconductor film takes a long time to disappear and may behave like fixed charge. Thus, the transistor whose channel region is formed in the oxide semiconductor film having a high density of trap states has unstable electrical characteristics in some cases. Examples of the impurities include hydrogen, nitrogen, alkali metal, and alkaline earth metal.

Hydrogen contained in the oxide semiconductor film reacts with oxygen bonded to a metal atom to be water, and an oxygen vacancy is formed in a lattice from which oxygen is released (or a portion from which oxygen is released). Entry of hydrogen into the oxygen vacancy generates an electron that is a carrier in some cases. Furthermore, in some cases, part of hydrogen is bonded to oxygen bonded to a metal atom to generate an electron that is a carrier. Thus, a transistor including an oxide semiconductor film that contains hydrogen is likely to have normally-on characteristics. Accordingly, it is preferable that hydrogen be reduced as much as possible in the oxide semiconductor film 108. Specifically, in the oxide semiconductor film 108, the hydrogen concentration measured by SIMS analysis is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, and still further preferably lower than or equal to $1\times10^{16}$ atoms/cm$^3$.

Furthermore, the oxide semiconductor film 108b preferably includes a region where the hydrogen concentration is smaller than that in the oxide semiconductor film 108c. When the oxide semiconductor film 108b includes the region where the hydrogen concentration is smaller than that in the oxide semiconductor film 108c, a semiconductor device can be highly reliable.

Furthermore, when silicon or carbon that is one of Group 14 elements is contained in the oxide semiconductor film 108b, oxygen vacancies are increased in the oxide semiconductor film 108b, and it becomes n-type. Thus, the concentration of silicon or carbon in the oxide semiconductor film 108b or the concentration of silicon or carbon (the concentration measured by SIMS analysis) in the vicinity of an interface with the oxide semiconductor film 108b is set to be lower than or equal to $2\times10^{18}$ atoms/cm$^3$, preferably lower than or equal to $2\times10^{17}$ atoms/cm$^3$.

Furthermore, in the oxide semiconductor film 108b, the concentration of alkali metal or alkaline earth metal that is measured by SIMS analysis is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor film 108b.

Furthermore, when nitrogen is contained in the oxide semiconductor film 108b, it easily becomes n-type because electrons that are carriers are generated to increase the carrier density. As a result, a transistor including an oxide semiconductor film that contains nitrogen is likely to have normally-on characteristics. Thus, in the oxide semiconductor film, nitrogen is preferably reduced as much as possible; for example, the nitrogen concentration measured by SIMS analysis is preferably set to be lower than or equal to $5\times10^{18}$ atoms/cm$^3$.

Furthermore, the oxide semiconductor film 108b and the oxide semiconductor film 108c may each have a non-single-crystal structure. Examples of the non-single-crystal structure include a CAAC-OS (C Axis Aligned Crystalline Oxide Semiconductor) described later, a polycrystalline structure, a microcrystalline structure, and an amorphous structure. Among the non-single crystal structures, the amorphous structure has the highest density of defect states, whereas the CAAC-OS has the lowest density of defect states.

[Insulating Films Functioning as Second Gate Insulating Film]

The insulating films 114 and 116 function as a second gate insulating film of the transistor 100. Furthermore, the insulating films 114 and 116 each have a function of supplying oxygen to the oxide semiconductor film 108. That is, the insulating films 114 and 116 contain oxygen. Furthermore, the insulating film 114 is an insulating film that is permeable to oxygen. Note that the insulating film 114 also functions as a film that relieves damage to the oxide semiconductor film 108 at the time of forming the insulating film 116 in a later step.

Silicon oxide, silicon oxynitride, or the like with a thickness greater than or equal to 5 nm and less than or equal to 150 nm, or preferably greater than or equal to 5 nm and less than or equal to 50 nm, can be used for the insulating film 114.

Furthermore, it is preferable that the number of defects in the insulating film 114 be small and typically, the spin density of a signal that appears at g=2.001 due to a dangling bond of silicon be lower than or equal to $3\times10^{17}$ spins/cm$^3$ by ESR measurement. This is because when the density of defects in the insulating film 114 is high, oxygen is bonded to the defects and the amount of oxygen that transmits the insulating film 114 is decreased.

Note that in the insulating film 114, not all oxygen entering the insulating film 114 from the outside move to the outside of the insulating film 114 and some oxygen remains in the insulating film 114. Furthermore, movement of oxygen occurs in the insulating film 114 in some cases in such a manner that oxygen enters the insulating film 114 and oxygen contained in the insulating film 114 moves to the outside of the insulating film 114. When an oxide insulating film that is permeable to oxygen is formed as the insulating film 114, oxygen released from the insulating film 116 provided over the insulating film 114 can be moved to the oxide semiconductor film 108 through the insulating film 114.

Furthermore, the insulating film 114 can be formed using an oxide insulating film having a low density of states due to nitrogen oxide. Note that the density of states due to the nitrogen oxide can be formed between the energy of the valence band maximum ($E_{v\_os}$) of the oxide semiconductor film and the energy of the conduction band minimum ($E_{c\_os}$) of the oxide semiconductor film. A silicon oxynitride film that releases a small amount of nitrogen oxide, an aluminum oxynitride film that releases a small amount of nitrogen oxide, and the like can be used as the above oxide insulating film.

Note that a silicon oxynitride film that releases a small amount of nitrogen oxide is a film of which the amount of released ammonia is larger than the amount of released nitrogen oxide in thermal desorption spectroscopy analysis; the amount of released ammonia is typically greater than or equal to $1\times10^{18}$ molecules/cm$^3$ and less than or equal to $5\times10^{19}$ molecules/cm$^3$. Note that the amount of released ammonia corresponds to the released amount by heat treatment with which the surface temperature of the film becomes higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating film 114, for example. The level is positioned in the energy gap of the oxide semiconductor film 108. Therefore, when nitrogen oxide is diffused to the interface between the insulating film 114 and the oxide semiconductor film 108, an electron is in some cases trapped by the level on the insulating film 114 side. As a result, the trapped electron remains at or near the interface between the insulating film 114 and the oxide semiconductor film 108; thus, the threshold voltage of the transistor is shifted in the positive direction.

Furthermore, nitrogen oxide reacts with ammonia and oxygen in heat treatment. Since nitrogen oxide contained in the insulating film 114 reacts with ammonia contained in the insulating film 116 in heat treatment, nitrogen oxide contained in the insulating film 114 is reduced. Therefore, an electron is hardly trapped at the interface between the insulating film 114 and the oxide semiconductor film 108.

By using such an oxide insulating film as the insulating film 114, the shift in the threshold voltage of the transistor can be reduced, which reduces a change in the electrical characteristics of the transistor.

Note that in a spectrum of the insulating film 114 that is measured by ESR at 100 K or lower, by heat treatment of a manufacturing process of the transistor, typically heat treatment at a temperature higher than or equal to 300° C. and lower than 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. Note that the split width of the first signal and the second signal and the split width of the second signal and the third signal that are obtained by ESR measurement using an X-band are each approximately 5 mT. Furthermore, the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

Note that in the ESR spectrum at 100 K or lower, the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 corresponds to signals attributed to nitrogen oxide (NO$_x$; x is greater than 0 and less than or equal to 2, preferably greater than or equal to 1 and less than or equal to 2). Typical examples of the nitrogen oxide include nitrogen monoxide and nitrogen dioxide. That is, the lower the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

Furthermore, the nitrogen concentration of the above oxide insulating film measured by SIMS is lower than or equal to $6\times10^{20}$ atoms/cm$^3$.

The above oxide insulating film is formed by a PECVD method at a substrate temperature higher than or equal to 220° C. and lower than or equal to 350° C. with the use of silane and dinitrogen monoxide, whereby a dense and hard film can be formed.

The insulating film 116 is formed using an oxide insulating film that contains oxygen in excess of oxygen in the stoichiometric composition. Part of oxygen is released by heating from the oxide insulating film containing oxygen in excess of oxygen in the stoichiometric composition. The oxide insulating film containing oxygen in excess of oxygen in the stoichiometric composition is an oxide insulating film of which the amount of released oxygen converted into oxygen atoms is greater than or equal to $1.0\times10^{19}$ atoms/cm$^3$, or preferably greater than or equal to $3.0\times10^{20}$ atoms/cm$^3$, in TDS analysis. Note that the film surface temperature in TDS is preferably higher than or equal to 100° C. and lower than or equal to 700° C., or higher than or equal to 100° C. and lower than or equal to 500° C.

Silicon oxide, silicon oxynitride, or the like with a thickness greater than or equal to 30 nm and less than or equal to 500 nm, or preferably greater than or equal to 50 nm and less than or equal to 400 nm, can be used for the insulating film 116.

Furthermore, it is preferable that the number of defects in the insulating film 116 be small, and typically, the spin density of a signal that appears at g=2.001 due to a dangling bond of silicon be lower than $1.5\times10^{18}$ spins/cm$^3$, further preferably lower than or equal to $1\times10^{18}$ spins/cm$^3$ by ESR measurement. Note that the insulating film 116 is provided more apart from the oxide semiconductor film 108 than the insulating film 114 is, and thus may have higher density of defects than the insulating film 114.

Furthermore, the insulating films 114 and 116 can be formed using insulating films formed of the same kinds of materials; thus, a boundary between the insulating film 114 and the insulating film 116 cannot be clearly observed in some cases. Thus, in this embodiment, the boundary between the insulating film 114 and the insulating film 116 is shown by a dashed line. Note that although a two-layer structure of the insulating film 114 and the insulating film 116 is described in this embodiment, the present invention is not limited thereto, and for example, a single-layer structure of the insulating film 114 or a layered structure of three or more layers may be employed.

[Insulating Film Functioning as Protective Insulating Film]

The insulating film 118 functions as a protective insulating film of the transistor 100.

The insulating film 118 contains one or both of hydrogen and nitrogen. Alternatively, the insulating film 118 contains nitrogen and silicon. Furthermore, the insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen contained in the insulating films 114 and 116, and entry of hydrogen, water, or the like into the oxide semiconductor film 108 from the outside by providing the insulating film 118.

A nitride insulating film can be used as the insulating film 118, for example. For the nitride insulating film, silicon nitride, silicon nitride oxide, aluminum nitride, aluminum nitride oxide, or the like can be used.

Note that although the variety of films such as the conductive films, the insulating films, the oxide semiconductor film, and the metal film that are described above can be formed by a sputtering method or a PECVD method, such films may be formed by another method, e.g., a thermal CVD (Chemical Vapor Deposition) method. Examples of a thermal CVD method include an MOCVD (Metal Organic Chemical Vapor Deposition) method and an ALD (Atomic Layer Deposition) method.

A thermal CVD method has an advantage that no defect due to plasma damage is generated since it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and they are made to react with each other in the vicinity of the substrate or over the substrate to be deposited over the substrate.

Furthermore, deposition by an ALD method may be performed in such a manner that the pressure in a chamber is set to an atmospheric pressure or a reduced pressure, source gases for reaction are sequentially introduced into the chamber, and then the sequence of the gas introduction is repeated.

The variety of films such as the conductive films, the insulating films, the oxide semiconductor film, and the metal oxide film in the above embodiment can be formed by a thermal CVD method such as an MOCVD method or an ALD method, and in the case where an In—Ga—ZnO film is formed, for example, trimethylindium, trimethylgallium, and dimethylzinc are used. Note that the chemical formula of trimethylindium is $In(CH_3)_3$. Furthermore, the chemical formula of trimethylgallium is $Ga(CH_3)_3$. Furthermore, the chemical formula of dimethylzinc is $Zn(CH_3)_2$. Furthermore, without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using ALD, two kinds of gases, ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH)), are used. Note that the chemical formula of tetrakis(dimethylamide)hafnium is $Hf[N(CH_3)_2]_4$. Furthermore, examples of another material liquid include tetrakis(ethylmethylamide)hafnium.

For example, in the case where an aluminum oxide film is formed by a deposition apparatus using ALD, two kinds of gases, $H_2O$ as an oxidizer and a source gas which is obtained by vaporizing liquid containing a solvent and an aluminum precursor compound (e.g., trimethylaluminum (TMA)), are used. Note that the chemical formula of trimethylaluminum is $Al(CH_3)_3$. Furthermore, examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a deposition surface, chlorine contained in the adsorbate is removed, and radicals of an oxidizing gas (e.g., $O_2$ or dinitrogen monoxide) are supplied to react with the adsorbate.

For example, in the case where a tungsten film is formed by a deposition apparatus using ALD, a $WF_6$ gas and a $B_2H_6$ gas are introduced sequentially and repeatedly to form an initial tungsten film, and then a tungsten film is formed using a $WF_6$ gas and an $H_2$ gas. Note that an $SiH_4$ gas may be used instead of a $B_2H_6$ gas.

For example, in the case where an oxide semiconductor film, e.g., an In—Ga—ZnO film is formed by a deposition apparatus using ALD, an $In(CH_3)_3$ gas and an $O_3$ gas) are introduced sequentially and repeatedly to form an In—O layer, then a $Ga(CH_3)_3$ gas and an $O_3$ gas) are used to form a GaO layer, and then a $Zn(CH_3)_2$ gas and an $O_3$ gas) are used to form a ZnO layer. Note that the order of these layers is not limited to this example. Furthermore, a mixed compound layer such as an In—Ga—O layer, an In—Zn—O layer, or a Ga—Zn—O layer may be formed by mixing these gases. Note that an $H_2O$ gas which is obtained by bubbling with an inert gas such as Ar may be used instead of an $O_3$ gas), but it is preferable to use an $O_3$ gas), which does not contain H. Furthermore, instead of an $In(CH_3)_3$ gas, an $In(C_2H_5)_3$ gas may be used. Furthermore, instead of a $Ga(CH_3)_3$ gas, a $Ga(C_2H_5)_3$ gas may be used. Furthermore, a $Zn(CH_3)_2$ gas may be used.

<1-3. Structure Example 2 of Semiconductor Device>

Next, modification examples of the transistor 100 illustrated in FIGS. 1A, B, and C are described with reference to FIG. 2 to FIG. 6.

Figure 2A:
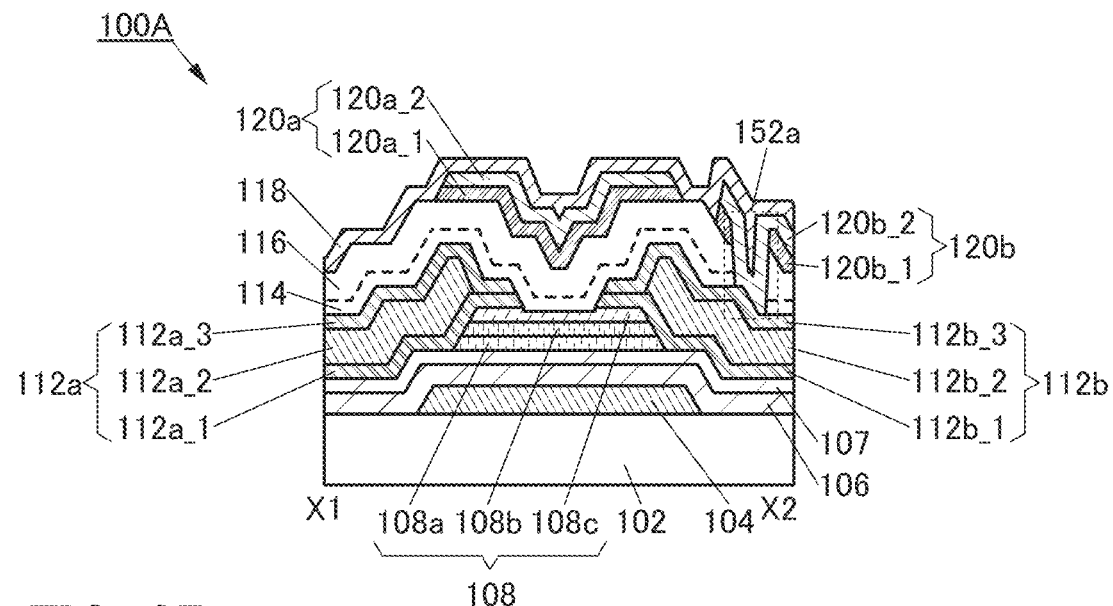
FIGS. 2A-B Cross-sectional views illustrating one embodiment of a semiconductor device.
Figure 2B:
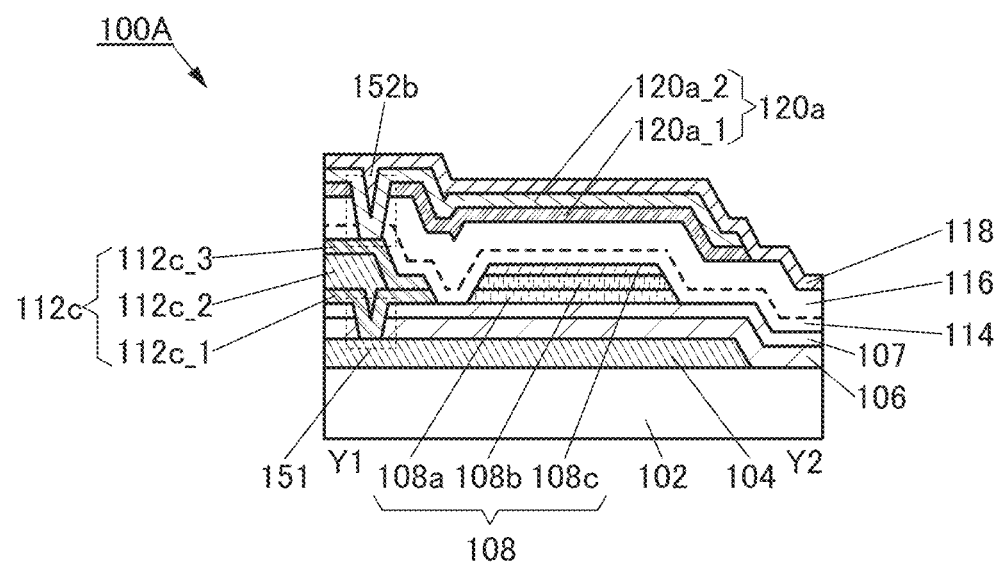

FIGS. 2A and B are cross-sectional views of a transistor 100A that is a modification example of the transistor 100 illustrated in FIGS. 1B and C. Furthermore, FIGS. 3A and B are cross-sectional views of a transistor 100B that is a modification example of the transistor 100 illustrated in FIGS. 1B and C. Furthermore, FIGS. 4A and B are cross-sectional views of a transistor 100C that is a modification example of the transistor 100 illustrated in FIGS. 1B and C. Furthermore, FIGS. 5A and B are cross-sectional views of a transistor 100D that is a modification example of the transistor 100 illustrated in FIGS. 1B and C. Furthermore, FIGS. 6A and B are cross-sectional views of a transistor 100E that is a modification example of the transistor 100 illustrated in FIGS. 1B and C.

In the transistor 100A illustrated in FIGS. 2A and B, the oxide semiconductor film 108 included in the transistor 100 illustrated in FIGS. 1B and C has a three-layer structure. More specifically, the oxide semiconductor film 108 included in the transistor 100A includes an oxide semiconductor film 108a, the oxide semiconductor film 108b over the oxide semiconductor film 108a, and the oxide semiconductor film 108c over the oxide semiconductor film 108b.

Figure 3A:
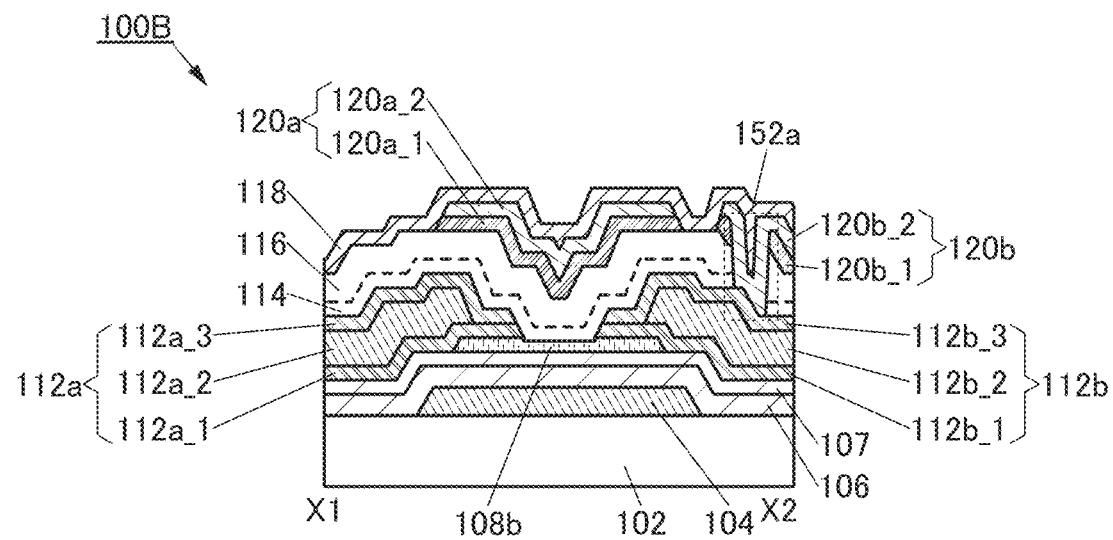
FIGS. 3A-B Cross-sectional views illustrating one embodiment of a semiconductor device.
Figure 3B:
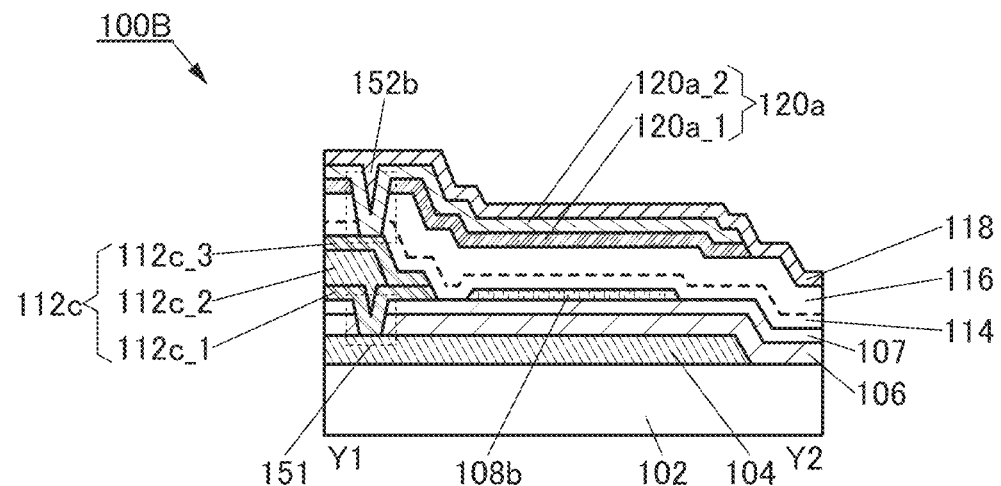

In the transistor 100B illustrated in FIGS. 3A and B, the oxide semiconductor film 108 included in the transistor 100 illustrated in FIGS. 1B and C has a single-layer structure. More specifically, the transistor 100B includes the oxide semiconductor film 108b.

Figure 4A:
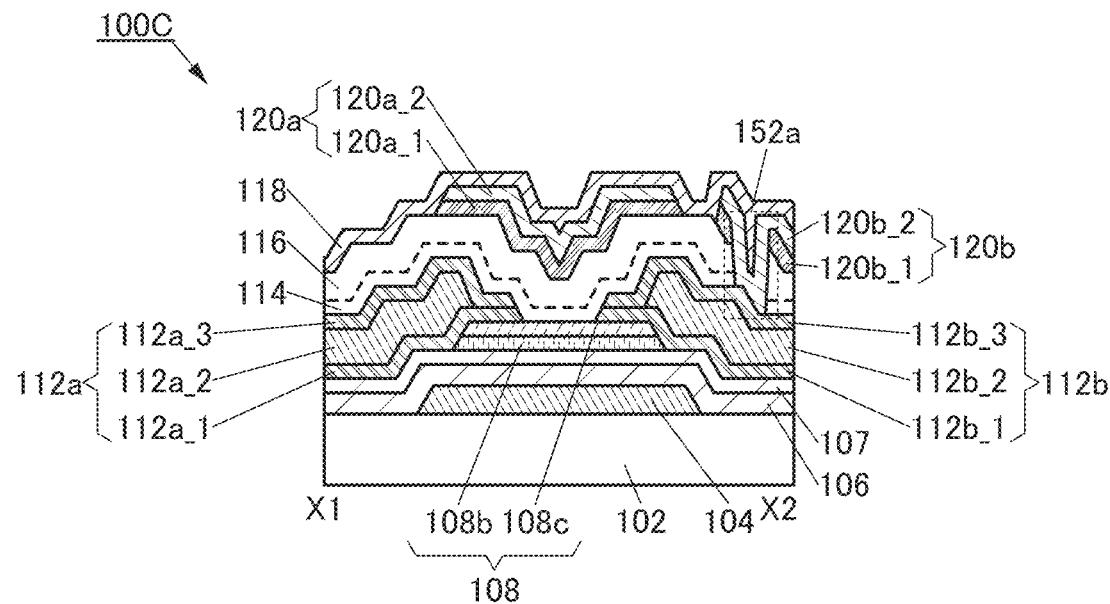
FIGS. 4A-B Cross-sectional views illustrating one embodiment of a semiconductor device.
Figure 4B:
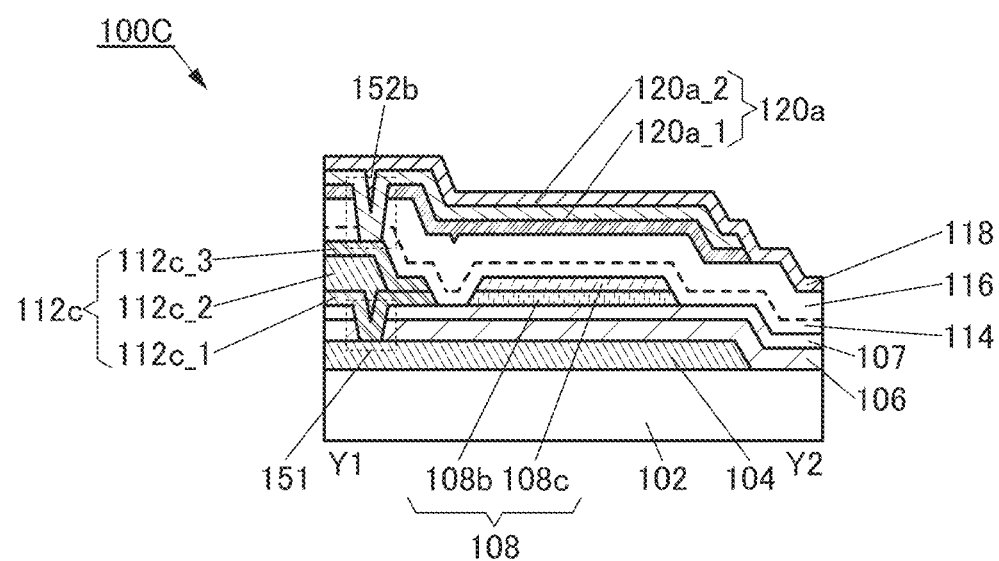

The transistor 100C illustrated in FIGS. 4A and B is different from the transistor 100 illustrated in FIGS. 1B and C in the shape of the oxide semiconductor film 108. More specifically, in the oxide semiconductor film 108c included in the transistor 100, the thickness of a region that is not covered with the conductive films 112a and 112b is thin in the drawing. In other words, an example in which part of the oxide semiconductor film has a recessed portion is illustrated. In contrast, in the oxide semiconductor film 108c included in the transistor 100C, the thickness of a region that is not covered with the conductive films 112a and 112b is not reduced in the drawing. In other words, part of the oxide semiconductor film does not have a recessed portion.

Figure 5A:
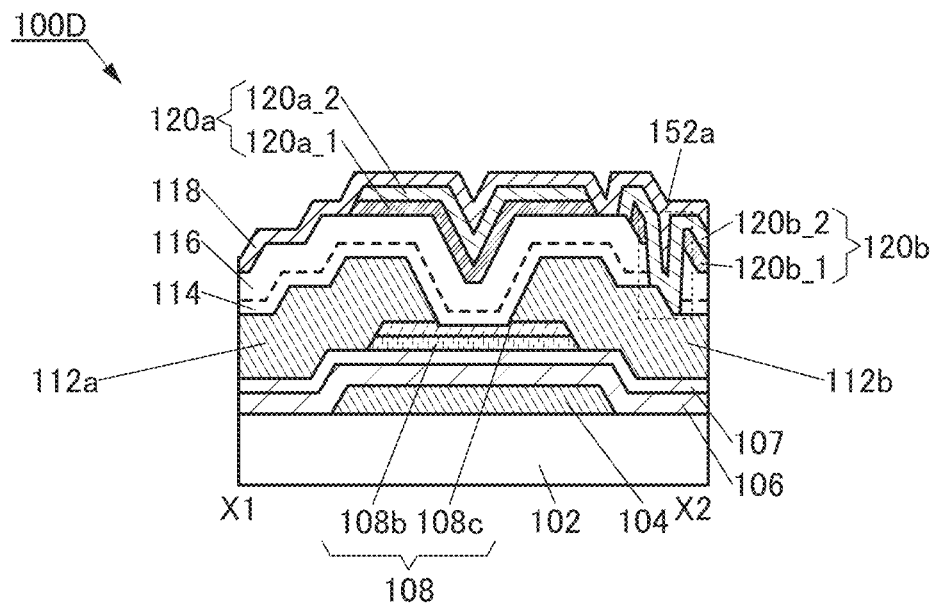
FIGS. 5A-B Cross-sectional views illustrating one embodiment of a semiconductor device.
Figure 5B:
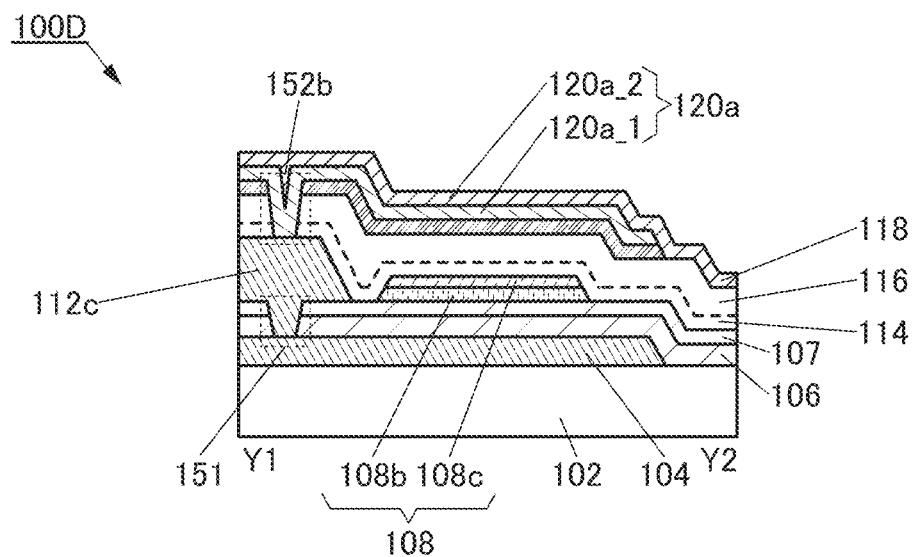

The transistor 100D illustrated in FIGS. 5A and B is different from the transistor 100 illustrated in FIGS. 1B and C in the structures of the conductive films 112a, 112b, and 112c. More specifically, the conductive films 112a, 112b, and 112c included in the transistor 100D each have a single-layer structure.

Figure 6A:
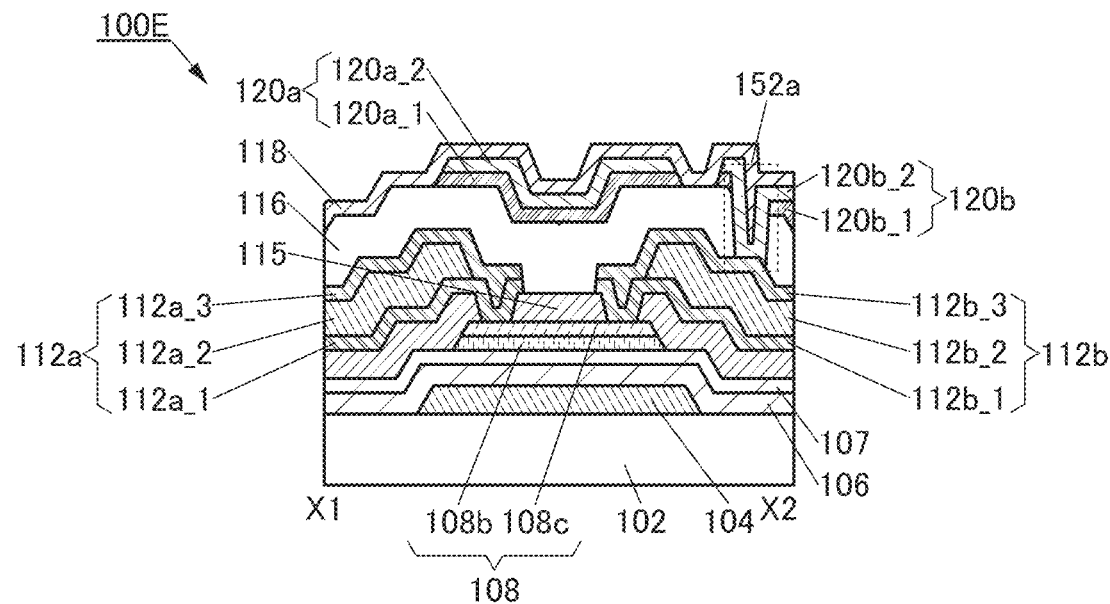
FIGS. 6A-B Cross-sectional views illustrating one embodiment of a semiconductor device.
Figure 6B:
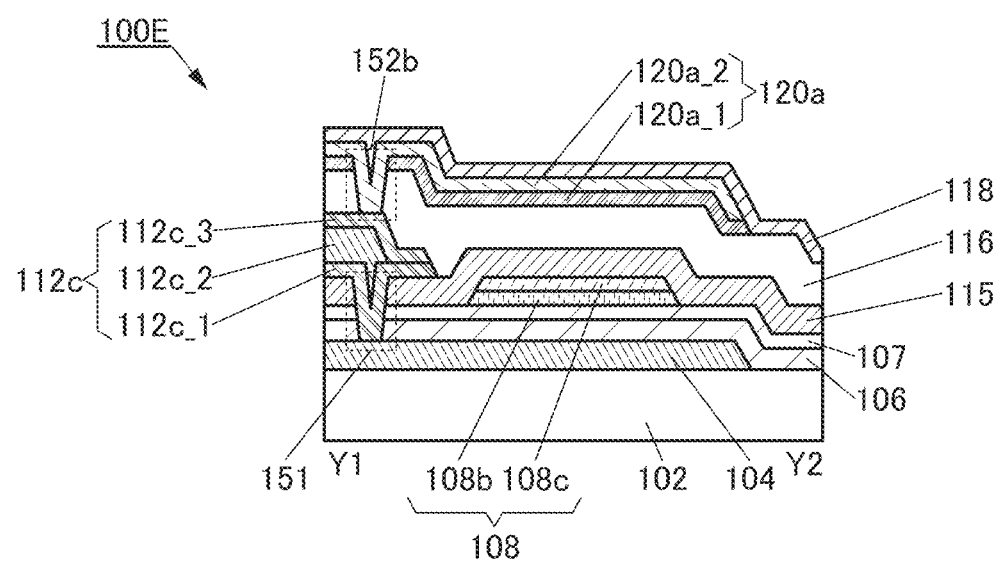

The transistor 100E illustrated in FIGS. 6A and B is what is called a channel-protective transistor. An insulating film 115 functioning as a channel protective film is provided over the oxide semiconductor film 108. The insulating film 115 can be formed using a material similar to that of the insulating film 114. Note that in the case of a structure in which the insulating film 115 is provided, a structure can be used in which the insulating film 114 is not provided and the insulating film 116 is provided over the conductive films 112a and 112b and the insulating film 115.

As described above, in the semiconductor device of the present invention, the stacked-layer structure of the oxide semiconductor films, the shape of the oxide semiconductor film, the stacked-layer structure of the conductive films, and the like can be changed. Furthermore, the structures of the transistors of this embodiment can be freely combined with each other.

<1-4. Manufacturing Method of Semiconductor Device>

Next, a manufacturing method of the transistor 100 that is a semiconductor device of one embodiment of the present invention will be described with reference to FIG. 7 to FIG. 12.

Note that FIG. 7A to FIG. 7C, FIG. 8A to FIG. 8C, FIG. 9A to FIG. 9C, FIG. 10A to FIG. 10C, FIG. 11A to FIG. 11C, and FIG. 12 are cross-sectional views illustrating a manufacturing method of the semiconductor device. Furthermore, in FIG. 7A to FIG. 7C, FIG. 8A to FIG. 8C, FIG. 9A to FIG. 9C, FIG. 10A to FIG. 10C, FIG. 11A to FIG. 11C, and FIG. 12, the left parts are the cross-sectional views in the channel length direction, and the right parts are the cross-sectional views in the channel width direction.

First, a conductive film is formed over the substrate 102 and the conductive film is processed through a lithography process and an etching process, whereby the conductive film 104 functioning as the first gate electrode is formed. Then, the insulating films 106 and 107 functioning as the first gate insulating film are formed over the conductive film 104 (see FIG. 7A).

In this embodiment, a glass substrate is used as the substrate 102, and as the conductive film 104 functioning as the first gate electrode, a 50-nm-thick titanium film and a 200-nm-thick copper film are each formed by a sputtering method. Furthermore, as the insulating film 106, a 400-nm-thick silicon nitride film is formed by a PECVD method, and as the insulating film 107, a 50-nm-thick silicon oxynitride film is formed by a PECVD method.

Note that the insulating film 106 can have a stacked-layer structure of silicon nitride films. Specifically, the insulating film 106 can have a three-layer structure of a first silicon nitride film, a second silicon nitride film, and a third silicon nitride film. The three-layer structure can be formed as follows, for example.

For example, the first silicon nitride film is formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PE-CVD apparatus, the pressure in the reaction chamber is controlled to 100 Pa, and the power of 2000 W is supplied using a 27.12 MHz high-frequency power source.

The second silicon nitride film is formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and the power of 2000 W is supplied using a 27.12 MHz high-frequency power source.

The third silicon nitride film is formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and the power of 2000 W is supplied using a 27.12 MHz high-frequency power source.

Note that the first silicon nitride film, the second silicon nitride film, and the third silicon nitride film can each be formed at a substrate temperature of 350° C. or lower.

When the insulating film 106 has the three-layer structure of silicon nitride films, the following effect can be produced in the case where a conductive film containing copper is used as the conductive film 104, for example.

The first silicon nitride film can inhibit diffusion of copper elements from the conductive film 104. The second silicon nitride film has a function of releasing hydrogen and can improve withstand voltage of the insulating film functioning as a gate insulating film. The third silicon nitride film releases a small amount of hydrogen and the third silicon nitride film can inhibit diffusion of hydrogen released from the second silicon nitride film.

The insulating film 107 is preferably formed using an insulating film containing oxygen to improve characteristics of an interface with the oxide semiconductor film 108 (more specifically, the oxide semiconductor film 108b) formed later. Furthermore, oxygen may be added to the insulating film 107 after the insulating film 107 is formed. Examples of oxygen added to the insulating film 107 include an oxygen radical, an oxygen atom, an oxygen atomic ion, and an oxygen molecular ion. Furthermore, examples of an addition method include an ion doping method, an ion implantation method, and a plasma treatment method.

Figure 7A:
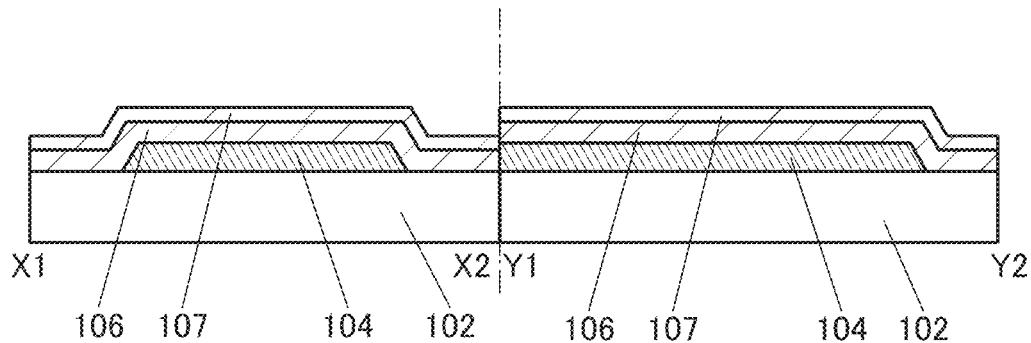
FIGS. 7A-C Cross-sectional views illustrating an example of a manufacturing process of a semiconductor device.
Figure 7B:
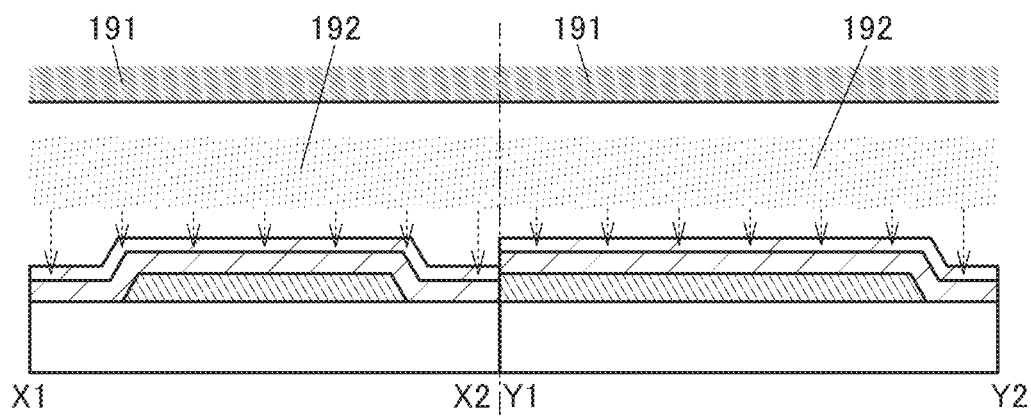
Figure 7C:
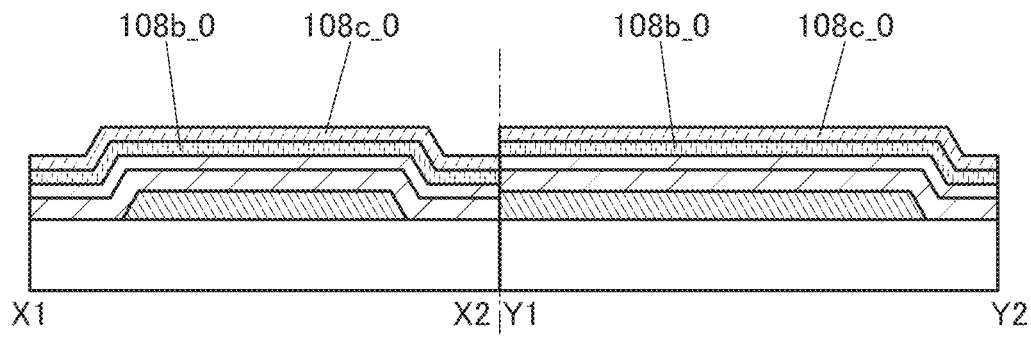

Next, an oxide semiconductor film 108b_0 and an oxide semiconductor film 108c_0 are formed over the insulating film 107 (see FIGS. 7B and C).

Note that FIG. 7B is a schematic cross-sectional view illustrating the inside of a deposition apparatus when the oxide semiconductor film 108b_0 is formed over the insulating film 107. In FIG. 7B, a sputtering apparatus is used as the deposition apparatus, and a target 191 placed inside the sputtering apparatus and plasma 192 formed under the target 191 are schematically illustrated.

First, when the oxide semiconductor film 108b_0 is formed, plasma is discharged in an atmosphere containing an oxygen gas. At this time, oxygen is added to the insulating film 107 over which the oxide semiconductor film 108b_0 is to be formed. Furthermore, when the oxide semiconductor film 108b_0 is formed, an inert gas (e.g., a helium gas, an argon gas, or a xenon gas) may be mixed in addition to the oxygen gas.

The oxygen gas is contained at least when the oxide semiconductor film 108b_0 is formed, and the proportion of the oxygen gas in a deposition gas for forming the oxide semiconductor film 108b_0 is higher than 0% and lower than or equal to 100%, preferably higher than or equal to 10% and lower than or equal to 100%, further preferably higher than or equal to 30% and lower than or equal to 100%.

Note that in FIG. 7B, oxygen or excess oxygen to be added to the insulating film 107 is schematically shown by arrows of broken lines.

Note that the substrate temperature at which the oxide semiconductor film 108b_0 is formed may be the same as or different from that at which the oxide semiconductor film 108c_0 is formed. Note that it is suitable that the oxide semiconductor film 108b_0 and the oxide semiconductor film 108c_0 are formed at the same substrate temperature, in which case the manufacturing costs can reduced.

For example, the substrate temperature at which the oxide semiconductor film 108 is formed is higher than or equal to room temperature and lower than 340° C., preferably higher than or equal to room temperature and lower than or equal to 300° C., further preferably higher than or equal to 100° C. and lower than or equal to 250° C., and still further preferably higher than or equal to 100° C. and lower than or equal to 200° C. The oxide semiconductor film 108 is formed by heating, so that the crystallinity of the oxide semiconductor film 108 can be increased. On the other hand, in the case where a large-sized glass substrate (e.g., the 6th generation to the 10th generation) is used as the substrate 102 and the substrate temperature at which the oxide semiconductor film 108 is formed is higher than or equal to 150° C. and lower than 340° C., the substrate 102 might be changed in shape (distorted or warped). Thus, in the case where a large-sized glass substrate is used, the change in the shape of the glass substrate can be suppressed by setting the substrate temperature at which the oxide semiconductor film 108 is formed to be higher than or equal to 100° C. and lower than 150° C.

In addition, increasing the purity of a sputtering gas is necessary. For example, as an oxygen gas or an argon gas used for a sputtering gas, a gas which is highly purified to have a dew point of −40° C. or lower, preferably −80° C. or lower, further preferably −100° C. or lower, and still further preferably −120° C. or lower is used, whereby entry of moisture or the like into the oxide semiconductor film can be minimized as much as possible.

Furthermore, when the oxide semiconductor film is formed by a sputtering method, a chamber of a sputtering apparatus is preferably evacuated to a high vacuum (to the degree of approximately $5\times10^{-7}$ Pa to $1\times10^{-4}$ Pa, for example) by an adsorption vacuum evacuation pump such as a cryopump so that water and the like acting as impurities for the oxide semiconductor film are removed as much as possible. Alternatively, a turbo molecular pump and a cold trap are preferably combined so as to prevent a backflow of a gas, especially a gas containing carbon or hydrogen from an exhaust system to the inside of the chamber.

Furthermore, after the oxide semiconductor film 108b_0 is formed, the oxide semiconductor film 108c_0 is successively formed over the oxide semiconductor film 108b. The formation conditions of the oxide semiconductor film 108c_0 can be similar to the formation conditions of the oxide semiconductor film 108b0. Note that the formation conditions of the oxide semiconductor film 108b_0 may be the same as or different from the formation conditions of the oxide semiconductor film 108c_0.

In this embodiment, the oxide semiconductor film 108b_0 is formed by a sputtering method using an In—Ga—Zn metal oxide target (In:Ga:Zn=4:2:4.1 [atomic ratio]) and then the oxide semiconductor film 108c_0 is successively formed in a vacuum by a sputtering method using an In—Ga—Zn metal oxide target (In:Ga:Zn=1:1:1.2 [atomic ratio]). Furthermore, the substrate temperature at which the oxide semiconductor film 108b_0 is formed is set to 170° C., and the substrate temperature at which the oxide semiconductor film 108c_0 is formed is set to 170° C. Furthermore, as the deposition gas for forming the oxide semiconductor film 108b_0, an oxygen gas at a flow rate of 60 sccm and an argon gas at a flow rate of 140 sccm are used. Furthermore, as the deposition gas for forming the oxide semiconductor film 108c_0, an oxygen gas at a flow rate of 100 sccm and an argon gas at a flow rate of 100 sccm are used.

Next, the oxide semiconductor film 108b_0 and the oxide semiconductor film 108c_ are processed into desired shapes, so that the island-shaped oxide semiconductor film 108b and the island-shaped oxide semiconductor film 108c are formed. Note that in this embodiment, the oxide semiconductor film 108 includes the oxide semiconductor film 108b and the oxide semiconductor film 108c (see FIG. 8A).

Furthermore, it is suitable that heat treatment (hereinafter, referred to as first heat treatment) is performed after the oxide semiconductor film 108 is formed. By the first heat treatment, hydrogen, water, and the like contained in the oxide semiconductor film 108 can be reduced. Note that the heat treatment for the purpose of reducing hydrogen, water, and the like may be performed before the oxide semiconductor film 108 is processed into an island shape. Note that the first heat treatment is one kind of treatment for increasing the purity of the oxide semiconductor film.

The first heat treatment can be performed at a temperature of, for example, higher than or equal to 150° C. and lower than the strain point of the substrate, preferably higher than or equal to 200° C. and lower than or equal to 450° C., and further preferably higher than or equal to 250° C. and lower than or equal to 350° C.

Moreover, an electric furnace, an RTA apparatus, or the like can be used for the first heat treatment. With the use of an RTA apparatus, the heat treatment can be performed at a temperature higher than or equal to the strain point of the substrate only for a short time. Therefore, the heat treatment time can be shortened. Furthermore, the first heat treatment is performed under an atmosphere of nitrogen, oxygen, ultra-dry air (air with a water content of 20 ppm or less, preferably 1 ppm or less, further preferably 10 ppb or less), or a rare gas (e.g., argon or helium). Note that it is preferable that hydrogen, water, and the like not be contained in nitrogen, oxygen, ultra-dry air, or a rare gas. Furthermore, after heat treatment performed under a nitrogen or rare gas atmosphere, heating may be additionally performed in an oxygen or ultra-dry air atmosphere. As a result, hydrogen, water, and the like can be released from the oxide semiconductor film and oxygen can be supplied to the oxide semiconductor film at the same time. Consequently, oxygen vacancies in the oxide semiconductor film can be reduced.

Then, the opening 151 is formed in a desired region of the insulating film 106 and the insulating film 107. Note that the opening 151 reaches the conductive film 104 (see FIG. 8B).

The opening 151 can be formed by one or both of a dry etching method and a wet etching method. In this embodiment, the opening 151 is formed by a dry etching method.

Figure 8A:
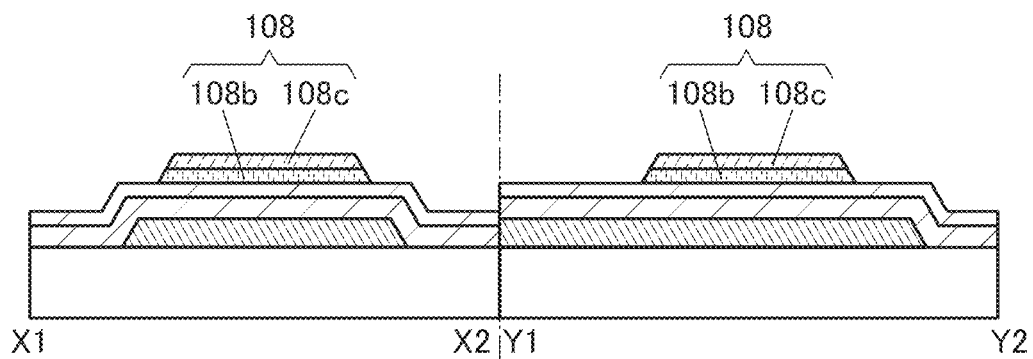
FIGS. 8A-C Cross-sectional views illustrating an example of a manufacturing process of a semiconductor device.
Figure 8B:
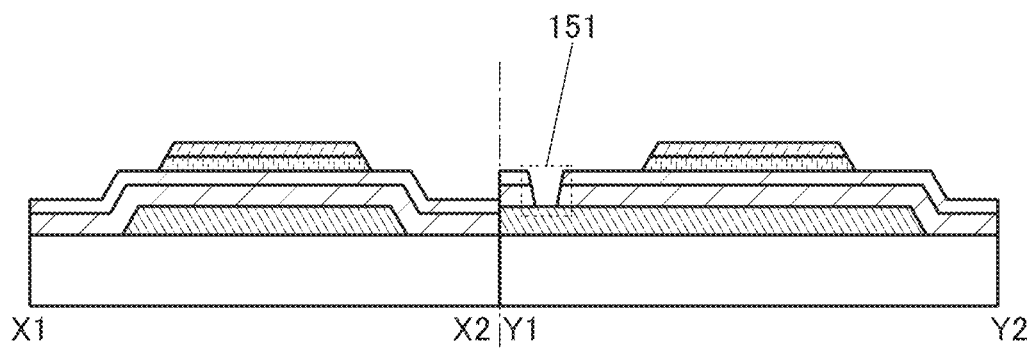
Figure 8C:
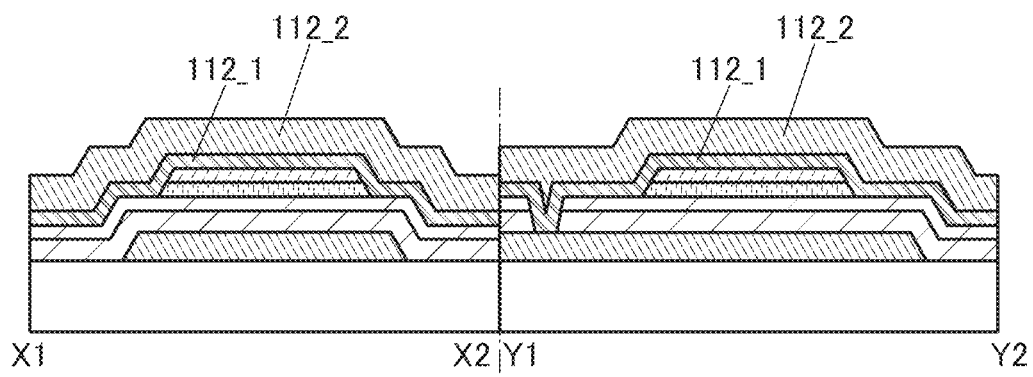
Figure 9A:
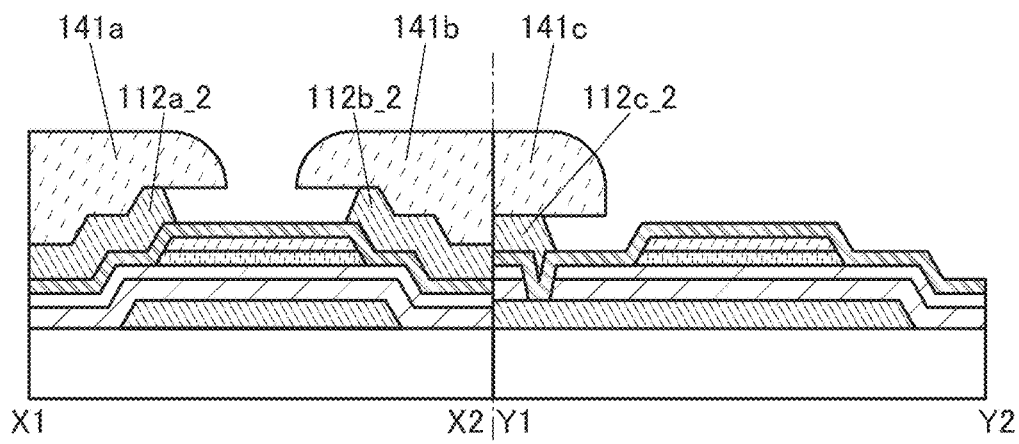
FIGS. 9A-C Cross-sectional views illustrating an example of a manufacturing process of a semiconductor device.
Figure 9B:
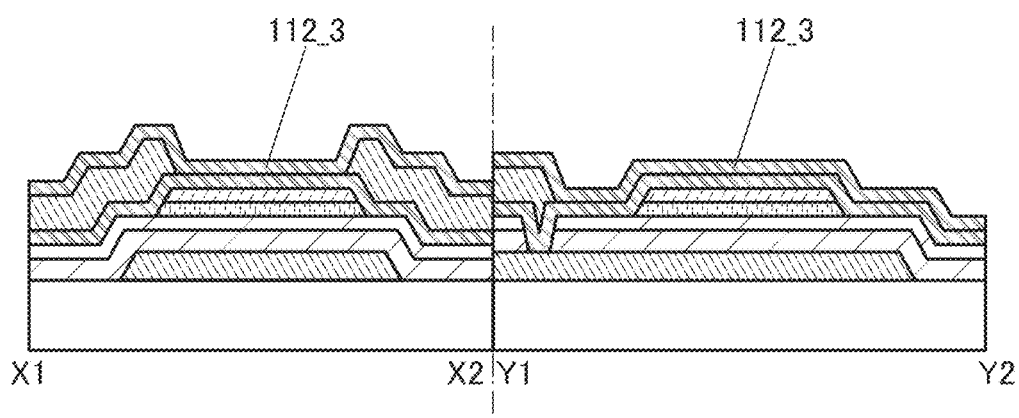
Figure 9C:
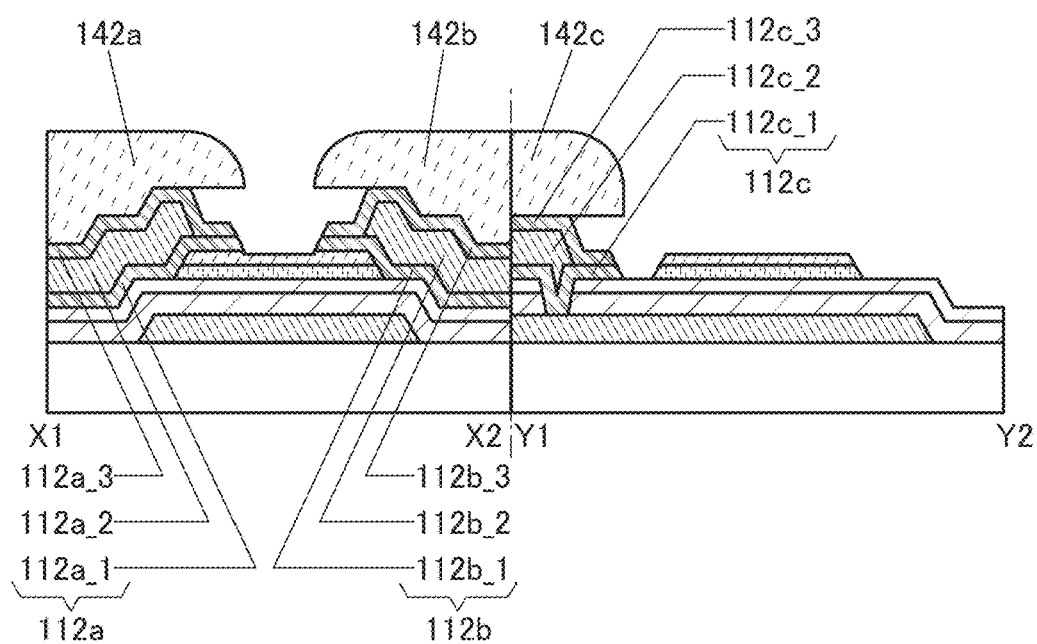

Then, conductive films 112_1 and 112_2 are formed over the insulating film 107, the oxide semiconductor film 108, and the conductive film 104 (see FIG. 8C).

In this embodiment, a 30-nm-thick titanium film is formed by a sputtering method as the conductive film 112_1.

Furthermore, a 200-nm-thick copper film is formed by a sputtering method as the conductive film 1122.

Next, masks 141a, 141b, and 141c are formed in desired regions over the conductive film 112_2. Then, the conductive film 112_2 is processed using the masks 141a, 141b, and 141c to form the island-shaped metal film 112a_2, the island-shaped metal film 112b_2, and the island-shaped metal film 112c_2 (see FIG. 9A).

Note that in this embodiment, the conductive film 112_2 is processed with a wet etching apparatus. Note that the processing method of the conductive film 112_2 is not limited thereto, and a dry etching apparatus may be used, for example.

Next, the masks 141a, 141b, and 141c are removed. Then, a conductive film 1123 is formed over the conductive film 112_1 and the metal films 112a_2, 112b_2, and 112c_2 (see FIG. 9B).

In this embodiment, a 10-nm-thick titanium film is formed by a sputtering method as the conductive film 112_3. Note that by the formation of the conductive film 112_3, a structure is obtained in which the metal films 112a_2, 112b_2, and 112c_2 are surrounded by the conductive film 112_1 and the conductive film 112_3. Owing to the structure in which the metal films 112a_2, 112b_2, and 112c_2 are surrounded by the conductive film 112_1 and the conductive film 112_3, a copper element contained in the metal films 112a_3, 112b_2, and 112c_2 can be prevented from diffusing into the outside, in particular, the oxide semiconductor film 108.

Next, masks 142a, 142b, and 142c are formed in desired regions over the conductive film 112_3. Then, the conductive film 112_1 and the conductive film 112_3 are processed using the masks 142a, 142b, and 142c to form the island-shaped metal film 112a_1, the island-shaped metal film 112b_1, the island-shaped metal film 112c_1, the island-shaped metal film 112a_3, the island-shaped metal film 112b_3, and the island-shaped metal film 112c_3. By this step, the conductive film 112a including the metal film 112a_1, the metal film 112a_2, and the metal film 112a_3, the conductive film 112b including the metal film 112b_1, the metal film 112b_2, and the metal film 112b_3, and the conductive film 112c including the metal film 112c_1, the metal film 112c_2, and the metal film 112c_3 are formed (see FIG. 9C).

Note that in this embodiment, the conductive film 112_1 and the conductive film 112_3 are processed with a dry etching apparatus. Note that the processing method of the conductive film 112_1 and the conductive film 112_3 is not limited thereto, and a wet etching apparatus may be used, for example.

Furthermore, after the conductive films 112a and 112b are formed, a surface (on the back channel side) of the oxide semiconductor film 108 (more specifically, the oxide semiconductor film 108c) may be cleaned. Examples of the cleaning method include cleaning using a chemical solution such as a phosphoric acid. The cleaning using a chemical solution such as a phosphoric acid is performed, whereby impurities (e.g., an element included in the conductive films 112a and 112b) attached to the surface of the oxide semiconductor film 108c can be removed. Note that the cleaning is not necessarily performed, and the cleaning may be omitted depending on the case.

Furthermore, in one or both of the step of forming the conductive films 112a and 112b and the cleaning step, the thickness of a region of the oxide semiconductor film 108 which is not covered with the conductive films 112a and 112b might be reduced.

Figure 10A:
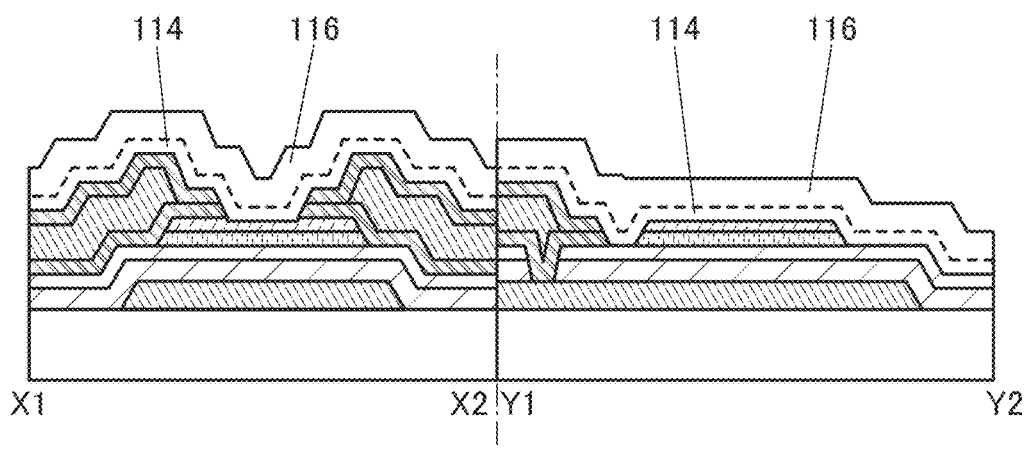
FIGS. 10A-C Cross-sectional views illustrating an example of a manufacturing process of a semiconductor device.

Then, the insulating film 114 and the insulating film 116 are formed over the oxide semiconductor film 108 and the conductive films 112a and 112b (see FIG. 10A).

Note that after the insulating film 114 is formed, the insulating film 116 is preferably formed successively without exposure to the air. When the insulating film 116 is formed successively after the formation of the insulating film 114 without exposure to the air while at least one of the flow rate of a source gas, the pressure, high-frequency power, and the substrate temperature is adjusted, the concentration of impurities attributed to the atmospheric component at the interface between the insulating film 114 and the insulating film 116 can be reduced.

For example, as the insulating film 114, a silicon oxynitride film can be formed by a PECVD method. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. Furthermore, the flow rate of the oxidizing gas is more than or equal to 20 times and less than or equal to 5000 times, preferably more than or equal to 40 times and less than or equal to 100 times, the flow rate of the deposition gas.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to a parallel-plate electrode.

A silicon oxide film or a silicon oxynitride film is formed as the insulating film 116 under the conditions where the substrate placed in a treatment chamber of a PECVD apparatus that is vacuum-evacuated is held at a temperature higher than or equal to 180° C. and lower than or equal to 350° C.; the pressure is greater than or equal to 100 Pa and less than or equal to 250 Pa, preferably greater than or equal to 100 Pa and less than or equal to 200 Pa with introduction of a source gas into the treatment chamber; and a high-frequency power of greater than or equal to 0.17 W/cm$^2$ and less than or equal to 0.5 W/cm$^2$, further preferably greater than or equal to 0.25 W/cm$^2$ and less than or equal to 0.35 W/cm$^2$ is supplied to an electrode provided in the treatment chamber.

As the film formation conditions of the insulating film 116, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. On the other hand, in the film formed at a substrate temperature within the above temperature range, the bond between silicon and oxygen is weak, and accordingly, part of oxygen in the film is released by heat treatment in a later step. As a result, it is possible to form an oxide insulating film which contains oxygen in excess of oxygen in the stoichiometric composition and from which part of oxygen is released by heating.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the film formation conditions of the insulating film 116, when the flow rate of the deposition gas containing silicon with respect to the oxidizing gas is increased, the number of defects in the insulating film 116 can be reduced. Typically, it is possible to form an oxide insulating film in which the number of defects is small, that is, the spin density of a signal that appears at g=2.001 due to a dangling bond of silicon is lower than $6 \times 10^{17}$ spins/cm$^3$, preferably lower than or equal to $3 \times 10^{17}$ spins/cm$^3$, and further preferably lower than or equal to $1.5 \times 10^{17}$ spins/cm$^3$ by ESR measurement. As a result, the reliability of the transistor 100 can be improved.

Furthermore, it is suitable that heat treatment (hereinafter, referred to as second heat treatment) is performed after the insulating films 114 and 116 are formed. The second heat treatment can reduce nitrogen oxide included in the insulating films 114 and 116. Alternatively, by the second heat treatment, part of oxygen contained in the insulating films 114 and 116 can be transferred to the oxide semiconductor film 108, so that the oxygen vacancies included in the oxide semiconductor film 108 can be reduced.

The temperature of the second heat treatment is typically lower than 400° C., preferably lower than 375° C., further preferably higher than or equal to 150° C. and lower than or equal to 350° C. The second heat treatment is performed in an atmosphere of nitrogen, oxygen, ultra-dry air (air with a water content of 20 ppm or less, preferably 1 ppm or less, further preferably 10 ppb or less), or a rare gas (e.g., argon or helium). Note that an electric furnace, RTA, or the like can be used for the heat treatment, in which it is preferable that hydrogen, water, and the like not be contained in nitrogen, oxygen, ultra-dry air, or a rare gas.

Figure 10B:
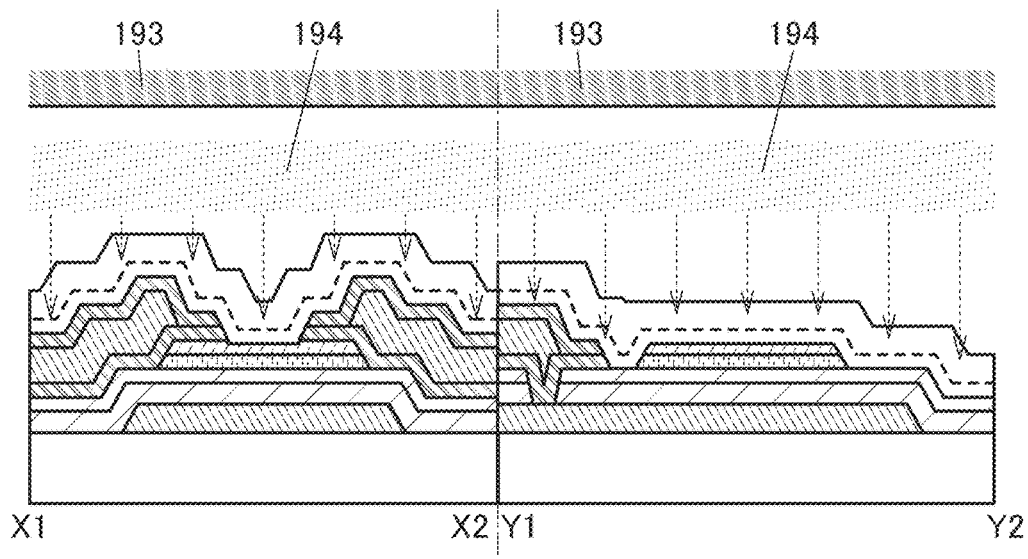
Figure 10C:
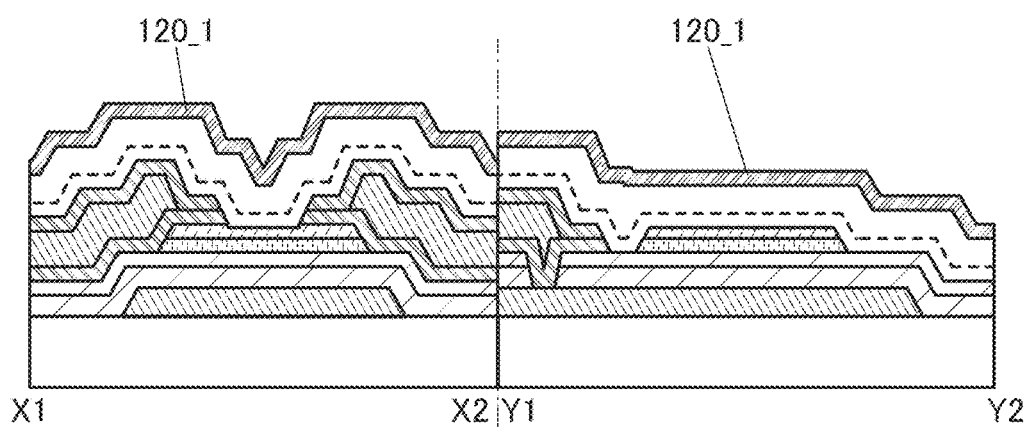

Then, an oxide conductive film 120_1 is formed over the insulating film 116 (see FIGS. 10B and C).

Note that FIG. 10B is a schematic cross-sectional view illustrating the inside of a deposition apparatus when the oxide conductive film 120_1 is formed over the insulating film 116. In FIG. 10B, a sputtering apparatus is used as the deposition apparatus, and a target 193 placed inside the sputtering apparatus and plasma 194 formed under the target 193 are schematically illustrated.

First, when the oxide conductive film 120_1 is formed, plasma is discharged in an atmosphere containing an oxygen gas. At this time, oxygen is added to the insulating film 116 over which the oxide conductive film 120_1 is to be formed. Furthermore, when the oxide conductive film 120_1 is formed, an inert gas (e.g., a helium gas, an argon gas, or a xenon gas) may be mixed in addition to an oxygen gas.

The oxygen gas is contained at least when the oxide conductive film 120_1 is formed, and the proportion of the oxygen gas in a deposition gas for forming the oxide conductive film 120_1 is higher than 0% and lower than or equal to 100%, preferably higher than or equal to 10% and lower than or equal to 100%, further preferably higher than or equal to 30% and lower than or equal to 100%.

Note that in FIG. 10B, oxygen or excess oxygen to be added to the insulating film 116 is schematically shown by arrows of broken lines.

In this embodiment, the oxide conductive film 120_1 is formed by a sputtering method using an In—Ga—Zn metal oxide target (In:Ga:Zn=4:2:4.1 [atomic ratio]).

Note that although this embodiment describes a method in which oxygen is added to the insulating film 116 when the oxide conductive film 120_1 is formed, the present invention is not limited thereto. For example, oxygen may be further added to the insulating film 116 after the oxide conductive film 120_1 is formed.

As a method for adding oxygen to the insulating film 116, for example, a 5-nm-thick ITSO film is formed using a target of an oxide containing indium, tin, and silicon (also referred to as ITSO) (In$_2$O$_3$:SnO$_2$:SiO$_2$=85:10:5 [weight %]) as the oxide conductive film 120_1.

In that case, the thickness of the oxide conductive film 120_1 is preferably greater than or equal to 1 nm and less than or equal to 20 nm or greater than or equal to 2 nm and less than or equal to 10 nm, in which case oxygen is suitably transmitted and release of oxygen can be inhibited. Then, oxygen is added to the insulating film 116 through the oxide conductive film 120_1. Examples of the method for adding oxygen include an ion doping method, an ion implantation method, and a plasma treatment method. Furthermore, a bias voltage is applied to the substrate side when oxygen is added, whereby oxygen can be effectively added to the insulating film 116. An ashing apparatus is used, for example, and the power density of the bias voltage applied to the substrate side of the ashing apparatus is greater than or equal to 1 W/cm$^2$ and less than or equal to 5 W/cm$^2$ as the bias voltage. Furthermore, the substrate temperature at which oxygen is added is higher than or equal to room temperature and lower than or equal to 300° C., preferably higher than or equal to 100° C. and lower than or equal to 250° C., whereby oxygen can be added efficiently to the insulating film 116.

Next, a mask is formed over the oxide conductive film 120_1 through a lithography process, and the openings 152a and 152b are formed in desired regions in the oxide conductive film 120_1 and the insulating films 114 and 116. Note that the opening 152a is formed to reach the conductive film 112b, and the opening 152b is formed to reach the conductive film 112c (see FIG. 11A).

The openings 152a and 152b can be formed by one or both of a dry etching method and a wet etching method. In this embodiment, the openings 152a and 152b are formed by a dry etching method.

Figure 11A:
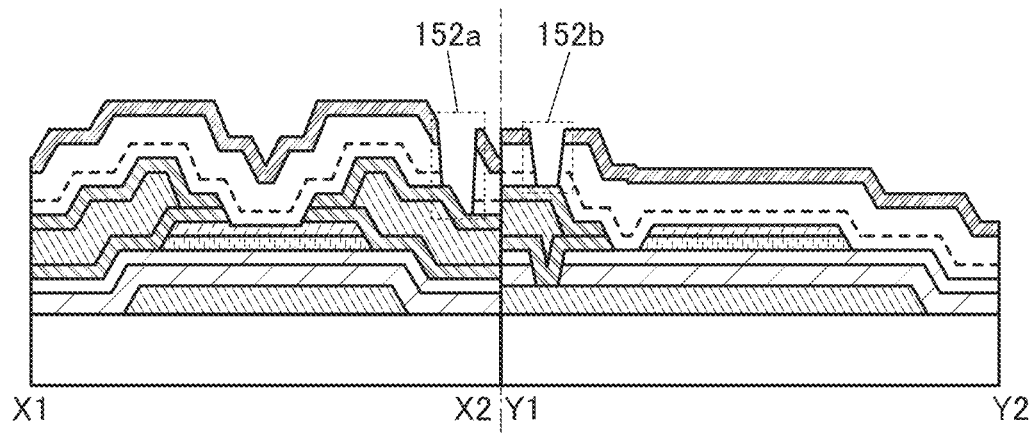
FIGS. 11A-C Cross-sectional views illustrating an example of a manufacturing process of a semiconductor device.
Figure 11B:
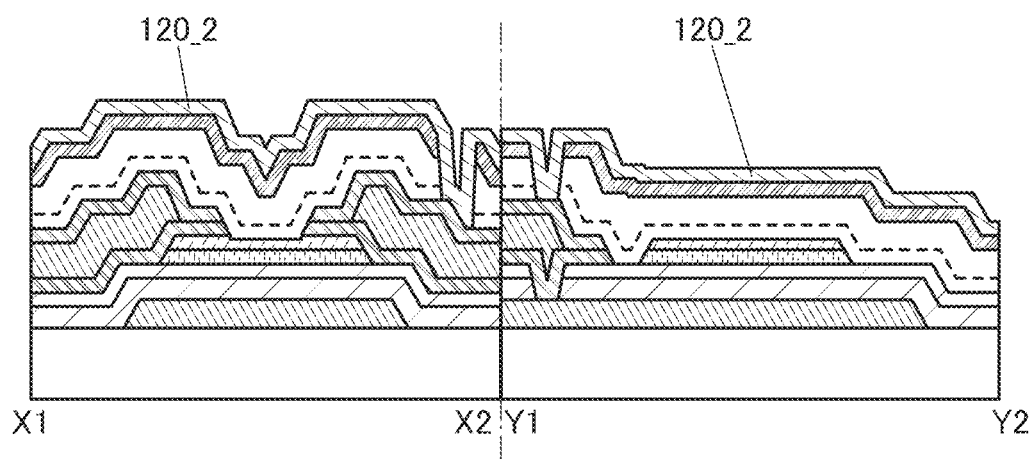
Figure 11C:
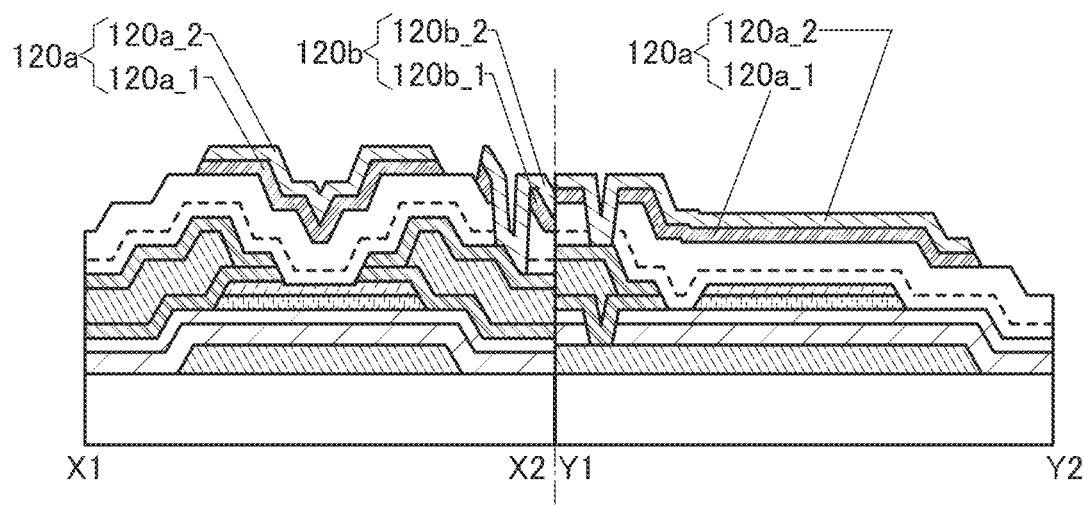

Then, a metal film 1202 is formed over the oxide conductive film 120_1, the conductive film 112b, and the conductive film 112c (see FIG. 11B).

In this embodiment, a 100-nm-thick titanium film is formed by a sputtering method as the metal film 120_2.

Next, after a mask is formed over the metal film 120_2 by a lithography method, the metal film 120_2 and the oxide conductive film 120_1 are processed into desired shapes, whereby the island-shaped conductive film 120a and the island-shaped conductive film 120b are formed. Note that the conductive film 120a includes the island-shaped oxide conductive film 120a_1 and the island-shaped metal film 120a_2, and the conductive film 120b includes the island-shaped oxide conductive film 120b_1 and the island-shaped metal film 120b_2 (see FIG. 11C).

Figure 12:
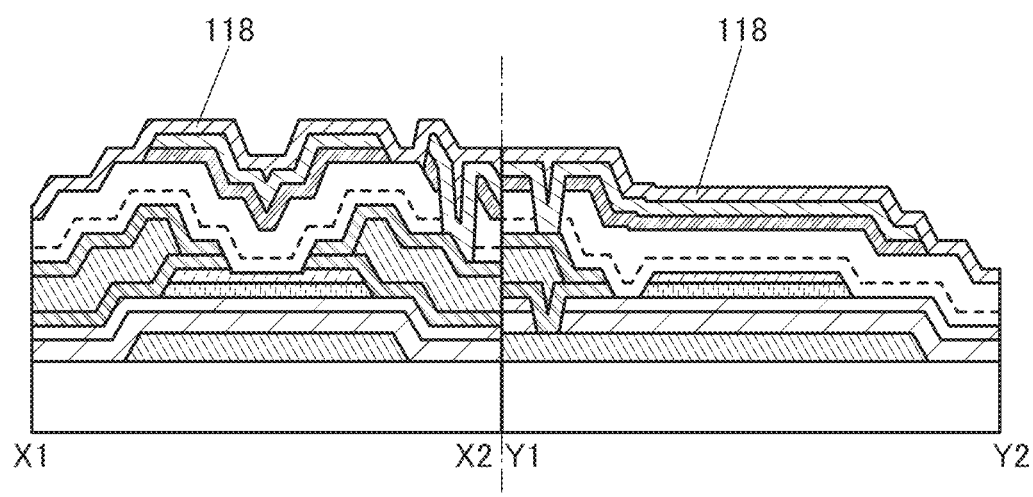
FIG. 12 A cross-sectional view illustrating an example of a manufacturing process of a semiconductor device.

Then, the insulating film 118 is formed over the insulating film 116 and the conductive films 120a and 120b (see FIG. 12).

The insulating film 118 contains one or both of hydrogen and nitrogen. As the insulating film 118, a silicon nitride film is suitably used, for example. Furthermore, the insulating film 118 can be formed by a sputtering method or a PECVD method, for example. In the case where the insulating film 118 is formed by a PECVD method, for example, the substrate temperature is lower than 400° C., preferably lower than 375° C., and further preferably higher than or equal to 180° C. and lower than or equal to 350° C. The substrate temperature at which the insulating film 118 is formed is preferably within the above range because a dense film can be formed. Furthermore, when the substrate temperature at which the insulating film 118 is formed is within the above range, oxygen or excess oxygen in the insulating films 114 and 116 can be moved to the oxide semiconductor film 108.

Furthermore, in the case where a silicon nitride film is formed by a PECVD method as the insulating film 118, a deposition gas containing silicon, nitrogen, and ammonia are preferably used as a source gas. A small amount of ammonia compared with the amount of nitrogen is used, whereby ammonia is dissociated in the plasma and activated species are generated. The activated species cleave a bond between silicon and hydrogen that are contained in the deposition gas containing silicon and a triple bond between nitrogen molecules. As a result, a dense silicon nitride film having few defects, in which bonds between silicon and nitrogen are promoted and bonds between silicon and hydrogen are few, can be formed. On the other hand, when the amount of ammonia with respect to nitrogen is large, decomposition of the deposition gas containing silicon and decomposition of nitrogen are not promoted, so that a sparse silicon nitride film in which bonds between silicon and hydrogen remain and defects are increased is formed. Therefore, in the source gas, the flow rate of nitrogen is set to be preferably 5 times or more and 50 times or less, further preferably 10 times or more and 50 times or less that of ammonia.

In this embodiment, with the use of a PECVD apparatus, a 50-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to a parallel-plate electrode with a 27.12 MHz high-frequency power source. The PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

Furthermore, after the insulating film 118 is formed, heat treatment similar to the first heat treatment and the second heat treatment (hereinafter, referred to as third heat treatment) may be performed.

The third heat treatment is performed, whereby oxygen added to the insulating film 116 in forming the oxide conductive film 120_1 moves into the oxide semiconductor film 108 (in particular, the oxide semiconductor film 108b) and fills oxygen vacancies in the oxide semiconductor film 108.

Through the above process, the transistor 100 illustrated in FIGS. 1C and D can be manufactured.

Furthermore, in the entire manufacturing process of the transistor 100, the substrate temperature is preferably lower than 400° C., further preferably lower than 375° C., and still further preferably higher than or equal to 180° C. and lower than or equal to 350° C. because the change in shape of the substrate (distortion or warp) can be significantly reduced even when a large-sized substrate is used. Note that typical examples of a step in which the substrate temperature is increased in the manufacturing process of the transistor 100 are as follows: the substrate temperature in the formation of the insulating films 106 and 107 (lower than 400° C., preferably higher than or equal to 250° C. and lower than or equal to 350° C.), the substrate temperature in the formation of the oxide semiconductor film 108 (higher than or equal to room temperature and lower than 340° C., preferably higher than or equal to 100° C. and lower than or equal to 200° C., further preferably higher than or equal to 100° C. and lower than 150° C.), the substrate temperature in the formation of the insulating films 116 and 118 (lower than 400° C., preferably lower than 375° C., further preferably higher than or equal to 180° C. and lower than or equal to 350° C.), and the first heat treatment, the second heat treatment, or the third heat treatment (lower than 400° C., preferably lower than 375° C., further preferably higher than or equal to 180° C. and lower than or equal to 350° C.).

Note that the structure and method described in this embodiment can be used in appropriate combination with the structure and method described in any of the other embodiments.

Embodiment 2

In this embodiment, the composition of an oxide semiconductor, the structure of an oxide semiconductor, and the like that can be used in one embodiment of the present invention are described with reference to FIG. 13 to FIG. 20.

<2-1. Composition of Oxide Semiconductor>

First, composition of an oxide semiconductor is described.

An oxide semiconductor preferably contains at least indium or zinc. In particular, indium and zinc are preferably contained. In addition, aluminum, gallium, yttrium, tin, or the like is preferably contained. Furthermore, one or more selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. Note that the element M is aluminum, gallium, yttrium, tin, or the like. Other elements that can be used as the element M are boron, silicon, titanium, iron, nickel, germanium, zirconium, molybdenum, lanthanum, cerium, neodymium, hafnium, tantalum, tungsten, magnesium, and the like. Note that a plurality of the above elements may be used in combination as the element M.

First, preferred ranges of the atomic ratio of indium, the element M, and zinc contained in an oxide semiconductor of the present invention are described with reference to FIG. 13A, FIG. 13B, and FIG. 13C. Note that the proportion of oxygen atoms is not shown in FIG. 13. Furthermore, the terms of the atomic ratio of indium, the element M, and zinc contained in the oxide semiconductor are denoted by [In], [M], and [Zn], respectively.

Figure 13A:
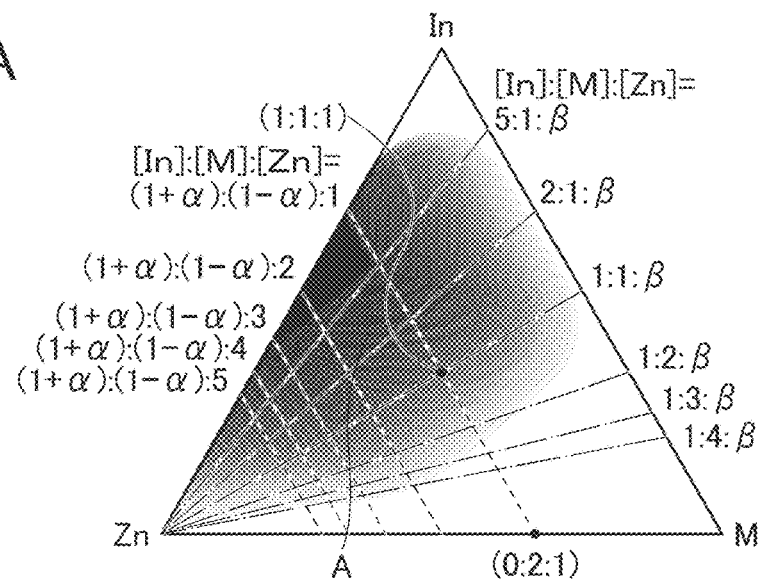
FIGS. 13A-C Diagrams illustrating an atomic ratio range of an oxide semiconductor.
Figure 13B:
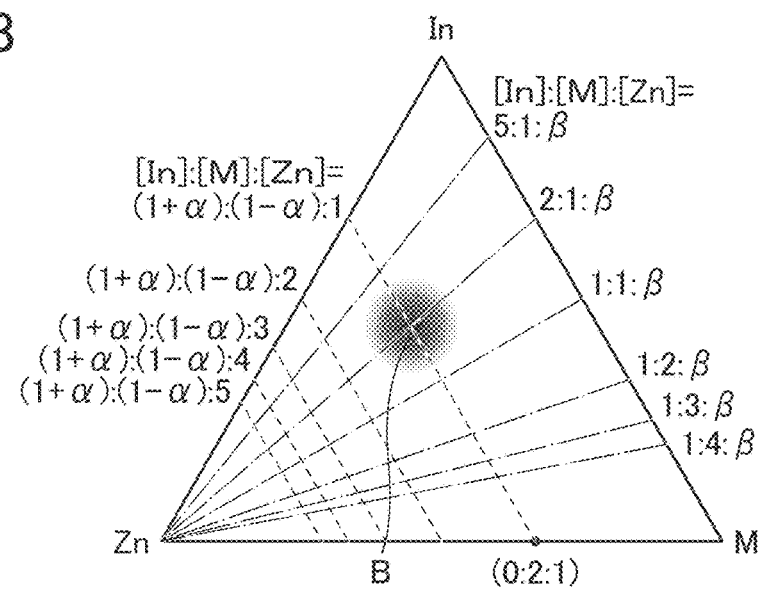
Figure 13C:
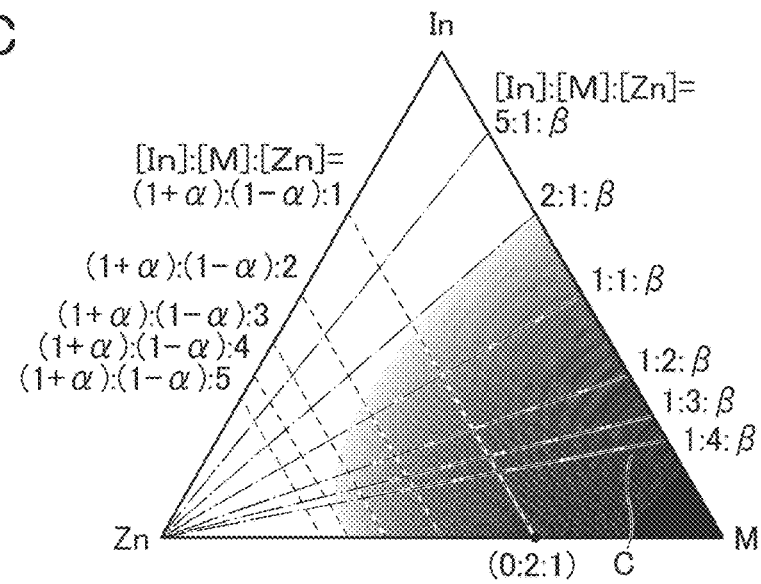

In FIG. 13A, FIG. 13B, and FIG. 13C, broken lines indicate a line where the atomic ratio [In]:[M]:[Zn] is $(1+\alpha):(1-\alpha):1$, $(-1 \le \alpha \le 1)$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Furthermore, dashed-dotted lines indicate a line where the atomic ratio [In]:[M]:[Zn] is $1:1\beta$ ($\beta \ge 0$), a line where the atomic ratio [In]:[M]:[Zn] is $1:2\beta$, a line where the atomic ratio [In]:[M]:[Zn] is $1:3\beta$, a line where the atomic ratio [In]:[M]:[Zn] is $1:4:\beta$, a line where the atomic ratio [In]:[M]:[Zn] is $2:1\beta$, and a line where the atomic ratio [In]:[M]:[Zn] is $5:1\beta$.

Furthermore, a dashed double-dotted line indicates a line where the atomic ratio [In]:[M]:[Zn] is $(1+\gamma):2:(1-\gamma)$ $(-1 \le \gamma \le 1)$. Furthermore, the oxide semiconductor shown in FIG. 13 with an atomic ratio of [In]:[M]:[Zn]=0:2:1 or a neighborhood thereof is likely to have a spinel crystal structure.

FIG. 13A and FIG. 13B show examples of the preferred ranges of the atomic ratio of indium, the element M, and zinc contained in an oxide semiconductor of one embodiment of the present invention.

Figure 14:
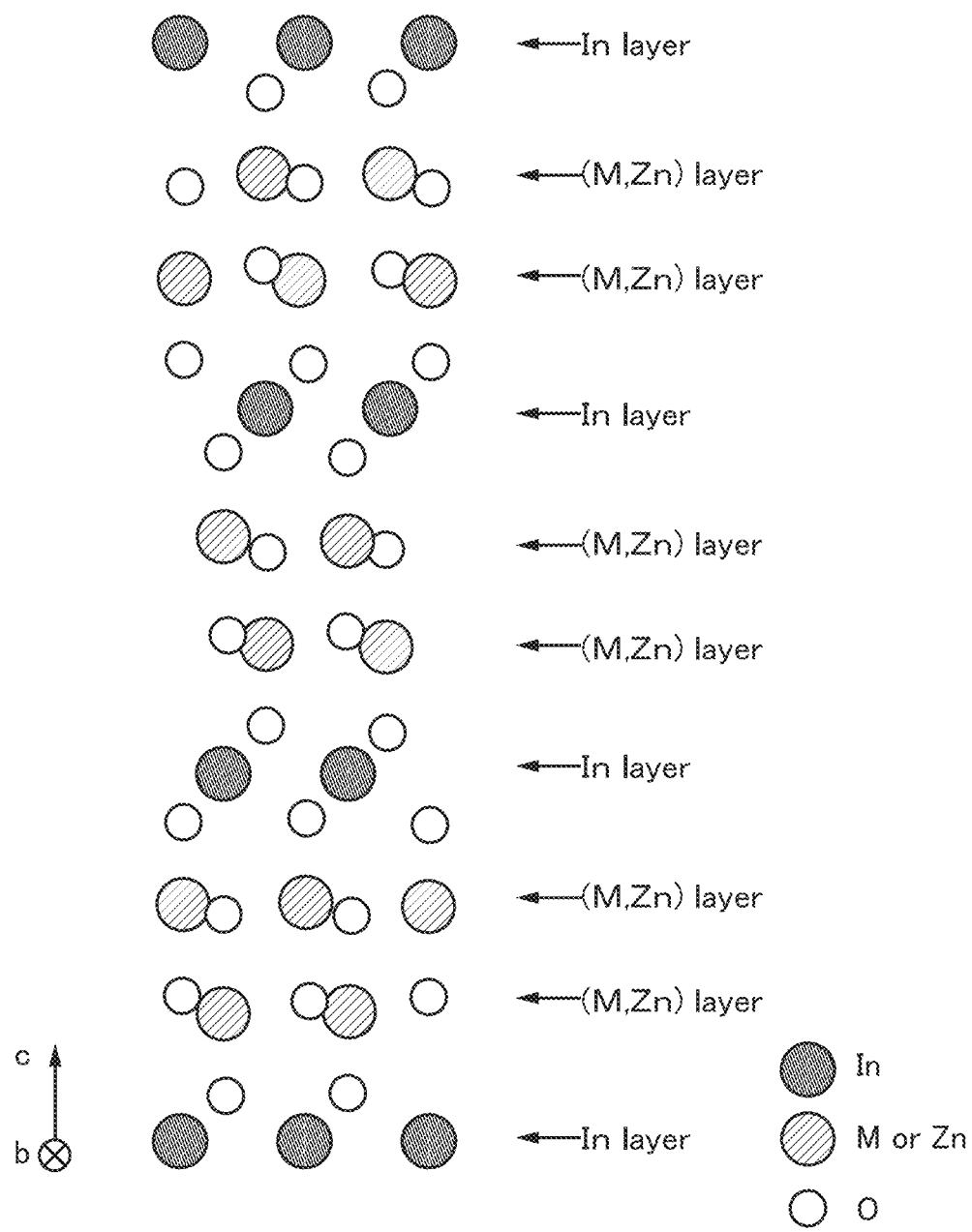
FIG. 14 A diagram illustrating a crystal of $InMZnO_4$.

FIG. 14 shows an example of the crystal structure of InMZnO$_4$ in which [In]:[M]:[Zn] is 1:1:1. Furthermore, FIG. 14 shows the crystal structure of InMZnO$_4$ observed from a direction parallel to a b-axis. Note that a metal element in a layer containing M, Zn, and oxygen (hereinafter, referred to as an (M,Zn) layer) in FIG. 14 represents the element M or zinc. In that case, the proportion of the element M is the same as that of zinc. The element M and zinc can be replaced with each other and are arranged randomly.

InMZnO$_4$ has a layered crystal structure (also referred to as a layered structure) and includes one layer that contains indium and oxygen (hereinafter, In layer) for every two (M,Zn) layers that contain the element M, zinc, and oxygen, as shown in FIG. 14.

Furthermore, indium and the element M can be replaced with each other. Therefore, when the element M in the (M,Zn) layer is replaced with indium, the layer can also be referred to as an (In,M,Zn) layer. In that case, a layered structure that contains one In layer for every two (In,M,Zn) layers is obtained.

An oxide semiconductor whose atomic ratio [In]:[M]:[Zn] is 1:1:2 has a layered structure that contains one In layer for every three (M,Zn) layers. That is, when [Zn] is higher than [In] and [M], the proportion of the (M,Zn) layer to the In layer becomes higher when the oxide semiconductor is crystallized.

Note that in the case where the number of (M,Zn) layers with respect to one In layer is not an integer in the oxide semiconductor, it might have a plurality of kinds of layered structures where the number of (M,Zn) layers with respect to one In layer is an integer. For example, in the case of [In]:[M]:[Zn]=1:1:1.5, layered structures in which a layered structure including one In layer for every two (M,Zn) layers and a layered structure including one In layer for every three (M,Zn) layers are mixed can be obtained in some cases.

For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition.

Furthermore, a plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary (also referred to as a grain boundary) might be formed between different crystal structures.

In addition, when the indium content is increased, the carrier mobility (electron mobility) of the oxide semiconductor can be increased. This is because in an oxide semiconductor containing indium, the element M, and zinc, the s orbital of heavy metal mainly contributes to carrier transfer, and when the indium content is increased, overlaps of the s orbitals are increased; therefore, an oxide semiconductor having a high content of indium has higher carrier mobility than an oxide semiconductor having a low content of indium.

In contrast, when the indium content and the zinc content in an oxide semiconductor become lower, carrier mobility becomes lower. Thus, with an atomic ratio of [In]:[M]:[Zn]=0:1:0 and an atomic ratio in the neighborhood thereof (e.g., a region C in FIG. 13C), insulation performance becomes better.

Accordingly, an oxide semiconductor of one embodiment of the present invention preferably has an atomic ratio which is represented by a region A in FIG. 13A and in which a layered structure with high carrier mobility and a few grain boundaries is easily obtained.

Furthermore, a region B in FIG. 13B represents [In]:[M]:[Zn]=4:2:3 to 4.1 and the neighborhood thereof. The neighborhood includes an atomic ratio of [In]:[M]:[Zn]=5:3:4, for example. An oxide semiconductor with an atomic ratio represented by the region B is an excellent oxide semiconductor that has particularly high crystallinity and high carrier mobility.

Note that conditions where an oxide semiconductor forms a layered structure are not uniquely determined by an atomic ratio. There is a difference in the degree of difficulty in forming a layered structure among atomic ratios. In contrast, even with the same atomic ratio, whether a layered structure is formed or not depends on a formation condition. Therefore, the illustrated regions each represent an atomic ratio with which an oxide semiconductor has a layered structure, and boundaries of the region A to the region C are not clear.

<2-2. Structure in which Oxide Semiconductor is Used for Transistor>

Next, a structure in which the oxide semiconductor is used for a transistor is described.

Note that when the oxide semiconductor is used for a transistor, carrier scattering or the like at a grain boundary can be reduced; thus, the transistor can have high field-effect mobility. In addition, the transistor can have high reliability.

Furthermore, an oxide semiconductor with low carrier density is preferably used for a channel region of the transistor. For example, the carrier density of an oxide semiconductor is lower than $8\times10^{11}/cm^3$, preferably lower than $1\times10^{11}/cm^3$, further preferably lower than $1\times10^{10}/cm^3$, and greater than or equal to $1\times10^{-9}/cm^3$.

Note that a highly purified intrinsic or substantially highly purified intrinsic oxide semiconductor has few carrier generation sources and thus can have a low carrier density. Furthermore, a highly purified intrinsic or substantially highly purified intrinsic oxide semiconductor has a low density of defect states and accordingly has a low density of trap states in some cases.

Furthermore, charge trapped by the trap states in the oxide semiconductor takes a long time to disappear and may behave like fixed charge. Thus, the transistor whose channel region is formed in the oxide semiconductor having a high density of trap states has unstable electrical characteristics in some cases.

Thus, in order to stabilize electrical characteristics of the transistor, a reduction in concentration of impurities in the oxide semiconductor is effective. Furthermore, in order to reduce the concentration of impurities in the oxide semiconductor, the concentration of impurities in a film adjacent thereto is preferably reduced. Examples of impurities include hydrogen, nitrogen, alkali metal, alkaline earth metal, iron, nickel, and silicon.

Here, the influence of impurities in the oxide semiconductor is described.

When silicon or carbon that is one of Group 14 elements is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration measured by secondary ion mass spectrometry (SIMS: Secondary Ion Mass Spectrometry)) is set lower than or equal to $2\times10^{18}$ atoms/cm$^3$, and preferably lower than or equal to $2\times10^{17}$ atoms/cm$^3$.

Furthermore, when the oxide semiconductor contains alkali metal or alkaline earth metal, defect states are formed and carriers are generated, in some cases. Thus, a transistor including an oxide semiconductor that contains alkali metal or alkaline earth metal is likely to have normally-on characteristics. Therefore, it is preferable to reduce the concentration of alkali metal or alkaline earth metal in the oxide semiconductor. Specifically, the concentration of alkali metal or alkaline earth metal in the oxide semiconductor measured by SIMS is set lower than or equal to $1\times10^{18}$ atoms/cm$^3$, and preferably lower than or equal to $2\times10^{16}$ atoms/cm$^3$.

Furthermore, when the oxide semiconductor contains nitrogen, it easily becomes n-type because electrons that are carriers are generated to increase the carrier density. As a result, a transistor whose semiconductor includes an oxide semiconductor that contains nitrogen is likely to have normally-on characteristics. For this reason, nitrogen in the oxide semiconductor is preferably reduced as much as possible; the nitrogen concentration in the oxide semiconductor measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Furthermore, hydrogen contained in an oxide semiconductor reacts with oxygen bonded to a metal atom to be water, and thus an oxygen vacancy is formed in some cases. Entry of hydrogen into the oxygen vacancy generates an electron that is a carrier in some cases. Furthermore, in some cases, part of hydrogen is bonded to oxygen bonded to a metal atom to generate an electron that is a carrier. Thus, a transistor including an oxide semiconductor that contains hydrogen is likely to have normally-on characteristics. Accordingly, it is preferable that hydrogen in the oxide semiconductor be reduced as much as possible. Specifically, the hydrogen concentration in the oxide semiconductor measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurity concentration is used for a channel formation region in a transistor, stable electrical characteristics can be provided.

Furthermore, the energy gap of the oxide semiconductor film is preferably 2 eV or more, 2.5 eV or more, or 3 eV or more.

Furthermore, the thickness of the oxide semiconductor film is greater than or equal to 3 nm and less than or equal to 200 nm, preferably greater than or equal to 3 nm and less than or equal to 100 nm, and further preferably greater than or equal to 3 nm and less than or equal to 60 nm.

Furthermore, when the oxide semiconductor film is an In-M-Zn oxide, as the atomic ratio of metal elements in a sputtering target used for formation of the In-M-Zn oxide, InM:Zn=1:1:0.5, In:M:Zn=1:1:1, In:M:Zn=1:1:1.2, InM:Zn=2:1:1.5, In:M:Zn=2:1:2.3, In:M:Zn=2:1:3, In:M:Zn=3:1:2, In:M:Zn=4:2:4.1, In:M:Zn=5:1:7, or the like is preferable.

Note that the atomic ratios of metal elements in the formed oxide semiconductor films may each vary from the above atomic ratio of metal elements in the sputtering target within a range of approximately plus or minus 40%. For example, when a sputtering target with an atomic ratio of In:Ga:Zn=4:2:4.1 is used, the atomic ratio of the formed oxide semiconductor film may be In:Ga:Zn=4:2:3 or the neighborhood thereof. Furthermore, in the case where a sputtering target with an atomic ratio of In:Ga:Zn=5:1:7 is used, the atomic ratio of the formed oxide semiconductor film may be In:Ga:Zn=5:1:6 or the neighborhood thereof <2-3. Stacked-Layer Structure of Oxide Semiconductor>

Next, a stacked-layer structure of an oxide semiconductor is described.

Here, as a stacked-layer structure of an oxide semiconductor, the case where the oxide semiconductor has a two-layer structure or a three-layer structure is described. A band diagram of insulators that are in contact with a stacked-layer structure of an oxide semiconductor S1, an oxide semiconductor S2, and an oxide semiconductor S3 and a band diagram of insulators that are in contact with a stacked-layer structure of the oxide semiconductor S2 and the oxide semiconductor S3 are described with reference to FIG. 15.

Figure 15A:
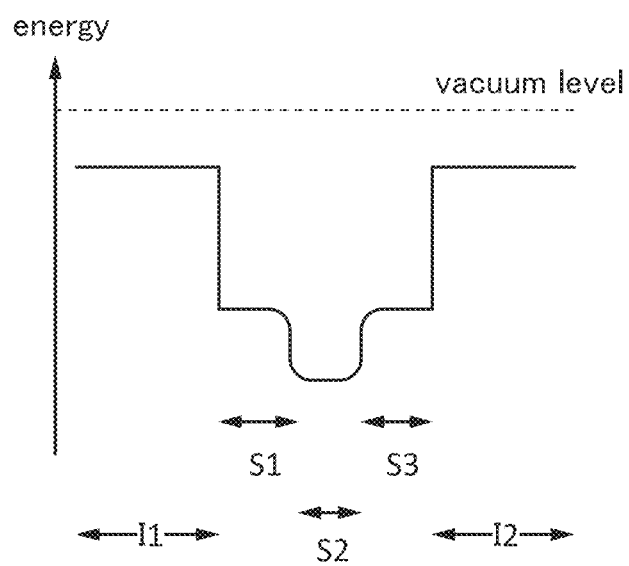
FIGS. 15A-B Band diagrams of stacked-layer structures of oxide semiconductors.
Figure 15B:
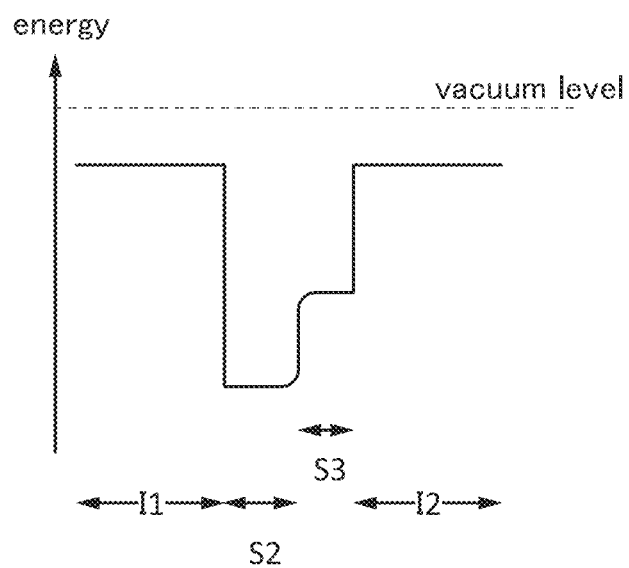

FIG. 15A is an example of a band diagram of a stacked-layer structure including an insulator I1, the oxide semiconductor S1, the oxide semiconductor S2, the oxide semiconductor S3, and an insulator I2 in a film thickness direction. Furthermore, FIG. 15B is an example of a band diagram of a stacked-layer structure including the insulator I1, the oxide semiconductor S2, the oxide semiconductor S3, and the insulator I2 in a film thickness direction. Note that for easy understanding, the band diagrams show the energy level of the conduction band minimum (Ec) of each of the insulator I1, the oxide semiconductor S1, the oxide semiconductor S2, the oxide semiconductor S3, and the insulator I2.

The energy level of the conduction band minimum of each of the oxide semiconductor S1 and the oxide semiconductor S3 is closer to the vacuum level than that of the oxide semiconductor S2; typically, a difference in energy level between the conduction band minimum of the oxide semiconductor S2 and the conduction band minimum of each of the oxide semiconductor S1 and the oxide semiconductor S3 is preferably greater than or equal to 0.15 eV or greater than or equal to 0.5 eV, and less than or equal to 2 eV or less than or equal to 1 eV. That is, it is preferable that the difference between the electron affinity of each of the oxide semiconductor S1 and the oxide semiconductor S3 and the electron affinity of the oxide semiconductor S2 be greater than or equal to 0.15 eV or greater than or equal to 0.5 eV, and less than or equal to 2 eV or less than or equal to 1 eV.

As shown in FIG. 15A and FIG. 15B, the energy level of the conduction band minimum of each of the oxide semiconductor S1, the oxide semiconductor S2, and the oxide semiconductor S3 gradually changes. In other words, the energy level of the conduction band minimum continuously changes or is continuously connected. In order to obtain such a band diagram, the density of defect states in a mixed layer formed at an interface between the oxide semiconductor S1 and the oxide semiconductor S2 or an interface between the oxide semiconductor S2 and the oxide semiconductor S3 is preferably decreased.

Specifically, when the oxide semiconductor S1 and the oxide semiconductor S2 or the oxide semiconductor S2 and the oxide semiconductor S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as each of the oxide semiconductor S1 and the oxide semiconductor S3.

At this time, the oxide semiconductor S2 becomes a main carrier path. Since the density of defect states at the interface between the oxide semiconductor S1 and the oxide semiconductor S2 and the interface between the oxide semiconductor S2 and the oxide semiconductor S3 can be decreased, the influence of interface scattering on carrier conduction is small, and high on-state current can be obtained.

When an electron is trapped in a trap state, the trapped electron behaves like fixed charge; thus, the threshold voltage of the transistor is shifted in a positive direction. By providing the oxide semiconductor S1 and the oxide semiconductor S3, the trap state can be apart from the oxide semiconductor S2. This structure can prevent the positive shift of the threshold voltage of the transistor.

A material whose conductivity is sufficiently lower than that of the oxide semiconductor S2 is used for the oxide semiconductor S1 and the oxide semiconductor S3. In that case, the oxide semiconductor S2, the interface between the oxide semiconductor S2 and the oxide semiconductor S1, and the interface between the oxide semiconductor S2 and the oxide semiconductor S3 mainly function as a channel region. For example, an oxide semiconductor with high insulation performance and the atomic ratio represented by the region C in FIG. 13C can be used as the oxide semiconductor S1 and the oxide semiconductor S3. Note that the region C in FIG. 13C represents the atomic ratio of [In]:[M]:[Zn]=0:1:0 or the neighborhood thereof.

In the case where an oxide semiconductor with the atomic ratio represented by the region A is used as the oxide semiconductor S2, it is particularly preferable to use, as each of the oxide semiconductor S1 and the oxide semiconductor S3, an oxide semiconductor with [M]/[In] of greater than or equal to 1, preferably greater than or equal to 2. In addition, it is suitable to use, as the oxide semiconductor S3, an oxide semiconductor with sufficiently high insulation performance and [M]/([Zn]+[In]) of greater than or equal to 1.

<2-4. Structure of Oxide Semiconductor>

Next, a structure of an oxide semiconductor is described.

An oxide semiconductor is classified into a single-crystal oxide semiconductor and a non-single-crystal oxide semiconductor. Examples of the non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS: amorphous-like oxide semiconductor), and an amorphous oxide semiconductor.

From another perspective, an oxide semiconductor is classified into an amorphous oxide semiconductor and a crystalline oxide semiconductor. Examples of the crystalline oxide semiconductor include a single-crystal oxide semiconductor, a CAAC-OS, a polycrystalline oxide semiconductor, and an nc-OS.

An amorphous structure is generally thought to be isotropic and have no non-uniform structure, to be metastable and have no fixed atomic arrangement, to have a flexible bond angle, and to have a short-range order but have no long-range order, for example.

That is, a stable oxide semiconductor cannot be regarded as a completely amorphous (completely amorphous) oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void (also referred to as a void). Because of its instability, an a-like OS is close to an amorphous oxide semiconductor in terms of physical properties.

[CAAC-OS]

First, a CAAC-OS is described.

A CAAC-OS is one of oxide semiconductors having a plurality of c-axis aligned crystal parts (also referred to as pellets).

Figure 16A:
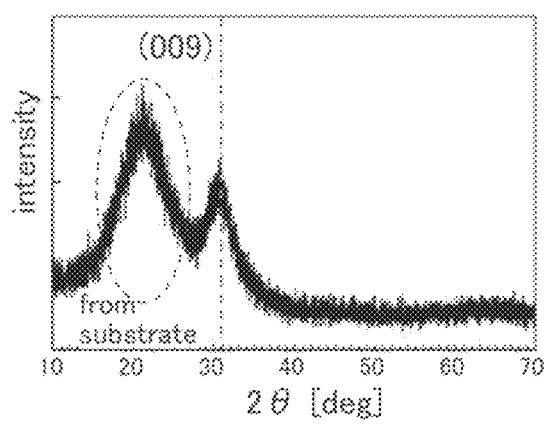
FIGS. 16A-E Diagrams illustrating structural analysis of a CAAC-OS and a single crystal oxide semiconductor by XRD, and diagrams illustrating selected-area electron diffraction patterns of a CAAC-OS.

The case where a CAAC-OS is analyzed by X-ray diffraction (XRD: X-Ray Diffraction) is described. For example, when the structure of a CAAC-OS including an InGaZnO$_4$ crystal, which is classified into the space group R-3m, is analyzed by an out-of-plane method, a peak appears at a diffraction angle (2θ) of around 31° as shown in FIG. 16A. This peak is derived from the (009) plane of the InGaZnO$_4$ crystal, which indicates that crystals in the CAAC-OS have c-axis alignment and that the c-axes are aligned in the direction substantially perpendicular to a surface over which the CAAC-OS is formed (also referred to as a formation surface) or a top surface. Note that a peak sometimes appears at 2θ of around 36° in addition to the peak at 2θ of around 31°. The peak at 2θ of around 36° is attributed to a crystal structure classified into the space group Fd-3m. Thus, it is preferred that the CAAC-OS do not show the peak.

Figure 16B:
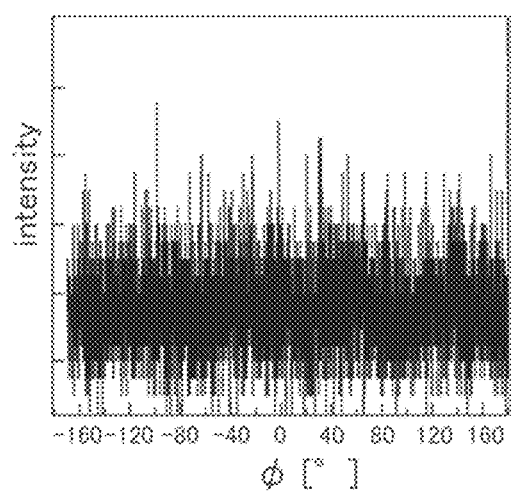
Figure 16C:
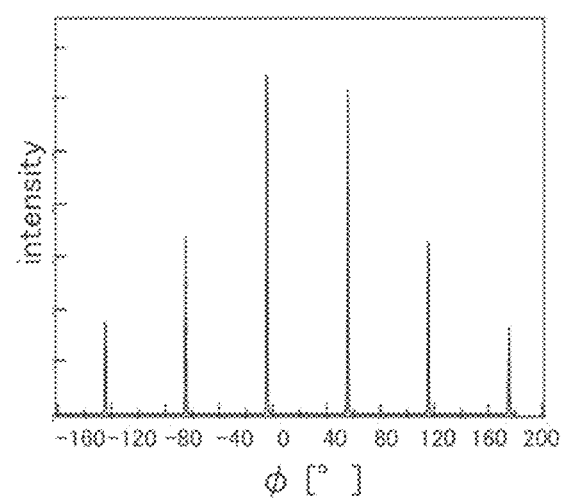
Figure 16D:
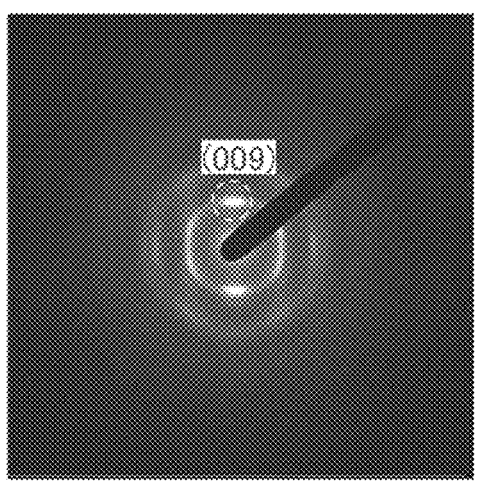

On the other hand, in structural analysis by an in-plane method in which an X-ray is incident on the CAAC-OS in the direction parallel to the formation surface, a peak appears at 2θ of around 56°. This peak is attributed to the (110) plane of the InGaZnO$_4$ crystal. Then, when analysis (φ scan) is performed with 2θ fixed at around 56° while the sample is rotated around a normal vector to the sample surface as an axis (φ axis), as shown in FIG. 16B, a peak is not clearly observed. In contrast, in the case where single-crystal InGaZnO$_4$ is subjected to φ scan with 2θ fixed at around 56°, as shown in FIG. 16C, six peaks that are derived from crystal planes equivalent to the (110) plane are observed. Accordingly, the structural analysis using XRD shows that the directions of the a-axes and b-axes are irregularly oriented in the CAAC-OS.

Figure 16E:
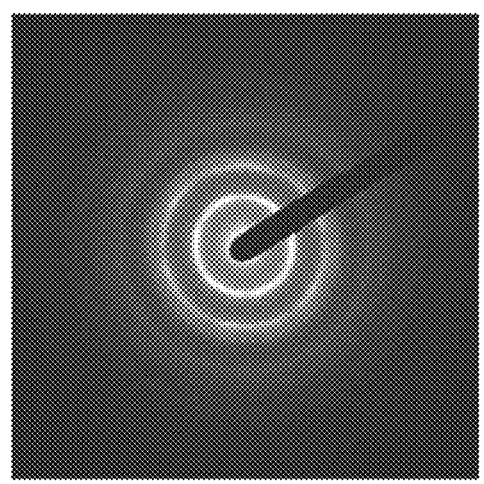

Next, a CAAC-OS analyzed by electron diffraction is described. For example, when an electron beam with a probe diameter of 300 nm is incident on a CAAC-OS including an InGaZnO$_4$ crystal in the direction parallel to the formation surface of the CAAC-OS, a diffraction pattern (also referred to as a selected-area electron diffraction pattern) shown in FIG. 16D can be obtained. This diffraction pattern includes spots derived from the (009) plane of the InGaZnO$_4$ crystal. Thus, the electron diffraction also indicates that pellets included in the CAAC-OS have c-axis alignment and that the c-axes are aligned in the direction substantially perpendicular to the formation surface or the top surface. Meanwhile, FIG. 16E shows a diffraction pattern obtained in such a manner that an electron beam with a probe diameter of 300 nm is incident on the same sample in the direction perpendicular to the sample surface. In FIG. 16E, a ring-like diffraction pattern is observed. Thus, the electron diffraction using an electron beam with a probe diameter of 300 nm also indicates that the a-axes and b-axes of the pellets included in the CAAC-OS do not have regular alignment. Note that the first ring in FIG. 16E is considered to be derived from the (010) plane, the (100) plane, and the like of the InGaZnO$_4$ crystal. Furthermore, the second ring in FIG. 16E is considered to be derived from the (110) plane and the like.

Furthermore, in a combined analysis image (also referred to as a high-resolution TEM image) of a bright-field image and a diffraction pattern of a CAAC-OS, which is obtained using a transmission electron microscope (TEM: Transmission Electron Microscope), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 17A:
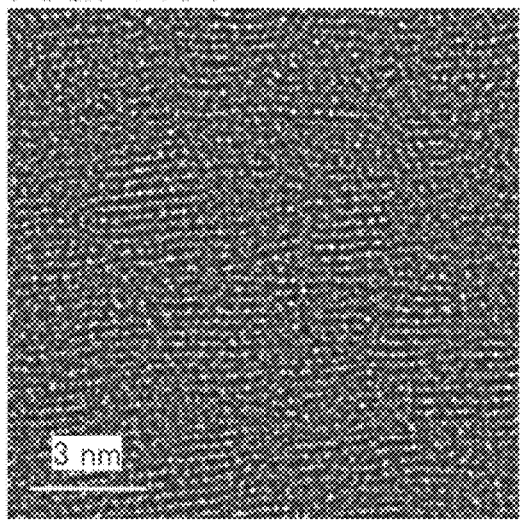
FIGS. 17A-E A cross-sectional TEM image and plan-view TEM images of a CAAC-OS and images obtained through analysis thereof.

FIG. 17A shows a high-resolution TEM image of a cross section of the CAAC-OS that is observed from the direction substantially parallel to the sample surface. The high-resolution TEM image is obtained with a spherical aberration corrector (Spherical Aberration Corrector) function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 17A shows pellets in which metal atoms are arranged in a layered manner. It is found that the size of a pellet is greater than or equal to 1 nm or greater than or equal to 3 nm. Thus, the pellet can also be referred to as a nanocrystal (nc: nanocrystal). Furthermore, the CAAC-OS can also be referred to as an oxide semiconductor including CANC (C-Axis Aligned nanocrystals). A pellet reflects unevenness of a formation surface or a top surface of the CAAC-OS and is parallel to the formation surface or the top surface of the CAAC-OS.

Figure 17B:
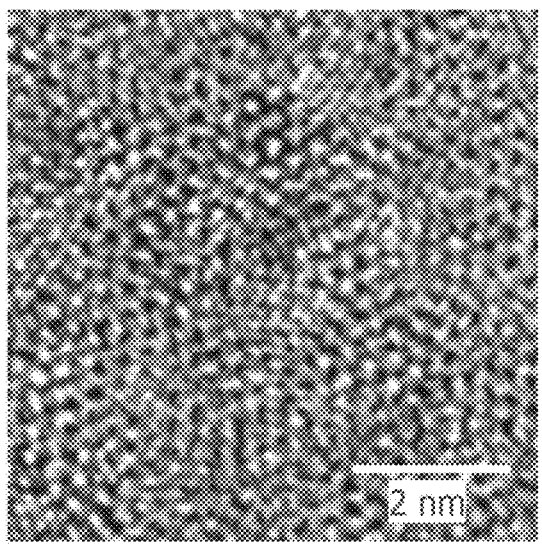
Figure 17C:
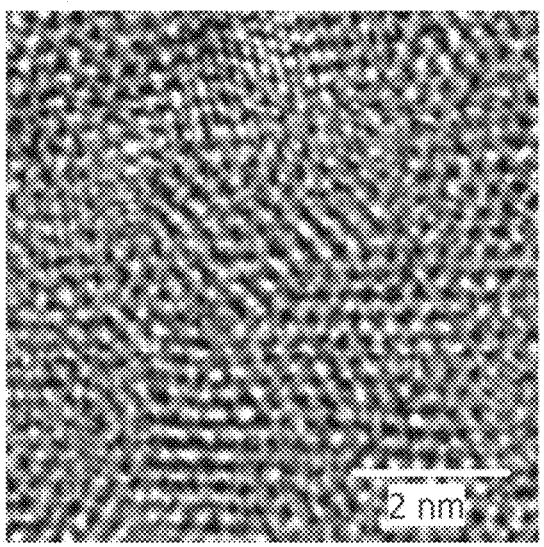
Figure 17D:
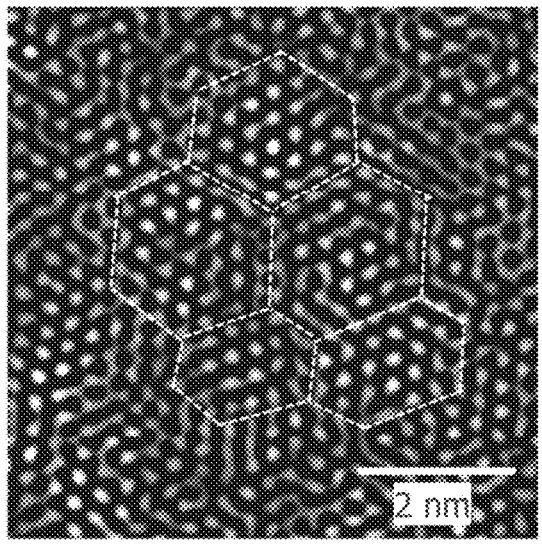
Figure 17E:
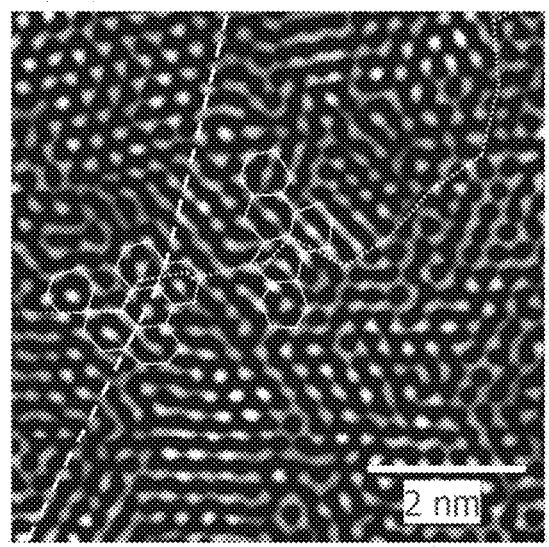

Furthermore, FIG. 17B and FIG. 17C show Cs-corrected high-resolution TEM images of a plane of the CAAC-OS observed from the direction substantially perpendicular to the sample surface. FIG. 17D and FIG. 17E are images obtained by image processing of FIG. 17B and FIG. 17C. The method of image processing is described below. First, FIG. 17B is subjected to fast Fourier transform (FFT: Fast Fourier Transform) to obtain an FFT image. Then, mask processing is performed such that a range of from 2.8 $nm^{-1}$ to 5.0 $nm^{-1}$ from the origin in the obtained FFT image remains. Next, the FFT image subjected to the mask processing is subjected to inverse fast Fourier transform (IFFT: Inverse Fast Fourier Transform) to obtain a processed image. The image obtained in this manner is referred to as an FFT filtering image. The FFT filtering image is a Cs-corrected high-resolution TEM image from which a periodic component is extracted, and shows a lattice arrangement.

In FIG. 17D, a portion where the lattice arrangement is broken is shown by dashed lines. A region surrounded by dashed lines corresponds to one pellet. The portion denoted by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 17E, a dotted line denotes a portion where the direction of a lattice arrangement changes between a region with a regular lattice arrangement and another region with a regular lattice arrangement, and a dashed line denotes the change in the direction of the lattice arrangement. A clear grain boundary cannot be observed even in the vicinity of the dotted line. When a lattice point in the vicinity of the dotted line is regarded as a center and surrounding lattice points are joined, a distorted hexagon, a distorted pentagon, and/or a distorted heptagon can be formed, for example.

That is, a lattice arrangement is distorted so that formation of a grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, a plurality of pellets (nanocrystals) are connected in the a-b plane direction, and the crystal structure has distortion. For this reason, the CAAC-OS can also be referred to as an oxide semiconductor including a CAA crystal (c-axis-aligned a-b-plane-anchored crystal).

The CAAC-OS is an oxide semiconductor with high crystallinity. Entry of impurities, formation of defects, or the like might decrease the crystallinity of an oxide semiconductor, which means that the CAAC-OS is an oxide semiconductor having few impurities and defects (e.g., oxygen vacancies).

Note that an impurity is an element other than the main components of an oxide semiconductor, such as hydrogen, carbon, silicon, or a transition metal element. For example, an element having stronger bonding force to oxygen than a metal element constituting part of an oxide semiconductor, such as silicon, extracts oxygen from the oxide semiconductor, which results in a disordered atomic arrangement and reduced crystallinity of the oxide semiconductor. Furthermore, a heavy metal such as iron or nickel, argon, carbon dioxide, or the like has a large atomic radius (or molecular radius), and thus disturbs the atomic arrangement and decreases the crystallinity of the oxide semiconductor.

In the case where an oxide semiconductor has impurities or defects, its characteristics might be changed by light, heat, or the like. For example, impurities contained in the oxide semiconductor might serve as carrier traps or carrier generation sources. For example, an oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density. Specifically, an oxide semiconductor with a carrier density of lower than $8\times10^{11}$ $cm^{-3}$, preferably lower than $1\times10^{11}$ $cm^{-3}$, further preferably lower than $1\times10^{10}$ $cm^{3}$, and higher than or equal to $1\times10^{-9}$ $cm^{3}$ can be used. Such an oxide semiconductor is referred to as a highly purified intrinsic or substantially highly purified intrinsic oxide semiconductor. A CAAC-OS has a low impurity concentration and a low density of defect states. Thus, it can be referred to as an oxide semiconductor having stable characteristics.

[nc-OS]

Next, an nc-OS is described.

The case where an nc-OS is analyzed by XRD is described. For example, when the structure of an nc-OS is analyzed by an out-of-plane method, a peak indicating orientation does not appear. That is, a crystal of an nc-OS does not have orientation.

Figure 18A:
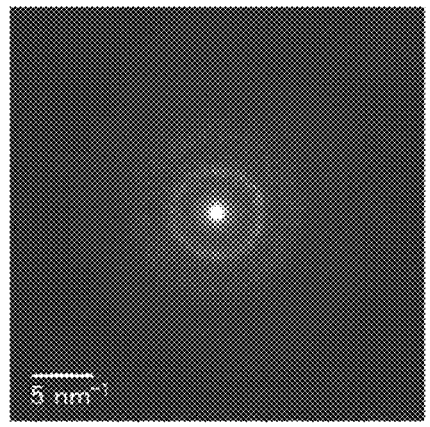
FIGS. 18A-D Diagrams illustrating electron diffraction patterns of an nc-OS and a cross-sectional TEM image of an nc-OS.
Figure 18B:
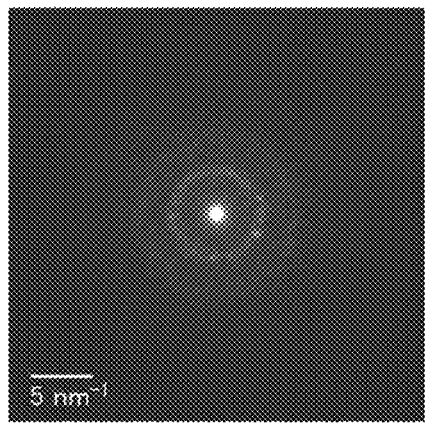

Furthermore, for example, when an electron beam with a probe diameter of 50 nm is incident on a 34-nm-thick region of a thinned nc-OS including an $InGaZnO_4$ crystal in the direction parallel to the formation surface, a ring-like diffraction pattern (nanobeam electron diffraction pattern) shown in FIG. 18A is observed. Furthermore, FIG. 18B shows a diffraction pattern (nanobeam electron diffraction pattern) obtained when an electron beam with a probe diameter of 1 nm is incident on the same sample. In FIG. 18B, a plurality of spots are observed in a ring-like region. Thus, ordering in an nc-OS is not observed with an electron beam with a probe diameter of 50 nm but ordering is observed with an electron beam with a probe diameter of 1 nm.

Figure 18C:
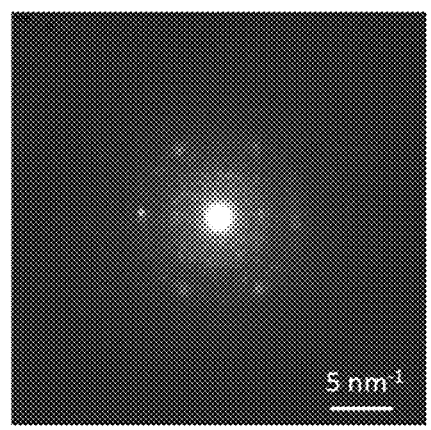

Furthermore, when an electron beam with a probe diameter of 1 nm is incident on a region with a thickness less than 10 nm, an electron diffraction pattern in which spots are arranged in an approximately regular hexagonal shape as shown in FIG. 18C is observed in some cases. This means that an nc-OS has a well-ordered region, that is, a crystal, in the thickness range of less than 10 nm. Note that an electron diffraction pattern having regularity is not observed in some regions because crystals are aligned in various directions.

Figure 18D:
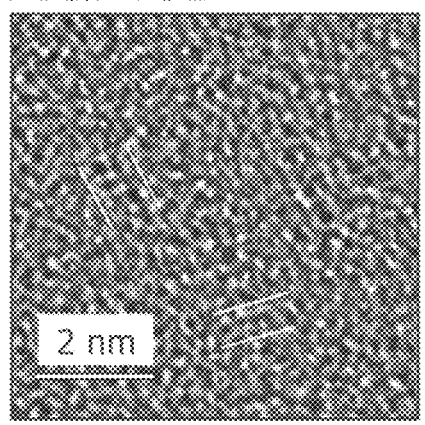

FIG. 18D shows a Cs-corrected high-resolution TEM image of a cross section of an nc-OS observed from the direction substantially parallel to the formation surface. In the high-resolution TEM image, the nc-OS includes a region where a crystal part is observed, such as the part indicated by additional lines, and a region where a crystal part is not clearly observed. In most cases, the size of a crystal part included in the nc-OS is greater than or equal to 1 nm and less than or equal to 10 nm, in particular, greater than or equal to 1 nm and less than or equal to 3 nm. Note that an oxide semiconductor including a crystal part whose size is greater than 10 nm and less than or equal to 100 nm may be referred to as a microcrystalline oxide semiconductor (micro crystalline oxide semiconductor). In a high-resolution TEM image of the nc-OS, for example, a grain boundary is not clearly observed in some cases. Note that there is a possibility that the origin of the nanocrystal is the same as that of a pellet in a CAAC-OS. Thus, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different pellets in the nc-OS. Thus, the orientation of the whole film is not observed. Accordingly, in some cases, the nc-OS cannot be distinguished from an a-like OS or an amorphous oxide semiconductor, depending on an analysis method.

Note that since there is no regularity of crystal orientation between the pellets (nanocrystals), the nc-OS can also be referred to as an oxide semiconductor including RANC (Random Aligned nanocrystals) or an oxide semiconductor including NANC (Non-Aligned nanocrystals).

The nc-OS is an oxide semiconductor that has higher regularity than an amorphous oxide semiconductor. Thus, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS.

[a-Like OS]

An a-like OS has a structure between that of an nc-OS and that of an amorphous oxide semiconductor.

Figure 19A:
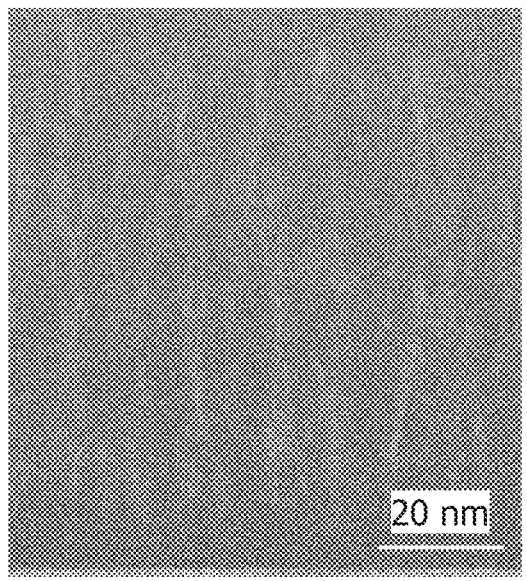
FIGS. 19A-B Cross-sectional TEM images of an a-like OS.
Figure 19B:
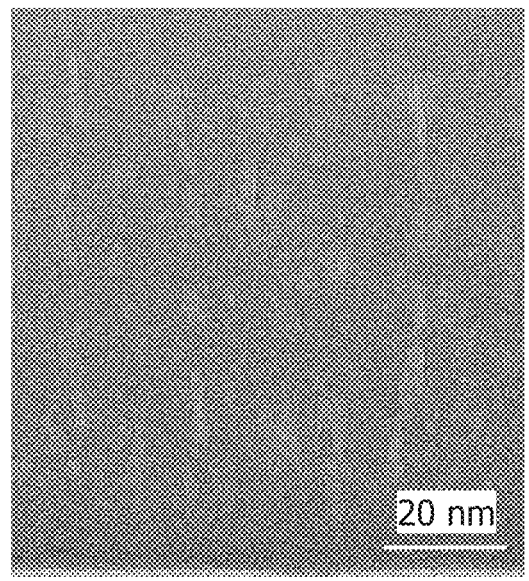

FIG. 19 shows high-resolution cross-sectional TEM images of an a-like OS. Note that FIG. 19A is the high-resolution cross-sectional TEM image of the a-like OS that is taken at the start of the electron irradiation. FIG. 19B is the high-resolution cross-sectional TEM image of the a-like OS that is taken after the irradiation with electrons ($e^-$) at $4.3 \times 10^8$ $e^-/nm^2$. FIG. 19A and FIG. 19B show that striped bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value), and the value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Note that each of the lattice fringes corresponds to the a-b plane of the $InGaZnO_4$ crystal.

Figure 20:
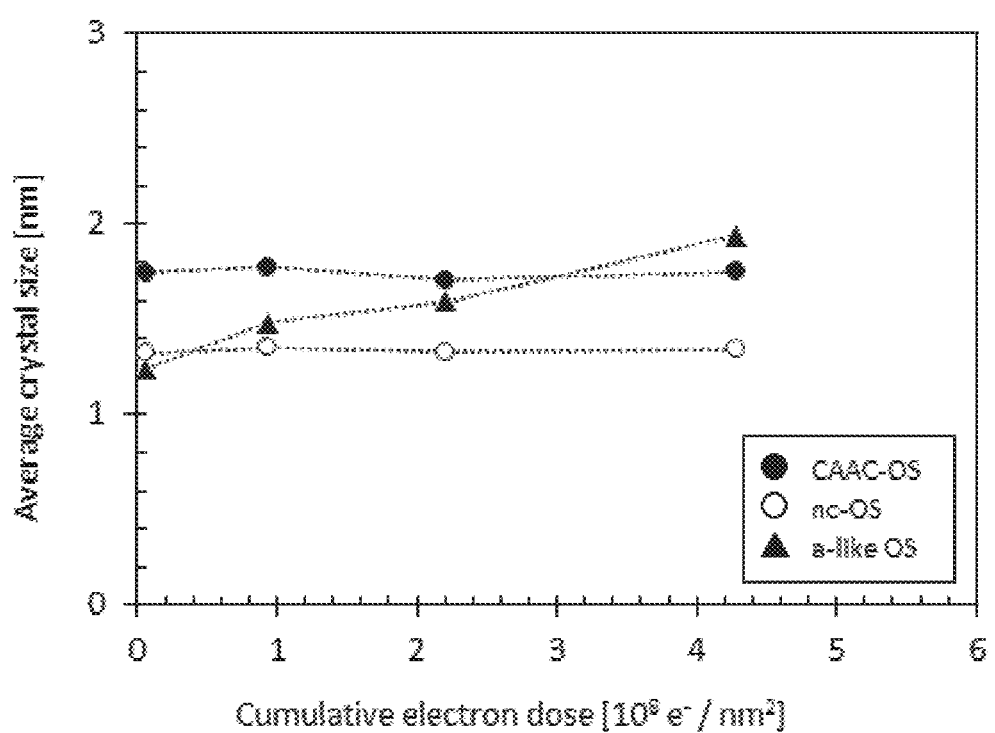
FIG. 20 A diagram illustrating a change in crystal part of an In—Ga—Zn oxide induced by electron irradiation.

FIG. 20 shows the average size of crystal parts (at 22 points to 30 points) in each sample. Note that the crystal part size corresponds to the length of the lattice fringe. FIG. 20 indicates that the crystal part size in the a-like OS increases with an increase in the cumulative electron dose in obtaining TEM images, for example. As shown in FIG. 20, a crystal part with a size of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part sizes in the nc-OS and the CAAC-OS show few changes from the start of electron irradiation to a cumulative electron dose of $4.2 \times 10^8$ $e^-/nm^2$. As shown in FIG. 20, the crystal part sizes in the nc-OS and the CAAC-OS are approximately 1.3 nm and approximately 1.8 nm, respectively, regardless of the cumulative electron dose. Note that for the electron beam irradiation and TEM observation, a Hitachi H-9000NAR transmission electron microscope was used. The conditions of the electron beam irradiation were as follows: the accelerating voltage was 300 kV; the current density was $6.7 \times 10^5$ $e^-/(nm^2 \cdot s)$; and the diameter of an irradiation region was 230 nm.

In this manner, growth of the crystal part in the a-like OS may be induced by electron irradiation. In contrast, in the nc-OS and the CAAC-OS, growth of the crystal part is hardly induced by electron irradiation. That is, the a-like OS has an unstable structure as compared with the nc-OS and the CAAC-OS.

Furthermore, the a-like OS has a lower density than the nc-OS and the CAAC-OS because it contains a void. Specifically, the density of the a-like OS is higher than or equal to 78.6% and lower than 92.3% of the density of the single-crystal oxide semiconductor having the same composition. Furthermore, the density of the nc-OS and the density of the CAAC-OS are each higher than or equal to 92.3% and lower than 100% of the density of the single-crystal oxide semiconductor having the same composition. It is difficult to deposit an oxide semiconductor having a density lower than 78% of the density of the single-crystal oxide semiconductor.

For example, in an oxide semiconductor in which In:Ga:Zn is 1:1:1 [atomic ratio], the density of single-crystal $InGaZnO_4$ with a rhombohedral crystal structure is 6.357 g/cm³. Accordingly, in the oxide semiconductor in which In:Ga:Zn is 1:1:1 [atomic ratio], the density of the a-like OS is higher than or equal to 5.0 g/cm³ and lower than 5.9 g/cm³, for example. Furthermore, in the oxide semiconductor in which In:Ga:Zn is 1:1:1 [atomic ratio], the density of the nc-OS and that of the CAAC-OS are each higher than or equal to 5.9 g/cm³ and lower than 6.3 g/cm³, for example.

Note that in the case where single crystals with the same composition do not exist, single crystals with different compositions are combined at an adequate ratio, whereby a density corresponding to that of a single crystal with the desired composition can be estimated. The density corresponding to that of the single crystal with the desired composition is estimated using a weighted average with respect to the combination ratio of the single crystals with different compositions. Note that it is preferable to combine as few kinds of single crystals as possible to estimate the density.

As described above, oxide semiconductors have various structures and various properties. Note that an oxide semiconductor may be a stacked film including two or more of an amorphous oxide semiconductor, an a-like OS, an nc-OS, and a CAAC-OS, for example.

Note that the structure described in this embodiment can be used in appropriate combination with any of the structures described in the other embodiments or examples.

Embodiment 3

In this embodiment, an example of a display device that includes the transistor described in the above embodiments is described below with reference to FIG. 21 to FIG. 27.

Figure 21:
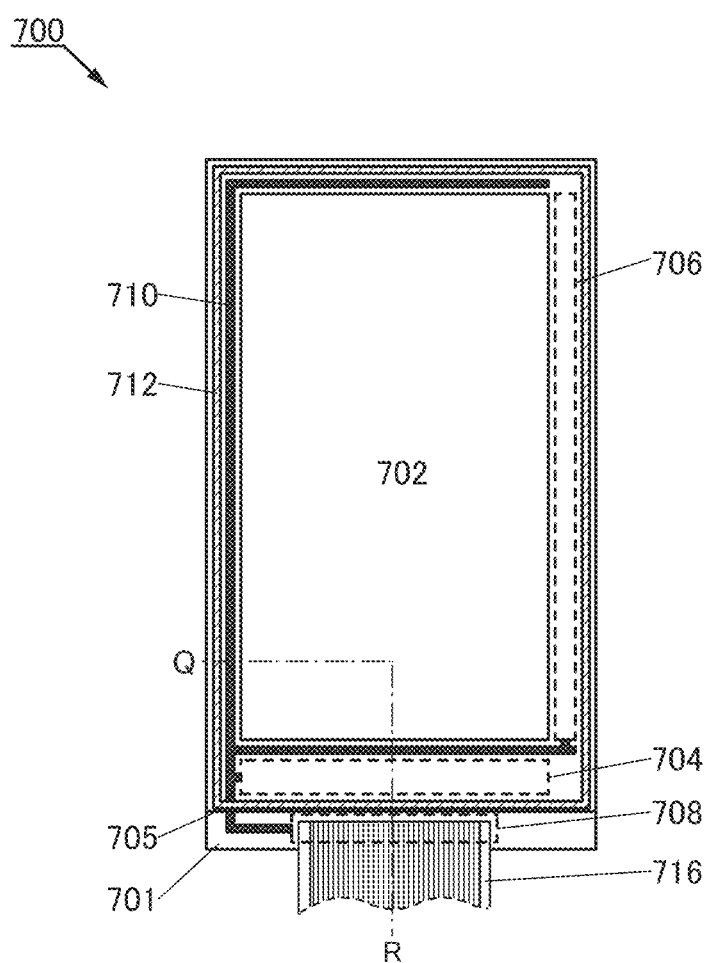
FIG. 21 A top view illustrating one embodiment of a display device.

FIG. 21 is a top view of an example of a display device. A display device 700 in FIG. 21 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. Note that the first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Note that although not illustrated in FIG. 21, a display element is provided between the first substrate 701 and the second substrate 705.

Furthermore, in the display device 700, an FPC terminal portion 708 (FPC: Flexible printed circuit) that is electrically connected to the pixel portion 702, the source driver circuit portion 704, the gate driver circuit portion 706, and the gate driver circuit portion 706 is provided in a region different from the region that is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

Furthermore, a plurality of gate driver circuit portions 706 may be provided in the display device 700. Furthermore, an example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single-crystal semiconductor film or a polycrystalline semiconductor film) may be formed on the first substrate 701. Note that there is no particular limitation on the method for connecting the separately formed driver circuit board, and a COG (Chip On Glass) method, a wire bonding method, or the like can be used.

Furthermore, the pixel portion 702, the source driver circuit portion 704, and the gate driver circuit portion 706 included in the display device 700 include a plurality of transistors, and any of the transistors that are semiconductor devices of embodiments of the present invention can be used.

Furthermore, the display device 700 can include a variety of elements. Examples of the elements include electroluminescent (EL) element (e.g., an EL element containing an organic material and an inorganic material, an organic EL element, an inorganic EL element, or an LED), a light-emitting transistor element (a transistor that emits light depending on current), an electron emitter, a liquid crystal element, an electronic ink element, an electrophoretic element, an electrowetting element, a plasma display panel (PDP), an MEMS (micro electro mechanical systems) display (e.g., a grating light valve (GLV), a digital micromirror device (DMD), a digital micro shutter (DMS) element, or an interferometric modulation (IMOD) element), and a piezoelectric ceramic display.

Furthermore, an example of a display device including an EL element is an EL display. Examples of a display device including an electron emitter include a field emission display (FED) and an SED-type flat panel display (SED: Surface-conduction Electron-emitter Display). Examples of a display device including a liquid crystal element include a liquid crystal display (a transmissive liquid crystal display, a transflective liquid crystal display, a reflective liquid crystal display, a direct-view liquid crystal display, or a projection liquid crystal display). Examples of a display device including an electronic ink element or an electrophoretic element include electronic paper. Note that in the case where a transflective liquid crystal display or a reflective liquid crystal display is obtained, some or all of pixel electrodes function as reflective electrodes. For example, some or all of pixel electrodes contain aluminum, silver, or the like. Furthermore, in this case, a memory circuit such as an SRAM can be provided under the reflective electrodes. Thus, the power consumption can be further reduced.

Note that as a display system of the display device 700, a progressive system, an interlace system, or the like can be employed. Furthermore, color elements controlled in pixels at the time of color display are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout, and the two colors may differ between color elements. Alternatively, one or more colors of yellow, cyan, magenta, and the like may be added to RGB. Note that the size of a display region may differ between dots of color elements. Note that the disclosed invention is not limited to a color display device and can also be used for a monochrome display device.

Furthermore, a coloring layer (also referred to as a color filter) may be used to obtain a full-color display device in which white light (W) is used for a backlight (e.g., an organic EL element, an inorganic EL element, an LED, or a fluorescent lamp). For the coloring layer, for example, red (R), green (G), blue (B), yellow (Y), and the like can be used in appropriate combination. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without the coloring layer, a decrease in the luminance of a bright image due to the coloring layer can be inhibited, and approximately 20% to 30% of power consumption can be reduced in some cases. Note that in the case where full-color display is performed using a self-luminous element such as an organic EL element or an inorganic EL element, elements may emit light of their respective colors R, G, B, Y, and W. By using a self-luminous element, power consumption may be further reduced as compared with the case of using a coloring layer.

Furthermore, as a coloring system, any of the following systems may be used: the above-described system (color filter system) in which part of white light is converted into red light, green light, and blue light through color filters; a system (three-color system) in which red light, green light, and blue light are used; and a system (color conversion system or quantum dot system) in which part of blue light is converted into red or green.

Figure 22:
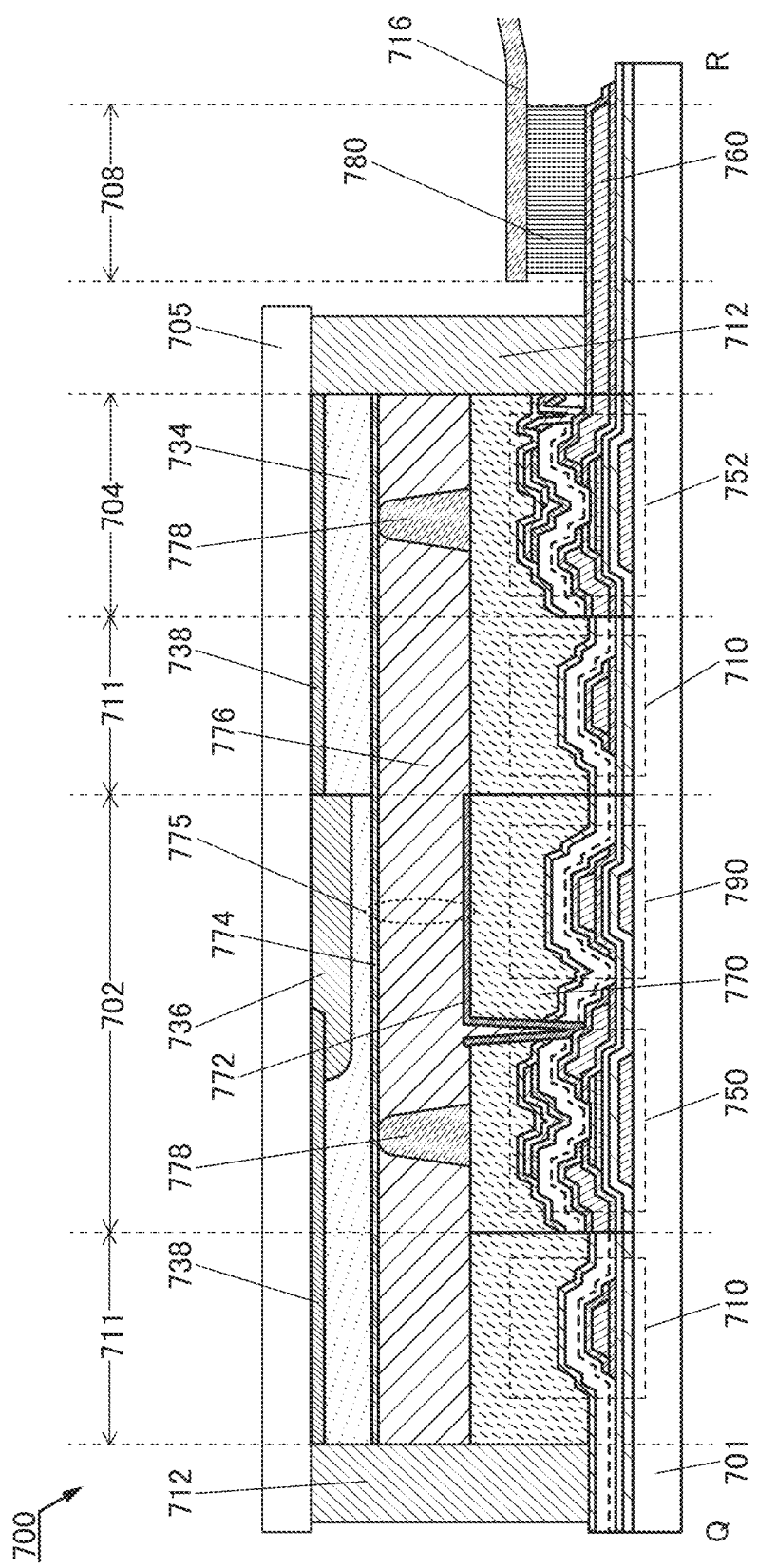
FIG. 22 A cross-sectional view illustrating one embodiment of a display device.

In this embodiment, structures including a liquid crystal element and an EL element as display elements are described with reference to FIG. 22 and FIG. 24. Note that FIG. 22 is a cross-sectional view taken along the dashed-dotted line Q-R in FIG. 21 and illustrates the structure including a liquid crystal element as a display element. Furthermore, FIG. 24 is a cross-sectional view taken along the dashed-dotted line Q-R in FIG. 21 and illustrates the structure including an EL element as a display element.

Figure 24:
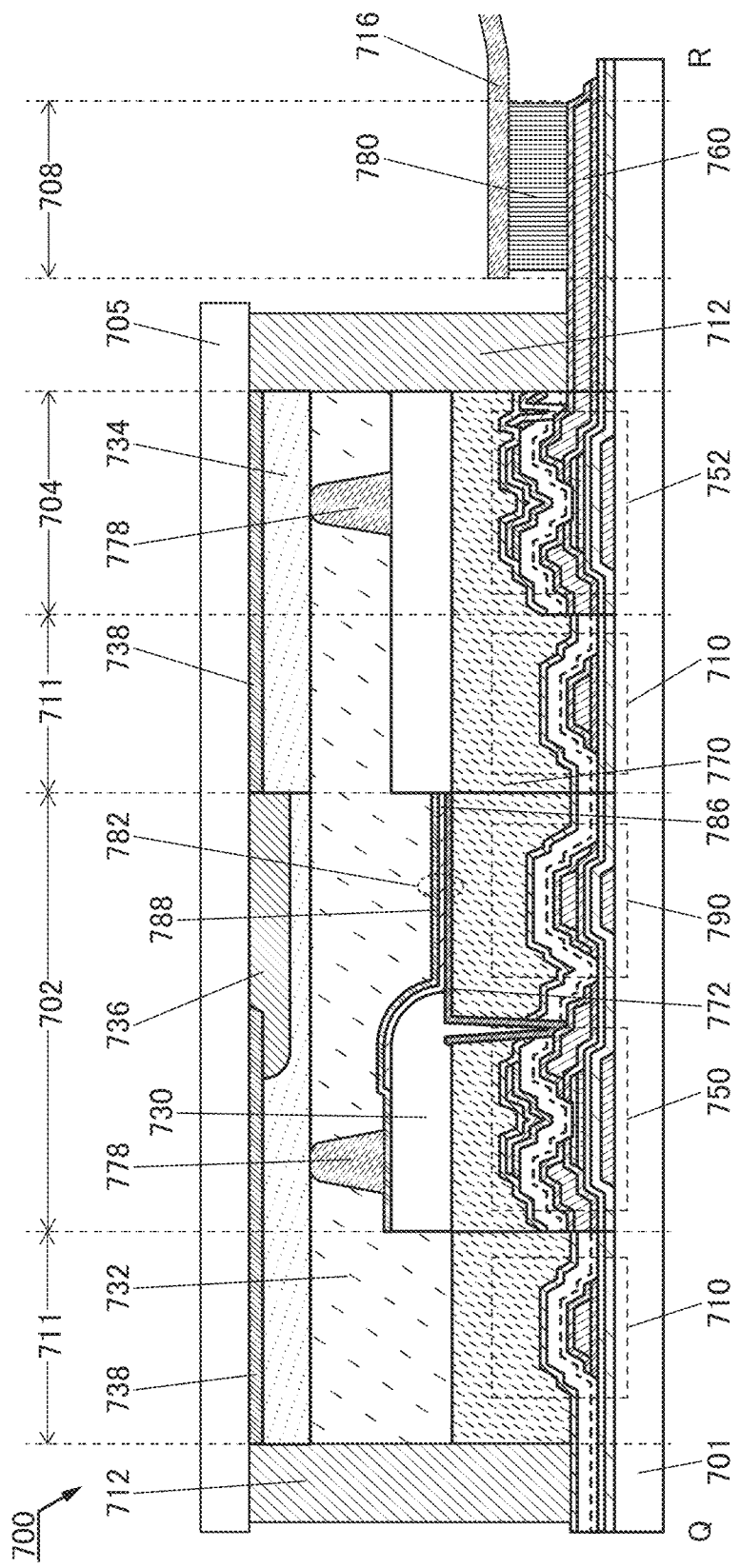
FIG. 24 A cross-sectional view illustrating one embodiment of a display device.

Common portions between FIG. 22 and FIG. 24 are described first, and then, different portions are described.

<3-1. Description of Common Portions in Display Devices>

The display device 700 in FIG. 22 and FIG. 24 includes a lead wiring portion 711, the pixel portion 702, the source driver circuit portion 704, and the FPC terminal portion 708. Furthermore, the lead wiring portion 711 includes the signal line 710. Furthermore, the pixel portion 702 includes a transistor 750 and a capacitor 790. Furthermore, the source driver circuit portion 704 includes a transistor 752.

The transistor 750 and the transistor 752 each have a structure similar to that of the transistor 100 described above. Note that the transistor 750 and the transistor 752 may each have the structure of any of the other transistors described in the above embodiments.

The transistor used in this embodiment includes an oxide semiconductor film that is highly purified and in which formation of an oxygen vacancy is suppressed. The transistor can have low off-state current. Accordingly, an electrical signal such as an image signal can be held for a long time, and a long writing interval can be set in an on state. Accordingly, the frequency of refresh operation can be reduced, which suppresses power consumption.

In addition, the transistor used in this embodiment can have relatively high field-effect mobility and thus is capable of high-speed operation. For example, when such a transistor capable of high-speed operation is used in a liquid crystal display device, a switching transistor in a pixel portion and a driver transistor in a driver circuit portion can be formed over one substrate. That is, no additional semiconductor device formed using a silicon wafer or the like is needed as a driver circuit; therefore, the number of components of the semiconductor device can be reduced. In addition, by using the transistor capable of high-speed operation in the pixel portion, a high-quality image can be provided.

The capacitor 790 includes a lower electrode formed through a step of processing the same conductive film as a conductive film functioning as a first gate electrode of the transistor 750 and an upper electrode formed through a step of processing the same conductive film as a conductive film functioning as a source electrode and a drain electrode of the transistor 750. Furthermore, between the lower electrode and the upper electrode, an insulating film formed through a step of forming the same insulating film as an insulating film functioning as a first gate insulating film of the transistor 750 is provided. That is, the capacitor 790 has a stacked-layer structure in which an insulating film functioning as a dielectric film is positioned between the pair of electrodes.

Furthermore, in FIG. 22 and FIG. 24, a planarization insulating film 770 is provided over the transistor 750, the transistor 752, and the capacitor 790.

For the planarization insulating film 770, a heat-resistant organic material such as a polyimide resin, an acrylic resin, a polyimide amide resin, a benzocyclobutene resin, a polyamide resin, or an epoxy resin can be used. Note that the planarization insulating film 770 may be formed by stacking a plurality of insulating films formed using any of these materials. Furthermore, a structure without the planarization insulating film 770 may be employed.

Furthermore, although FIG. 22 and FIG. 24 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a staggered transistor is used in the pixel portion 702 and the inverted staggered transistor described in Embodiment 1 is used in the source driver circuit portion 704, or a structure in which the inverted staggered transistor described in Embodiment 1 is used in the pixel portion 702 and a staggered transistor is used in the source driver circuit portion 704 may be employed. Note that the source driver circuit portion 704 can be replaced by a gate driver circuit portion.

Furthermore, the signal line 710 is formed through the same process as the conductive films functioning as source electrodes and drain electrodes of the transistors 750 and 752. In the case where the signal line 710 is formed using a material containing a copper element, for example, signal delay or the like due to wiring resistance is reduced, which enables display on a large screen.

Furthermore, the FPC terminal portion 708 includes a connection electrode 760, an anisotropic conductive film 780, and the FPC 716. Note that the connection electrode 760 is formed through the same process as the conductive films functioning as the source electrodes and the drain electrodes of the transistors 750 and 752. Furthermore, the connection electrode 760 is electrically connected to a terminal included in the FPC 716 through the anisotropic conductive film 780.

Furthermore, for example, a glass substrate can be used as each of the first substrate 701 and the second substrate 705. Furthermore, as each of the first substrate 701 and the second substrate 705, a flexible substrate may be used. Examples of the flexible substrate include a plastic substrate.

Furthermore, a structure body 778 is provided between the first substrate 701 and the second substrate 705. The structure body 778 is a columnar spacer obtained by selective etching of an insulating film and is provided to control the distance (cell gap) between the first substrate 701 and the second substrate 705. Note that a spherical spacer may also be used as the structure body 778.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

<3-2. Structure Example of Display Device Including Liquid Crystal Element>

The display device 700 in FIG. 22 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 22 can display an image in such a manner that transmission or non-transmission of light is controlled by the alignment state in the liquid crystal layer 776 that is changed depending on the voltage applied to the conductive film 772 and the conductive film 774.

Furthermore, the conductive film 772 is electrically connected to the conductive film functioning as the source electrode and the drain electrode of the transistor 750. The conductive film 772 is formed over the planarization insulating film 770 and functions as a pixel electrode, that is, one electrode of the display element. Furthermore, the conductive film 772 functions as a reflective electrode. The display device 700 in FIG. 22 is what is called a reflective color liquid crystal display device that performs display by utilizing external light that is reflected by the conductive film 772 and then extracted through the coloring film 736.

A conductive film that transmits visible light or a conductive film that reflects visible light can be used as the conductive film 772. For example, a material containing an element selected from indium (In), zinc (Zn), and tin (Sn) is preferably used for the conductive film that transmits visible light. For example, a material containing aluminum or silver is preferably used for the conductive film that reflects visible light. In this embodiment, a conductive film that reflects visible light is used as the conductive film 772.

Figure 23:
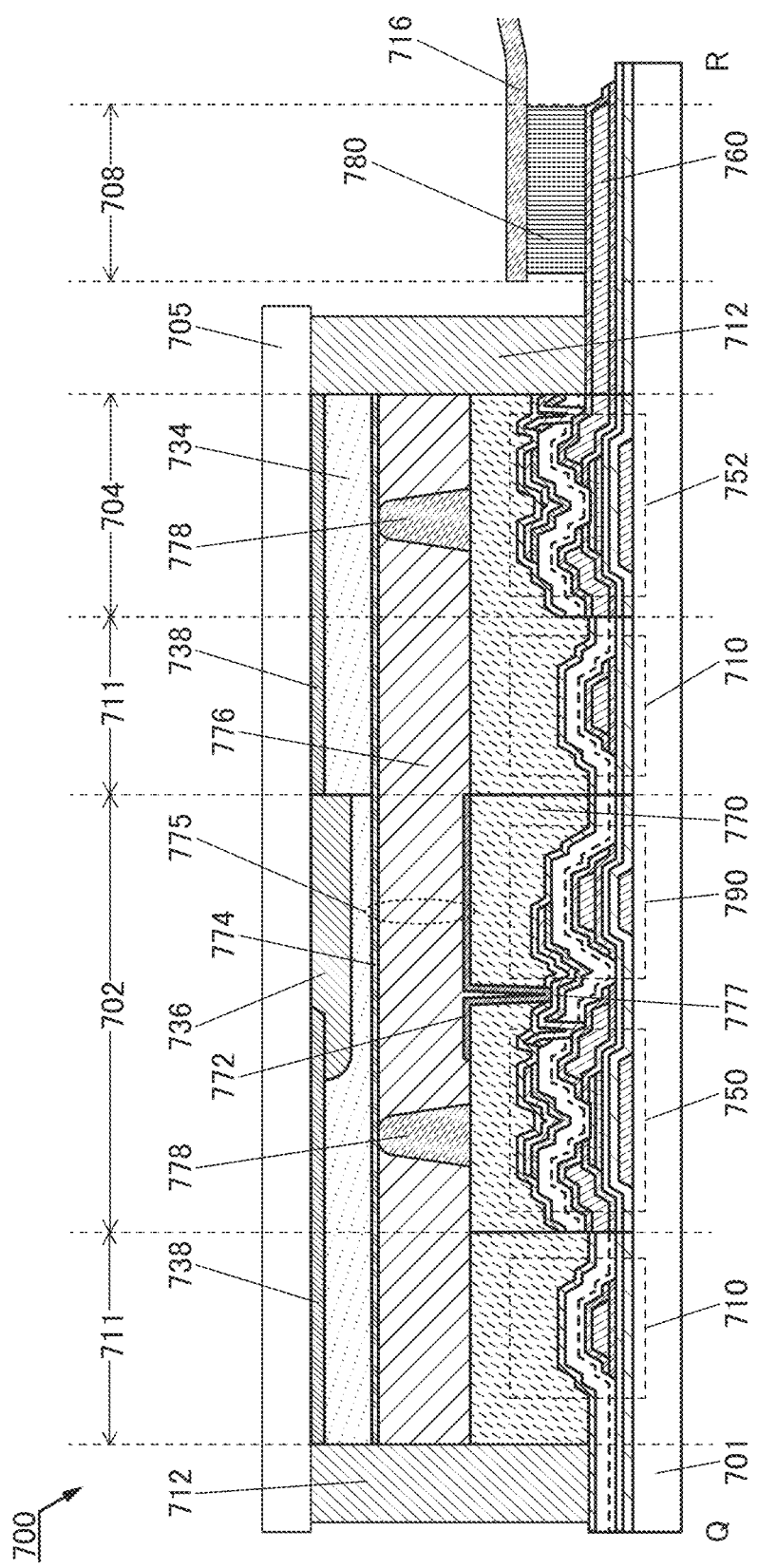
FIG. 23 A cross-sectional view illustrating one embodiment of a display device.

Note that although FIG. 22 illustrates an example in which the conductive film 772 is connected to the conductive film functioning as the drain electrode of the transistor 750, one embodiment of the present invention is not limited thereto. For example, as illustrated in FIG. 23, a structure in which the conductive film 772 is electrically connected to the conductive film functioning as the drain electrode of the transistor 750 through a conductive film 777 functioning as a connection electrode may be employed. Note that the conductive film 777 is formed through a step of processing the same conductive film as a conductive film functioning as a second gate electrode of the transistor 750 and thus can be formed without an increase in the number of manufacturing steps.

Furthermore, the display device 700 in FIG. 22 is a reflective color liquid crystal display device but is not limited thereto; for example, a transmissive color liquid crystal display device in which the conductive film 772 is a conductive film that transmits visible light may be used. Alternatively, what is called a transflective color liquid crystal display device in which a reflective color liquid crystal display device and a transmissive color liquid crystal display device are combined may be used.

Figure 25:
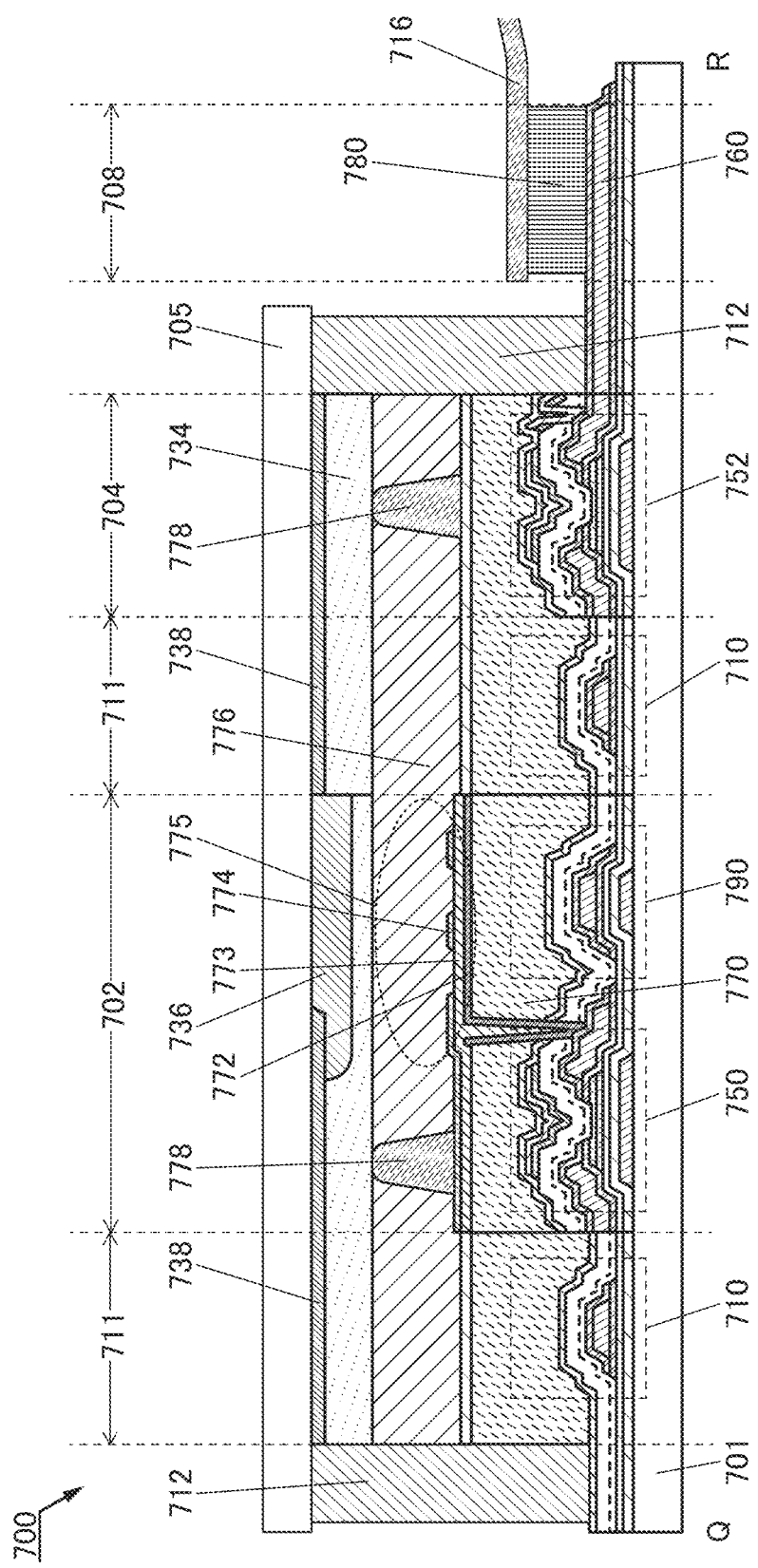
FIG. 25 A cross-sectional view illustrating one embodiment of a display device.

Here, FIG. 25 illustrates an example of a transmissive color liquid crystal display device. FIG. 25 is a cross-sectional view taken along the dashed-dotted line Q-R in FIG. 21 and illustrates a structure in which a liquid crystal element is used as the display element. Furthermore, the display device 700 illustrated in FIG. 25 is an example of a structure in which a horizontal electric field mode (e.g., an FFS mode) is used as a driving mode of the liquid crystal element. In the case of the structure illustrated in FIG. 25, an insulating film 773 is provided over the conductive film 772 functioning as a pixel electrode, and the conductive film 774 is provided over the insulating film 773. In such a case, the conductive film 774 functions as a common electrode (also referred to as a common electrode), and an electric field generated between the conductive film 772 and the conductive film 774 through the insulating film 773 can control the alignment state in the liquid crystal layer 776.

Furthermore, although not illustrated in FIG. 22 and FIG. 25, one or both of the conductive film 772 and the conductive film 774 may be provided with an alignment film on a side in contact with the liquid crystal layer 776. Furthermore, although not illustrated in FIG. 22 and FIG. 25, an optical member (optical substrate) or the like, such as a polarizing member, a retardation member, or an anti-reflection member, may be provided as appropriate. For example, circular polarization may be obtained by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

Furthermore, in the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase when the temperature of a cholesteric liquid crystal is increased. Since the blue phase appears only in a narrow temperature range, a liquid crystal composition in which a chiral material is mixed to account for several weight % or more is used for the liquid crystal layer in order to improve the temperature range. The liquid crystal composition containing a liquid crystal exhibiting a blue phase and a chiral material has a short response time and optical isotropy, which makes the alignment process unneeded. Furthermore, an alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material that exhibits a blue phase has small viewing angle dependence.

Furthermore, in the case where a liquid crystal element is used as the display element, a TN (Twisted Nematic) mode, an IPS (In-Plane-Switching) mode, an FFS (Fringe Field Switching) mode, an ASM (Axially Symmetric aligned Micro-cell) mode, an OCB (Optical Compensated Birefringence) mode, an FLC (Ferroelectric Liquid Crystal) mode, an AFLC (AntiFerroelectric Liquid Crystal) mode, or the like can be used.

Furthermore, a normally black liquid crystal display device such as a transmissive liquid crystal display device employing a vertical alignment (VA) mode may be used. There are some examples of a vertical alignment mode; for example, an MVA (Multi-Domain Vertical Alignment) mode, a PVA (Patterned Vertical Alignment) mode, or an ASV mode can be employed.

<3-3. Display Device Including Light-Emitting Element>

The display device 700 illustrated in FIG. 24 includes a light-emitting element 782. The light-emitting element 782 includes the conductive film 772, an EL layer 786, and a conductive film 788. The display device 700 illustrated in FIG. 24 can display an image when the EL layer 786 of the light-emitting element 782 emits light. Note that the EL layer 786 contains an organic compound or an inorganic compound such as a quantum dot.

Examples of materials that can be used for an organic compound include a fluorescent material and a phosphorescent material. Furthermore, examples of materials that can be used for a quantum dot include a colloidal quantum dot material, an alloyed quantum dot material, a core-shell quantum dot material, and a core quantum dot material. Furthermore, a material containing elements belonging to Group 12 and Group 16, elements belonging to Group 13 and Group 15, or elements belonging to Group 14 and Group 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

Furthermore, in the display device 700 in FIG. 24, an insulating film 730 is provided over the planarization insulating film 770 and the conductive film 772. The insulating film 730 covers part of the conductive film 772. Note that the light-emitting element 782 has a top-emission structure. Thus, the conductive film 788 has a light-transmitting property and transmits light emitted from the EL layer 786. Note that although the top-emission structure is described as an example in this embodiment, the structure is not limited thereto. For example, a bottom-emission structure in which light is emitted to the conductive film 772 side or a dual-emission structure in which light is emitted to both the conductive film 772 side and the conductive film 788 side may also be employed.

Furthermore, the coloring film 736 is provided to overlap with the light-emitting element 782, and the light-blocking film 738 is provided in the lead wiring portion 711 and the source driver circuit portion 704 to overlap with the insulating film 730. Furthermore, the coloring film 736 and the light-blocking film 738 are covered with the insulating film 734. Furthermore, a space between the light-emitting element 782 and the insulating film 734 is filled with a sealing film 732. Note that the structure of the display device 700 is not limited to the example in FIG. 24, in which the coloring film 736 is provided. For example, a structure without the coloring film 736 may be employed in the case where the EL layer 786 is formed by separate coloring.

<3-4. Structure Example of Display Device Provided with Input/Output Device>

Furthermore, an input/output device may be provided in the display device 700 illustrated in FIG. 24 and FIG. 25. Examples of the input/output device include a touch panel.

Figure 26:
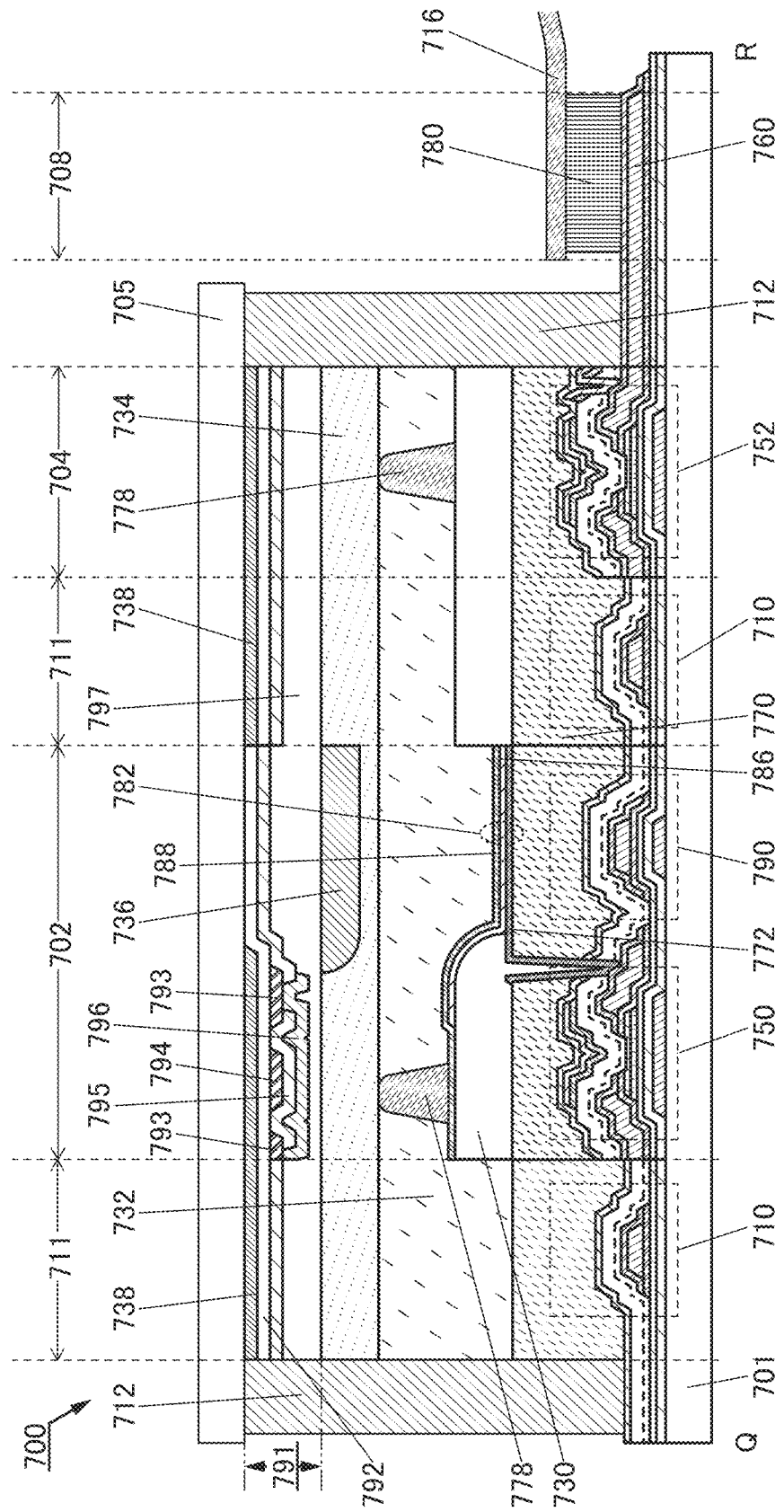
FIG. 26 A cross-sectional view illustrating one embodiment of a display device.
Figure 27:
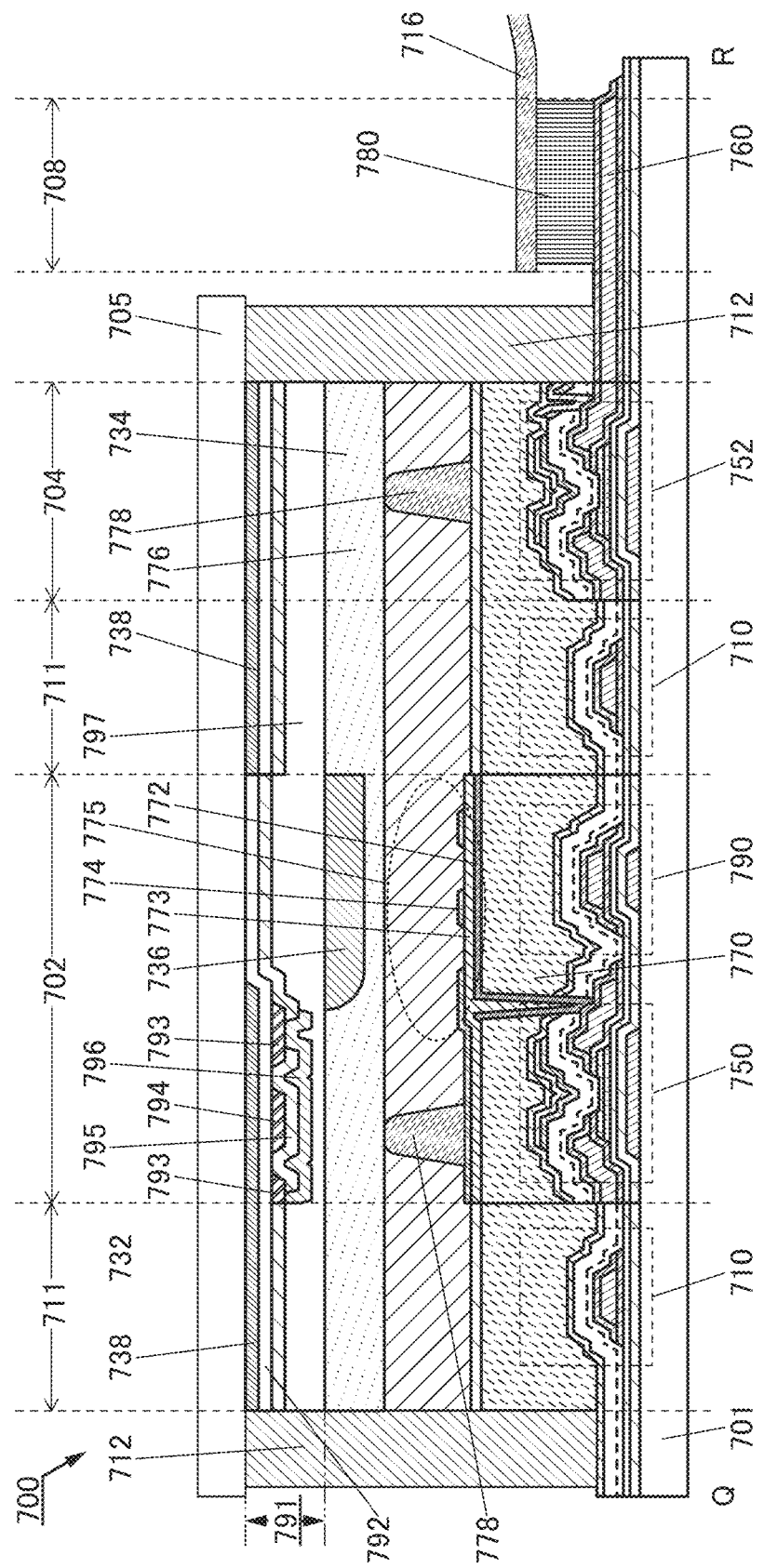
FIG. 27 A cross-sectional view illustrating one embodiment of a display device.

FIG. 26 and FIG. 27 illustrate structures in which the display device 700 in FIG. 24 and FIG. 25 includes a touch panel 791.

FIG. 26 is a cross-sectional view of the structure in which the touch panel 791 is provided in the display device 700 illustrated in FIG. 24, and FIG. 27 is a cross-sectional view of the structure in which the touch panel 791 is provided in the display device 700 illustrated in FIG. 25.

First, the touch panel 791 illustrated in FIG. 26 and FIG. 27 is described below.

The touch panel 791 illustrated in FIG. 26 and FIG. 27 is what is called an in-cell touch panel provided between the substrate 705 and the coloring film 736. The touch panel 791 is formed on the substrate 705 side before the light-blocking film 738 and the coloring film 736 are formed.

Note that the touch panel 791 includes the light-blocking film 738, an insulating film 792, an electrode 793, an electrode 794, an insulating film 795, an electrode 796, and an insulating film 797. A change in the mutual capacitance between the electrode 793 and the electrode 794 can be sensed when an object such as a finger or a stylus approaches, for example.

Furthermore, a portion where the electrode 793 intersects with the electrode 794 is clearly illustrated above the transistor 750 illustrated in FIG. 26 and FIG. 27. The electrode 796 is electrically connected to the two electrodes 793 between which the electrode 794 is positioned through openings provided in the insulating film 795. Note that a structure in which a region where the electrode 796 is provided is provided in the pixel portion 702 is illustrated in FIG. 26 and FIG. 27 as an example; however, one embodiment of the present invention is not limited thereto; for example, the region may be provided in the source driver circuit portion 704.

The electrode 793 and the electrode 794 are provided in a region overlapping with the light-blocking film 738. Furthermore, as illustrated in FIG. 26, it is preferable that the electrode 793 do not overlap with the light-emitting element 782. Furthermore, as illustrated in FIG. 27, it is preferable that the electrode 793 do not overlap with the liquid crystal element 775. In other words, the electrode 793 has an opening in a region overlapping with the light-emitting element 782 and the liquid crystal element 775. That is, the electrode 793 has a mesh shape. With such a structure, a structure in which the electrode 793 does not block light emitted from the light-emitting element 782 can be obtained. Alternatively, a structure in which the electrode 793 does not block light transmitted through the liquid crystal element 775 can be obtained. Thus, since a reduction in luminance caused by the touch panel 791 is extremely small, a display device with high visibility and reduced power consumption can be obtained. Note that the electrode 794 can have a similar structure.

Furthermore, since the electrode 793 and the electrode 794 do not overlap with the light-emitting element 782, a metal material having low visible light transmittance can be used for the electrode 793 and the electrode 794. Alternatively, since the electrode 793 and the electrode 794 do not overlap with the liquid crystal element 775, a metal material having low visible light transmittance can be used for the electrode 793 and the electrode 794.

Thus, the resistance of the electrode 793 and the electrode 794 can be reduced as compared with an electrode using an oxide material having high visible light transmittance, whereby the sensitivity of the sensor of the touch panel can be increased.

For example, a conductive nanowire may be used for the electrodes 793, 794, and 796. The nanowire has a mean diameter of greater than or equal to 1 nm and less than or equal to 100 nm, preferably greater than or equal to 5 nm and less than or equal to 50 nm, further preferably greater than or equal to 5 nm and less than or equal to 25 nm. Furthermore, as the nanowire, a carbon nanotube or a metal nanowire such as an Ag nanowire, a Cu nanowire, or an Al nanowire is used. For example, in the case where an Ag nanowire is used for any one of or all of electrodes 664, 665, and 667, the visible light transmittance can be greater than or equal to 89% and the sheet resistance can be greater than or equal to 40 Ω/square and less than or equal to 100 Ω/square.

Furthermore, although the structure of the in-cell touch panel is illustrated in FIG. 26 and FIG. 27, one embodiment of the present invention is not limited thereto. For example, what is called an on-cell touch panel that is formed over the display device 700, or what is called an out-cell touch panel that is attached to the display device 700 may be used.

In this manner, the display device of one embodiment of the present invention can be used in combination with various types of touch panels.

Note that the structures described in this embodiment can be used in appropriate combination with any of the structures described in the other embodiments.

Embodiment 4

In this embodiment, a display device including a semiconductor device of one embodiment of the present invention is described with reference to FIG. 28.

<4. Circuit Configuration of Display Device>

A display device illustrated in FIG. 28A includes a region including pixels of display elements (hereinafter, referred to as a pixel portion 502), a circuit portion that is provided outside the pixel portion 502 and includes a circuit for driving the pixels (hereinafter, referred to as a driver circuit portion 504), circuits having a function of protecting elements (hereinafter, referred to as protection circuits 506), and a terminal portion 507. Note that the protection circuits 506 are not necessarily provided.

Part or the whole of the driver circuit portion 504 is desirably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or TAB (Tape Automated Bonding).

The pixel portion 502 includes a plurality of circuits for driving display elements arranged in X rows (X is a natural number of 2 or more) and Y columns (Y is a natural number of 2 or more) (hereinafter, referred to as pixel circuits 501), and the driver circuit portion 504 includes driver circuits such as a circuit for outputting a signal (scan signal) to select a pixel (hereinafter, referred to as a gate driver 504a) and a circuit for supplying a signal (data signal) to drive a display element in a pixel (hereinafter, referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, referred to as scan lines GL_1 to GL_X). Note that a plurality of gate drivers 504a may be provided so that the scan lines GL_1 to GL_X are separately controlled by the plurality of gate drivers 504a. Alternatively, the gate driver 504a has a function of supplying an initialization signal. Note that without being limited thereto, the gate driver 504a can supply another signal.

The source driver 504b includes a shift register or the like. The source driver 504b receives a signal (image signal) from which a data signal is generated, as well as a signal for driving the shift register, through the terminal portion 507. The source driver 504b has a function of generating a data signal to be written to the pixel circuit 501 from the image signal. In addition, the source driver 504b has a function of controlling output of a data signal in response to a pulse signal produced by input of a start pulse, a clock signal, or the like. Furthermore, the source driver 504b has a function of controlling the potentials of wirings supplied with data signals (hereinafter, referred to as data lines DL_1 to DL_Y). Alternatively, the source driver 504b has a function of supplying an initialization signal. Without being limited thereto, the source driver 504b can supply another signal.

The source driver 504b is formed using a plurality of analog switches, for example. The source driver 504b can output, as data signals, signals obtained by time-dividing the image signal by sequentially turning on the plurality of analog switches. Furthermore, the source driver 504b may be formed using a shift register or the like.

A pulse signal and a data signal are input to each of the plurality of pixel circuits 501 through one of the plurality of scan lines GL supplied with scan signals and one of the plurality of data lines DL supplied with data signals, respectively. Furthermore, writing and holding of the data of the data signal to and in each of the plurality of pixel circuits 501 are controlled by the gate driver 504a. For example, to the pixel circuit 501 in the m-th row and the n-th column, a pulse signal is input from the gate driver 504a through the scan line GL_m (m is a natural number of X or less), and a data signal is input from the source driver 504b through the data line DL_n (n is a natural number of Y or less) in accordance with the potential of the scan line GL_m.

Figure 28A:
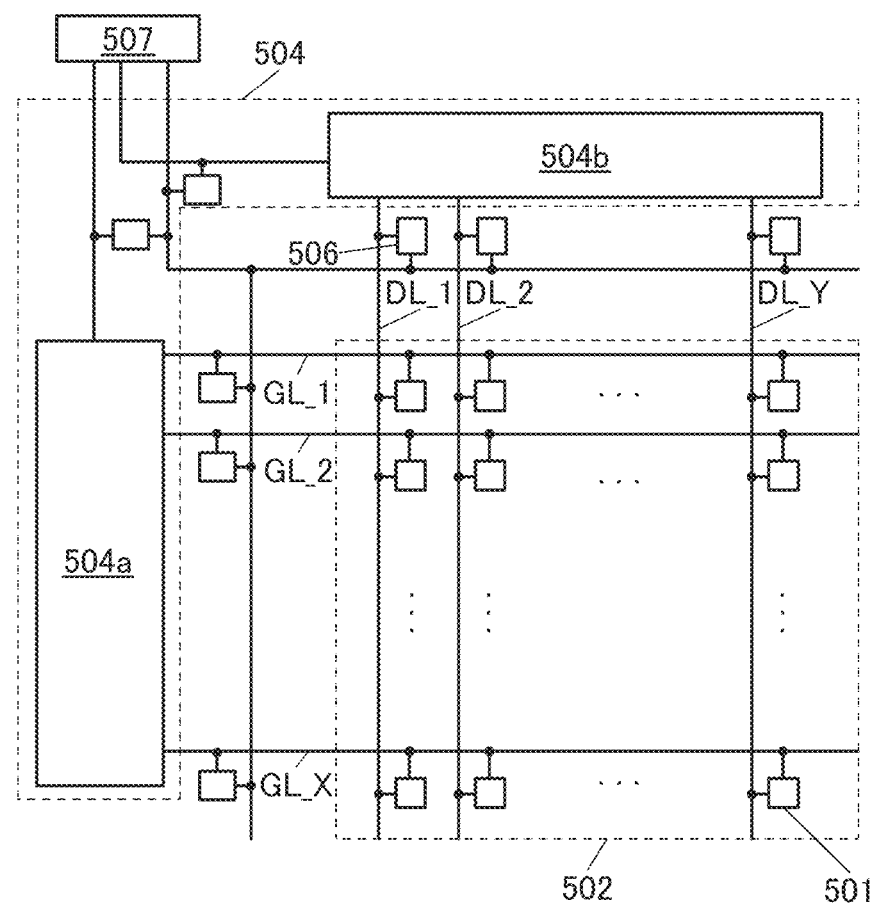
FIGS. 28 A-C A block diagram and circuit diagrams illustrating a display device.

The protection circuit 506 in FIG. 28A is connected to, for example, the scan line GL that is a wiring between the gate driver 504a and the pixel circuit 501. Alternatively, the protection circuit 506 is connected to the data line DL that is a wiring between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 refers to a portion having terminals for inputting power, control signals, and image signals from external circuits to the display device.

The protection circuit 506 is a circuit that electrically connects a wiring, which is connected thereto, to another wiring when a potential out of a certain range is supplied to the wiring.

As illustrated in FIG. 28A, the protection circuits 506 provided for the pixel portion 502 and the driver circuit portion 504 can improve the resistance of the display device to overcurrent generated by ESD (Electro Static Discharge)

or the like. Note that the configuration of the protection circuits 506 is not limited thereto; for example, a configuration in which the protection circuit 506 is connected to the gate driver 504*a*, or a configuration in which the protection circuit 506 is connected to the source driver 504*b* can be employed. Alternatively, a configuration in which the protection circuit 506 is connected to the terminal portion 507 can be employed.

Furthermore, FIG. 28A illustrates an example in which the driver circuit portion 504 is formed using the gate driver 504*a* and the source driver 504*b*; however, the configuration is not limited thereto. For example, a configuration in which only the gate driver 504*a* is formed and a separately prepared substrate over which a source driver circuit is formed (e.g., a driver circuit board formed using a single-crystal semiconductor film or a polycrystalline semiconductor film) is mounted may be employed.

Figure 28B:
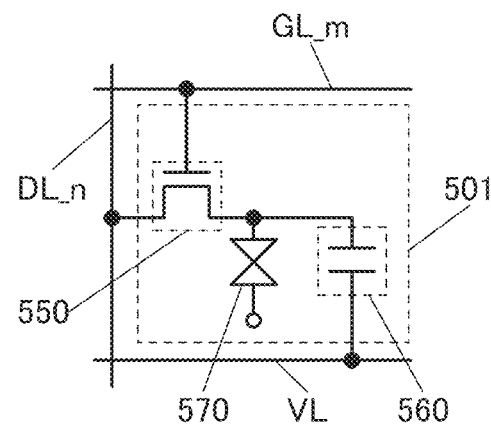

Furthermore, each of the plurality of pixel circuits 501 in FIG. 28A can have the configuration illustrated in FIG. 28B, for example.

The pixel circuit 501 in FIG. 28B includes a liquid crystal element 570, a transistor 550, and a capacitor 560. As the transistor 550, the transistor described in the above embodiment can be used.

The potential of one of a pair of electrodes of the liquid crystal element 570 is set as appropriate in accordance with the specifications of the pixel circuit 501. The alignment state of the liquid crystal element 570 depends on data written thereto. Note that a common potential (a common potential) may be supplied to the one of the pair of electrodes of the liquid crystal element 570 included in each of the plurality of pixel circuits 501. Furthermore, the potential supplied to the one of the pair of electrodes of the liquid crystal element 570 in the pixel circuit 501 may differ between rows.

Examples of a driving method of the display device including the liquid crystal element 570 include a TN mode, an STN mode, a VA mode, an ASM (Axially Symmetric Aligned Micro-cell) mode, an OCB (Optically Compensated Birefringence) mode, an FLC (Ferroelectric Liquid Crystal) mode, an AFLC (AntiFerroelectric Liquid Crystal) mode, an MVA mode, a PVA (Patterned Vertical Alignment) mode, an IPS mode, an FFS mode, and a TBA (Transverse Bend Alignment) mode. Furthermore, other examples of the driving method of the display device include an ECB (Electrically Controlled Birefringence) mode, a PDLC (Polymer Dispersed Liquid Crystal) mode, a PNLC (Polymer Network Liquid Crystal) mode, and a guest-host mode. Note that without being limited thereto, various liquid crystal elements and driving methods can be used.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. Furthermore, a gate electrode of the transistor 550 is electrically connected to the scan line GL_m. The transistor 550 is configured to be turned on or off to control whether a data signal is written.

One of a pair of electrodes of the capacitor 560 is electrically connected to a wiring through which a potential is supplied (hereinafter, referred to as a potential supply line VL), and the other is electrically connected to the other of the pair of electrodes of the liquid crystal element 570. Note that the potential of the potential supply line VL is set as appropriate in accordance with the specifications of the pixel circuit 501. The capacitor 560 functions as a storage capacitor for storing written data.

For example, in the display device including the pixel circuits 501 in FIG. 28B, the gate driver 504*a* in FIG. 28A sequentially selects the pixel circuits 501 row by row to turn on the transistors 550, and data of data signals is written.

When the transistor 550 is turned off, the pixel circuit 501 to which the data has been written is brought into a holding state. This operation is sequentially performed row by row; thus, an image can be displayed.

Figure 28C:
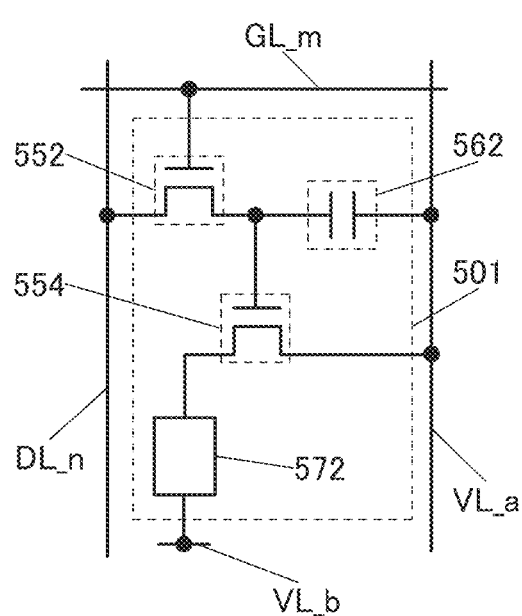

Alternatively, each of the plurality of pixel circuits 501 in FIG. 28A can have the configuration illustrated in FIG. 28C, for example.

Furthermore, the pixel circuit 501 in FIG. 28C includes transistors 552 and 554, a capacitor 562, and a light-emitting element 572. The transistor described in the above embodiment can be used as one or both of the transistor 552 and the transistor 554.

One of a source electrode and a drain electrode of the transistor 552 is electrically connected to a wiring through which a data signal is supplied (hereinafter, referred to as a signal line DL_n). Furthermore, a gate electrode of the transistor 552 is electrically connected to a wiring through which a gate signal is supplied (hereinafter, referred to as the scan line GL_m).

The transistor 552 is configured to be turned on or off to control whether a data signal is written.

One of a pair of electrodes of the capacitor 562 is electrically connected to a wiring through which a potential is supplied (hereinafter, referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and may be an inorganic EL element including an inorganic material.

Note that a high power supply potential VDD is supplied to one of the potential supply line VL_a and the potential supply line VL_b, and a low power supply potential VSS is supplied to the other.

In the display device including the pixel circuits 501 in FIG. 28C, the gate driver 504*a* in FIG. 28A sequentially selects the pixel circuits 501 row by row to turn on the transistors 552, and data of data signals is written.

When the transistor 552 is turned off, the pixel circuit 501 to which the data has been written is brought into a holding state. Furthermore, the amount of current flowing between the source electrode and the drain electrode of the transistor 554 is controlled in accordance with the potential of the written data signal, and the light-emitting element 572 emits light with a luminance corresponding to the amount of flowing current. This operation is sequentially performed row by row; thus, an image can be displayed.

Note that the structures described in this embodiment can be combined as appropriate with any of the structures described in the other embodiments.

Embodiment 5

In this embodiment, circuit configuration examples in which the transistors described in the above embodiments can be used are described with reference to FIG. 29 to FIG. 32.

Note that in the following description in this embodiment, the transistor including an oxide semiconductor described in the above embodiment is referred to as an OS transistor.

<5. Configuration Example of Inverter Circuit>

Figure 29A:
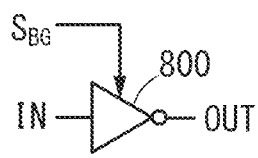
FIGS. 29A-C Circuit diagrams and a timing chart illustrating one embodiment of the present invention.

FIG. 29A is a circuit diagram of an inverter that can be used for a shift register, a buffer, or the like included in the driver circuit. An inverter 800 outputs a signal whose logic is inverted from that of a signal supplied to an input terminal IN to an output terminal OUT. The inverter 800 includes a plurality of OS transistors. A signal SBG is a signal that can switch electrical characteristics of the OS transistors.

Figure 29B:
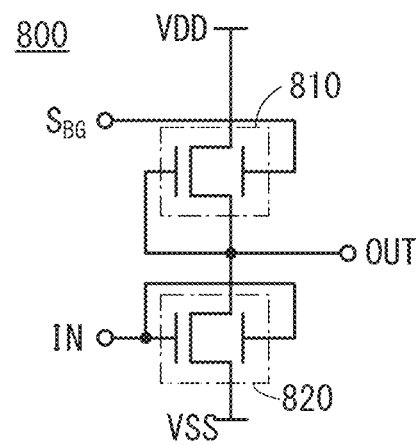

FIG. 29B illustrates an example of the inverter 800. The inverter 800 includes an OS transistor 810 and an OS transistor 820. The inverter 800 can be formed using only n-channel transistors and thus can be formed at lower cost than an inverter (a CMOS inverter) formed using a CMOS (Complementary Metal Oxide Semiconductor).

Note that the inverter 800 including the OS transistors can be provided over a CMOS including Si transistors. Since the inverter 800 can be provided to overlap with the CMOS circuit, no additional area is required for the inverter 800, and thus, an increase in the circuit area can be suppressed.

Each of the OS transistors 810 and 820 includes a first gate functioning as a front gate, a second gate functioning as a back gate, a first terminal functioning as one of a source and a drain, and a second terminal functioning as the other of the source and the drain.

The first gate of the OS transistor 810 is connected to its second terminal. The second gate of the OS transistor 810 is connected to a wiring that supplies the signal SBG. The first terminal of the OS transistor 810 is connected to a wiring that supplies a voltage VDD. The second terminal of the OS transistor 810 is connected to the output terminal OUT.

The first gate of the OS transistor 820 is connected to the input terminal IN. The second gate of the OS transistor 820 is connected to the input terminal IN. The first terminal of the OS transistor 820 is connected to the output terminal OUT. The second terminal of the OS transistor 820 is connected to a wiring that supplies a voltage VSS.

Figure 29C:
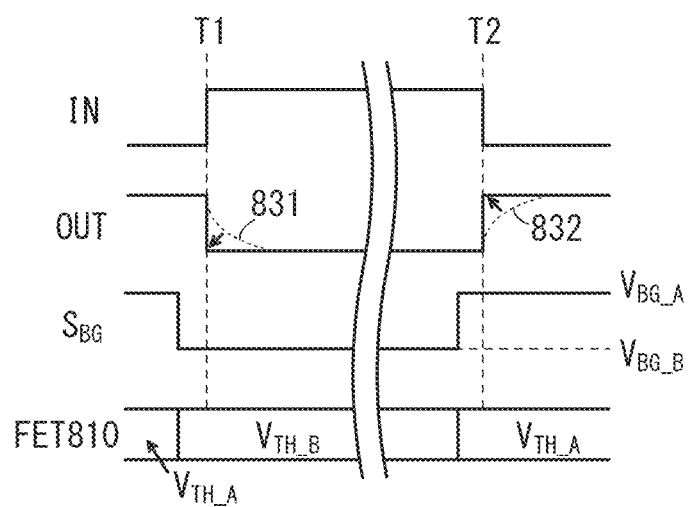

FIG. 29C is a timing chart showing the operation of the inverter 800. The timing chart in FIG. 29C shows changes of a signal waveform of the input terminal IN, a signal waveform of the output terminal OUT, a signal waveform of the signal SBG, and the threshold voltage of the OS transistor 810.

The signal SBG is supplied to the second gate of the OS transistor 810, so that the threshold voltage of the OS transistor 810 can be controlled.

The signal SBG includes a voltage $V_{BG\_A}$ for shifting the threshold voltage in the negative direction and a voltage $V_{BG\_B}$ for shifting the threshold voltage in the positive direction. The threshold voltage of the OS transistor 810 can be shifted in the negative direction to be a threshold voltage $V_{TH\_A}$ when the voltage $V_{BG\_A}$ is applied to the second gate. Furthermore, the threshold voltage of the OS transistor 810 can be shifted in the positive direction to be a threshold voltage $V_{TH\_B}$ when the voltage $V_{BG\_B}$ is applied to the second gate.

Figure 30A:
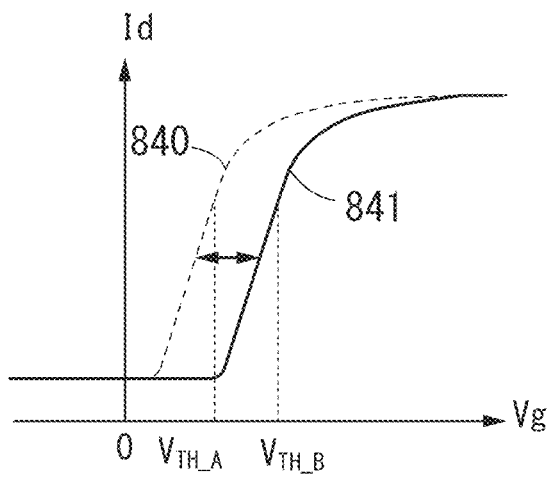
FIGS. 30A-C A graph and circuit diagrams illustrating one embodiment of the present invention.

To visualize the above description, FIG. 30A shows an $I_d$-$V_g$ curve, which is one of the electrical characteristics of a transistor.

When a high voltage such as the voltage $V_{BG\_A}$ is applied to the second gate, the electrical characteristics of the OS transistor 810 can be shifted to match a curve shown by a dashed line 840 in FIG. 30A. Furthermore, when a low voltage such as the voltage $V_{BG\_B}$ is applied to the second gate, the electrical characteristics of the OS transistor 810 can be shifted to match a curve shown by a solid line 841 in FIG. 30A. As shown in FIG. 30A, switching the signal SBG between the voltage $V_{BG\_A}$ and the voltage $V_{BG\_B}$ enables the threshold voltage of the OS transistor 810 to be shifted in the positive direction or the negative direction.

Figure 30B:
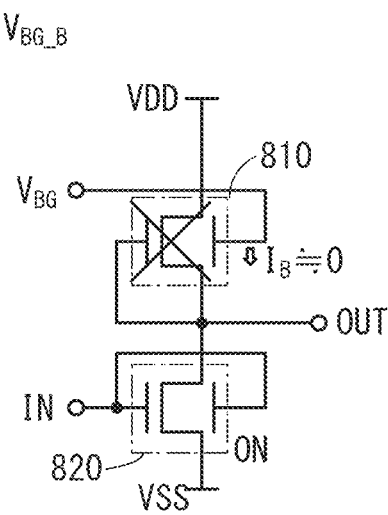

The shift of the threshold voltage in the positive direction toward the threshold voltage $V_{TH\_B}$ can make current less likely to flow in the OS transistor 810. FIG. 30B visualizes this state.

As illustrated in FIG. 30B, a current $I_B$ that flows in the OS transistor 810 can be extremely low. Thus, when a signal supplied to the input terminal IN is at a high level and the OS transistor 820 is in an on state (ON), the voltage of the output terminal OUT can be sharply decreased.

Since a state in which current is less likely to flow in the OS transistor 810 as illustrated in FIG. 30B can be obtained, a change in a signal waveform 831 of the output terminal in the timing chart in FIG. 29C can be made steep. Shoot-through current between the wiring that supplies the voltage VDD and the wiring that supplies the voltage VSS can be low, leading to low-power operation.

Figure 30C:
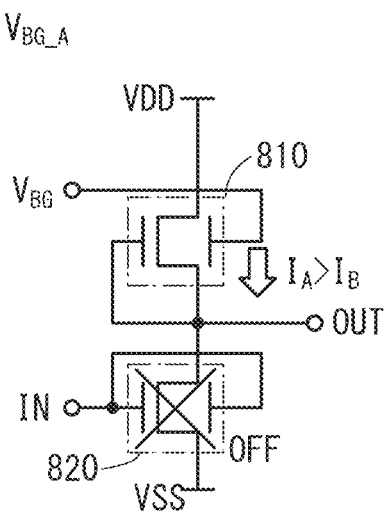

Furthermore, the shift of the threshold voltage in the negative direction toward the threshold voltage $V_{TH\_A}$ can make current flow easily in the OS transistor 810. FIG. 30C visualizes this state. As illustrated in FIG. 30C, a current IA flowing at this time can be higher than at least the current $I_B$. Thus, when a signal supplied to the input terminal IN is at a low level and the OS transistor 820 is in an off state (OFF), the voltage of the output terminal OUT can be sharply increased. Since a state in which current is likely to flow in the OS transistor 810 as illustrated in FIG. 30C can be obtained, a change in a signal waveform 832 of the output terminal in the timing chart in FIG. 29C can be made steep.

Note that the threshold voltage of the OS transistor 810 is preferably controlled by the signal SBG before the state of the OS transistor 820 is switched, i.e., before time T1 or T2. For example, as in FIG. 29C, it is preferable that the threshold voltage of the OS transistor 810 be switched from the threshold voltage $V_{TH\_A}$ to the threshold voltage $V_{TH\_B}$ before time T1 at which the level of the signal supplied to the input terminal IN is switched to a high level. Moreover, as in FIG. 29C, it is preferable that the threshold voltage of the OS transistor 810 be switched from the threshold voltage $V_{TH\_B}$ to the threshold voltage $V_{TH\_A}$ before time T2 at which the level of the signal supplied to the input terminal IN is switched to a low level.

Figure 31A:
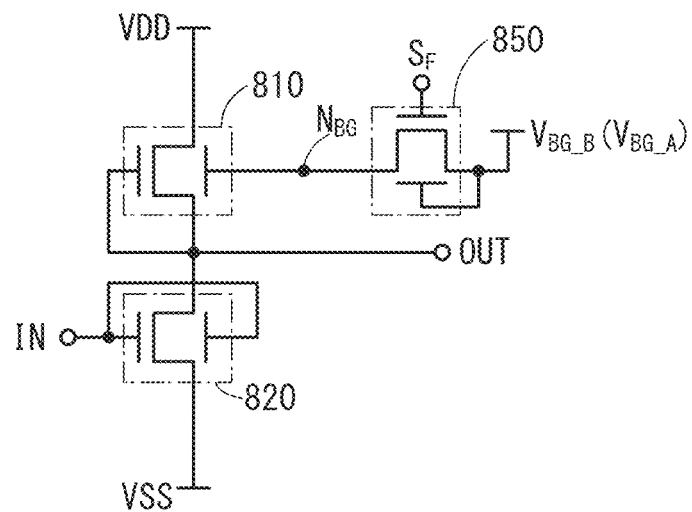
FIGS. 31A-B A circuit diagram and a timing chart illustrating one embodiment of the present invention.

Note that although the timing chart in FIG. 29C shows the configuration in which the signal SBG is switched in accordance with the signal supplied to the input terminal IN, a different configuration may be employed. For example, a configuration in which voltage for controlling the threshold voltage is held by the second gate of the OS transistor 810 in a floating state may be employed. FIG. 31A illustrates a circuit configuration example that can achieve the configuration.

In FIG. 31A, an OS transistor 850 is additionally included in the circuit configuration illustrated in FIG. 29B. A first terminal of the OS transistor 850 is connected to the second gate of the OS transistor 810. Furthermore, a second terminal of the OS transistor 850 is connected to a wiring that supplies the voltage $V_{BG\_B}$ (or the voltage $V_{BG\_A}$). A first gate of the OS transistor 850 is connected to a wiring that supplies a signal SF. A second gate of the OS transistor 850 is connected to the wiring that supplies the voltage $V_{BG\_B}$ (or the voltage $V_{BG\_A}$).

Figure 31B:
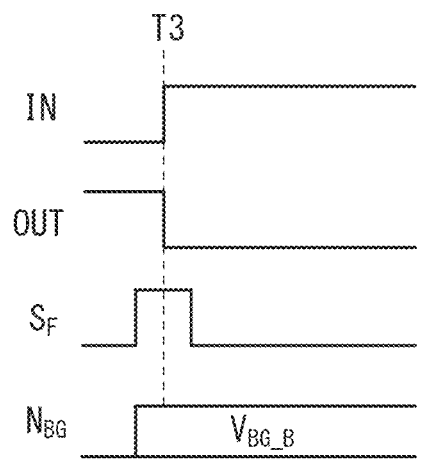

The operation in FIG. 31A is described with reference to a timing chart in FIG. 31B.

The voltage for controlling the threshold voltage of the OS transistor 810 is supplied to the second gate of the OS transistor 810 before time T3 at which the level of the signal supplied to the input terminal IN is switched to a high level. The signal SF is set to a high level and the OS transistor 850 is turned on, so that the voltage $V_{BG\_B}$ for controlling the threshold voltage is supplied to a node $N_{BG}$.

The OS transistor 850 is turned off after the voltage of the node $N_{BG}$ becomes $V_{BG\_B}$. Since the off-state current of the OS transistor 850 is extremely low, the threshold voltage $V_{BG\_B}$ that has been held by the node $N_{BG}$ can be held while the OS transistor 850 remains off. Thus, the number of times the voltage $V_{BG\_B}$ is supplied to the second gate of the OS transistor 850 can be reduced and accordingly, the power consumption for rewriting the voltage $V_{BG\_B}$ can be reduced.

Figure 32A:
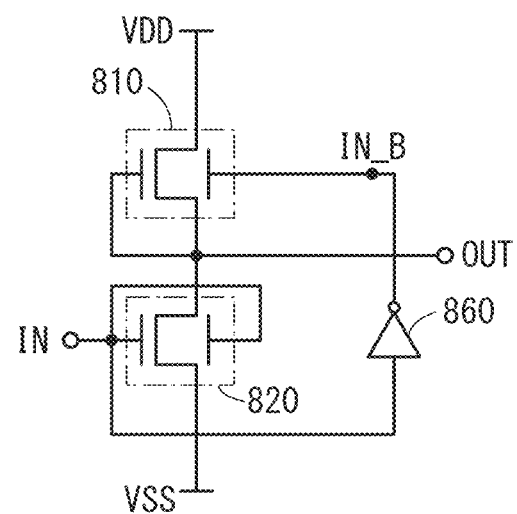
FIGS. 32A-B A circuit diagram and a timing chart illustrating one embodiment of the present invention.

Note that although the circuit configurations in FIG. 29B and FIG. 31A are each the configuration in which the voltage is supplied to the second gate of the OS transistor 810 by control from the outside, a different configuration may be employed. For example, a configuration in which voltage for controlling the threshold voltage is generated on the basis of the signal supplied to the input terminal IN and is supplied to the second gate of the OS transistor 810 may be employed. FIG. 32A illustrates a circuit configuration example that can achieve the configuration.

In FIG. 32A, a CMOS inverter 860 is added between the input terminal IN and the second gate of the OS transistor 810 in the circuit configuration illustrated in FIG. 29B. An input terminal of the CMOS inverter 860 is connected to the input terminal IN. An output terminal of the CMOS inverter 860 is connected to the second gate of the OS transistor 810.

The operation in FIG. 32A is described with reference to a timing chart in FIG. 32B. The timing chart in FIG. 32B shows changes of a signal waveform of the input terminal IN, a signal waveform of the output terminal OUT, an output waveform IN_B of the CMOS inverter 860, and the threshold voltage of the OS transistor 810.

The output waveform IN_B that corresponds to a signal whose logic is inverted from that of the signal supplied to the input terminal IN can be a signal that controls the threshold voltage of the OS transistor 810. Thus, the threshold voltage of the OS transistor 810 can be controlled as described with reference to FIG. 30A to FIG. 30C. For example, the signal supplied to the input terminal IN is at a high level and the OS transistor 820 is turned on at time T4 in FIG. 32B. At this time, the output waveform IN_B is at a low level. Accordingly, current can be made less likely to flow in the OS transistor 810; thus, an increase in the voltage of the output terminal OUT can be sharply decreased.

Figure 32B:
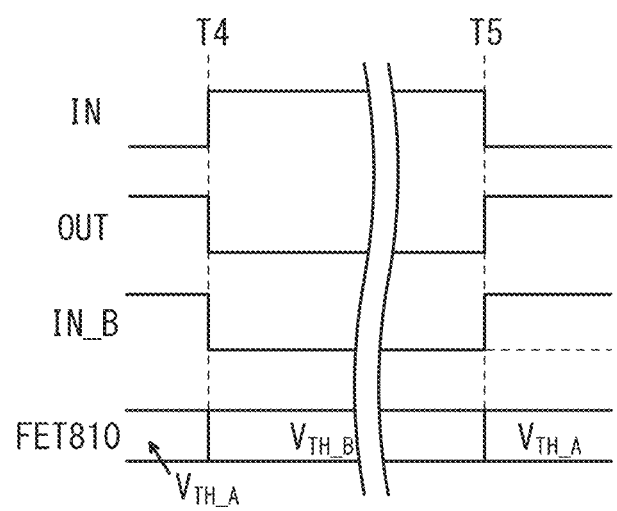

Moreover, the signal supplied to the input terminal IN is at a low level and the OS transistor 820 is turned off at time T5 in FIG. 32B. At this time, the output waveform IN_B is at a high level. Accordingly, current can easily flow in the OS transistor 810; thus, the voltage of the output terminal OUT can be sharply increased.

As described above, in the configuration of the inverter including the OS transistor in this embodiment, the voltage of the back gate is switched in accordance with the logic of the signal of the input terminal IN. In such a configuration, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that supply power supply voltages can be reduced. Thus, power consumption can be reduced.

Note that the structures described in this embodiment can be combined as appropriate with any of the structures described in the other embodiments.

Embodiment 6

In this embodiment, examples of a semiconductor device in which the transistor including an oxide semiconductor (OS transistor) described in any of the above embodiments is used in a plurality of circuits are described with reference to FIG. 33 to FIG. 36.

<6. Circuit Configuration Example of Semiconductor Device>

Figure 33A:
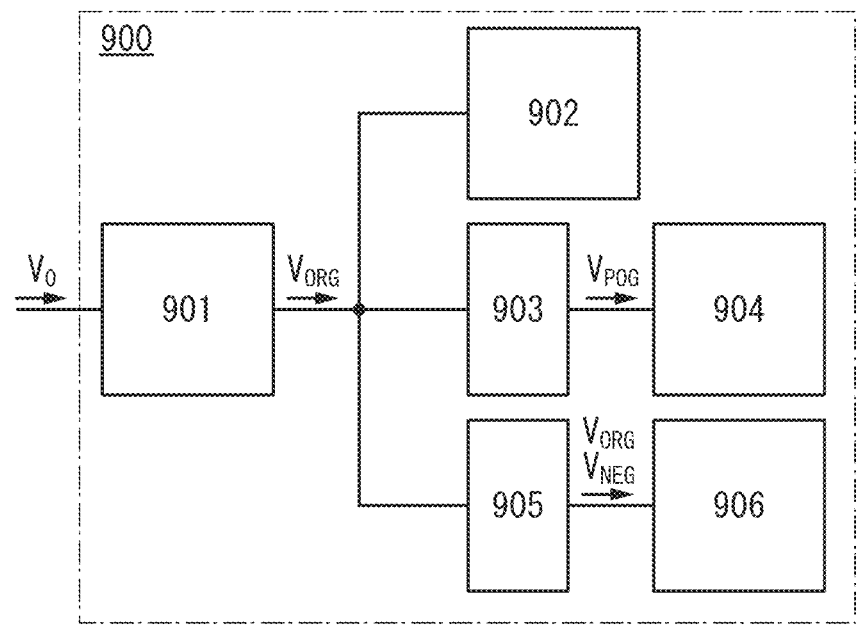
FIGS. 33A-E A block diagram, circuit diagrams, and waveform diagrams illustrating one embodiment of the present invention.

FIG. 33A is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage Vo supplied from the outside of the semiconductor device 900. The semiconductor device 900 can generate the voltage $V_{ORG}$ on the basis of one power supply voltage supplied from the outside. Thus, the semiconductor device 900 can operate without supply of a plurality of power supply voltages from the outside.

The circuits 902, 904, and 906 operate with different power supply voltages. For example, the power supply voltage of the circuit 902 is a voltage applied on the basis of the voltage $V_{ORG}$ and the voltage $V_{SS}$ ($V_{ORG}$>$V_{SS}$). Furthermore, for example, the power supply voltage of the circuit 904 is a voltage applied on the basis of a voltage $V_{POG}$ and the voltage $V_{SS}$ ($V_{POG}$>$V_{ORG}$). Furthermore, for example, the power supply voltages of the circuit 906 are voltages applied on the basis of the voltage $V_{ORG}$ and a voltage $V_{NEG}$ ($V_{ORG}$>$V_{SS}$>$V_{NEG}$). Note that when the voltage $V_{SS}$ is equal to a ground potential (GND), the kinds of voltages generated in the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901. Thus, the semiconductor device 900 including the circuit 904 can operate on the basis of one power supply voltage supplied from the outside.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901. Thus, the semiconductor device 900 including the circuit 906 can operate on the basis of one power supply voltage supplied from the outside.

Figure 33B:
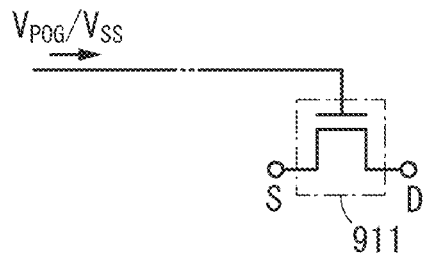
Figure 33C:
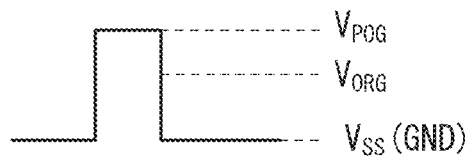

FIG. 33B illustrates an example of the circuit 904 that operates with the voltage $V_{POG}$ and FIG. 33C illustrates an example of a waveform of a signal for operating the circuit 904.

FIG. 33B illustrates a transistor 911. A signal supplied to a gate of the transistor 911 is generated on the basis of, for example, the voltage $V_{POG}$ and the voltage $V_{SS}$. The signal is generated on the basis of the voltage $V_{POG}$ to turn on the transistor 911 and on the basis of the voltage $V_{SS}$ to turn off the transistor 911. As illustrated in FIG. 33C, the voltage $V_{POG}$ is higher than the voltage $V_{ORG}$. Thus, an operation for bringing a source (S) and a drain (D) of the transistor 911 into a conduction state can be performed more surely. As a result, the frequency of malfunction of the circuit 904 can be reduced.

Figure 33D:
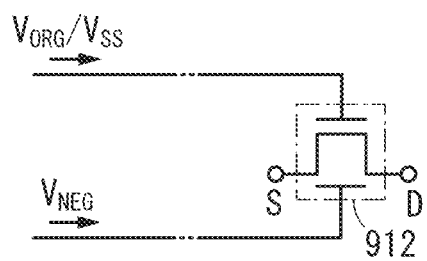
Figure 33E:
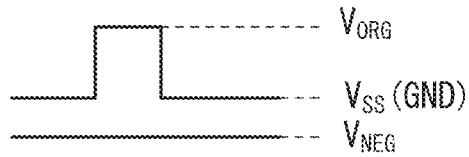

FIG. 33D illustrates an example of the circuit 906 that operates with the voltage $V_{NEG}$ and FIG. 33E illustrates an example of a waveform of a signal for operating the circuit 906.

FIG. 33D illustrates a transistor 912 having a back gate. A signal supplied to a gate of the transistor 912 is generated on the basis of, for example, the voltage $V_{ORG}$ and the voltage $V_{SS}$. The signal is generated on the basis of the voltage $V_{ORG}$ to turn on the transistor 911 and on the basis of the voltage $V_{SS}$ to turn off the transistor 911. Furthermore, a voltage applied to the back gate of the transistor 912 is generated on the basis of the voltage $V_{NEG}$. As illustrated in FIG. 33E, the voltage $V_{NEG}$ is lower than the voltage $V_{SS}$ (GND). Thus, the threshold voltage of the transistor 912 can be controlled to shift in the positive direction. Thus, the transistor 912 can be surely turned off and a current flowing between a source (S) and a drain (D) can be reduced. As a result, the frequency of malfunction of the circuit 906 can be reduced and power consumption thereof can be reduced.

Note that the voltage $V_{NEG}$ may be directly supplied to the back gate of the transistor 912. Alternatively, a signal supplied to the gate of the transistor 912 may be generated on the basis of the voltage $V_{ORG}$ and the voltage $V_{NEG}$ and the signal may also be supplied to the back gate of the transistor 912.

Figure 34A:
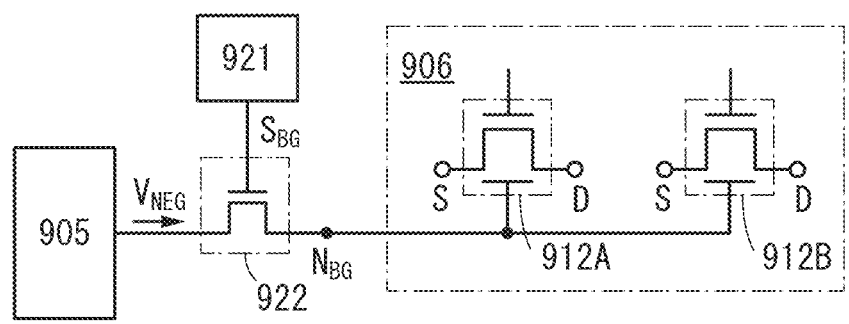
FIGS. 34A-B A circuit diagram and a timing chart illustrating one embodiment of the present invention.

Furthermore, FIGS. 34A and B illustrate a modification example of FIGS. 33D and E.

In a circuit diagram illustrated in FIG. 34A, a transistor 922 whose conduction state can be controlled by a control circuit 921 is provided between the voltage generation circuit 905 and the circuit 906. The transistor 922 is an n-channel OS transistor. The control signal SBG output from the control circuit 921 is a signal for controlling the conduction state of the transistor 922. Furthermore, transistors 912A and 912B included in the circuit 906 are OS transistors like the transistor 922.

Figure 34B:
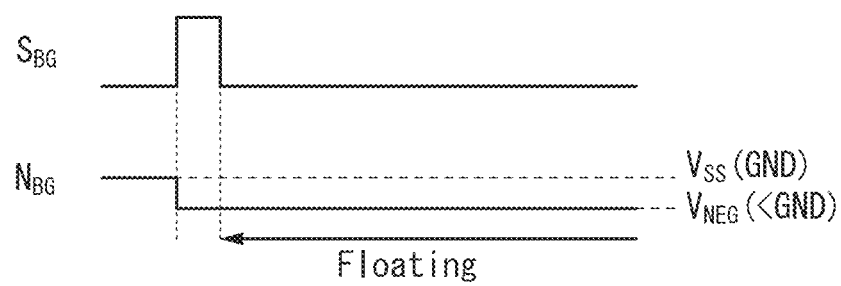

A timing chart in FIG. 34B shows changes in a potential of the control signal SBG and a potential of a node $N_{BG}$ that indicates the states of potentials of back gates of the transistors 912A and 912B. When the control signal SBG is at a high level, the transistor 922 is turned on and the voltage of the node $N_{BG}$ becomes $V_{NEG}$. Then, when the control signal SBG is at a low level, the node $N_{BG}$ is brought into an electrically floating state. Since the transistor 922 is an OS transistor, its off-state current is small. Accordingly, even when the node $N_{BG}$ is in an electrically floating state, the voltage $V_{NEG}$ that has been supplied can be held.

Figure 35A:
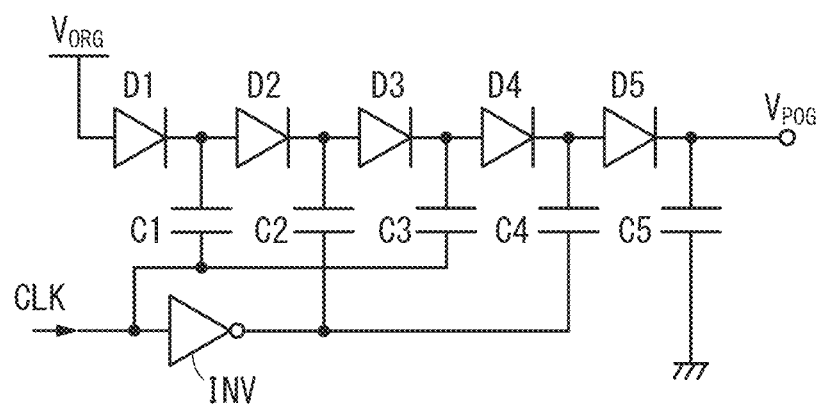
FIGS. 35A-B Circuit diagrams illustrating one embodiment of the present invention.

Furthermore, FIG. 35A illustrates an example of a circuit configuration that can be used for the above-described voltage generation circuit 903. The voltage generation circuit 903 illustrated in FIG. 35A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{POG}$, which has been increased to a positive voltage having a positively quintupled value of the voltage $V_{ORG}$ by the clock signal CLK, can be obtained. Note that the forward voltage of the diodes D1 to D5 is 0 V. Furthermore, the number of stages of the charge pump can be changed to obtain a desired voltage $V_{POG}$.

Figure 35B:
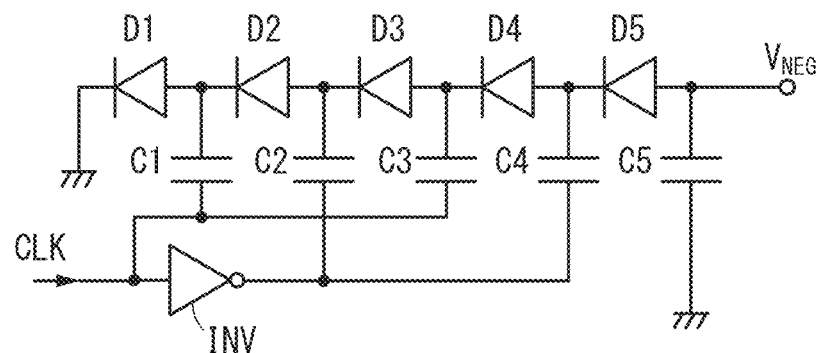

Furthermore, FIG. 35B illustrates an example of a circuit configuration that can be used for the above-described voltage generation circuit 905. The voltage generation circuit 905 illustrated in FIG. 35B is a four-stage charge pump including the diodes D1 to D5, the capacitors C1 to C5, and the inverter INV. The clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{NEG}$, which has been reduced from the ground voltage, i.e., the voltage $V_{SS}$ to a negative voltage having a negatively quadrupled value of the voltage $V_{ORG}$ by the clock signal CLK, can be obtained. Note that the forward voltage of the diodes D1 to D5 is 0 V. Furthermore, the number of stages of the charge pump can be changed to obtain a desired voltage $V_{NEG}$.

Figure 36A:
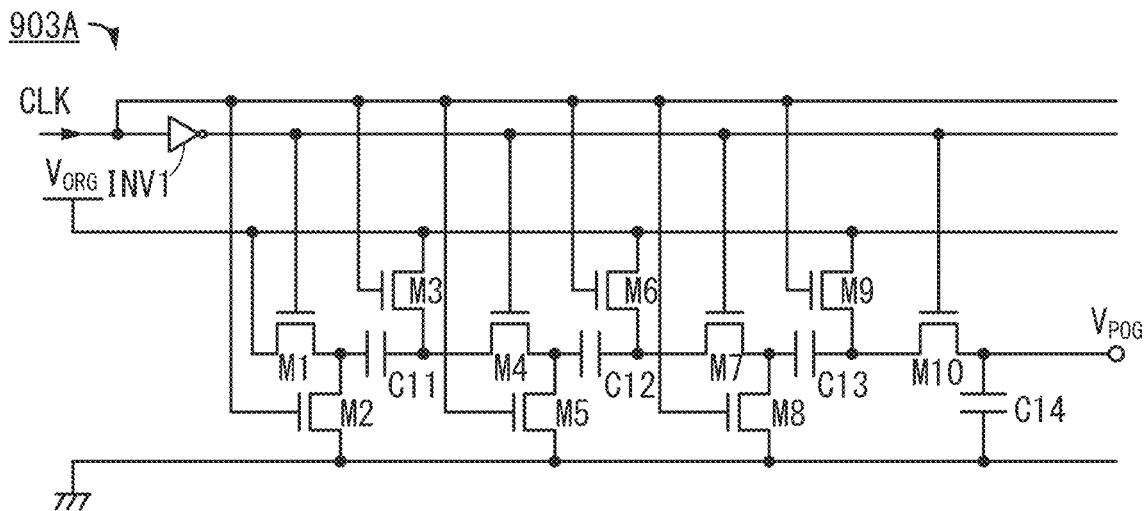
FIGS. 36A-C Circuit diagrams illustrating one embodiment of the present invention.
Figure 36B:
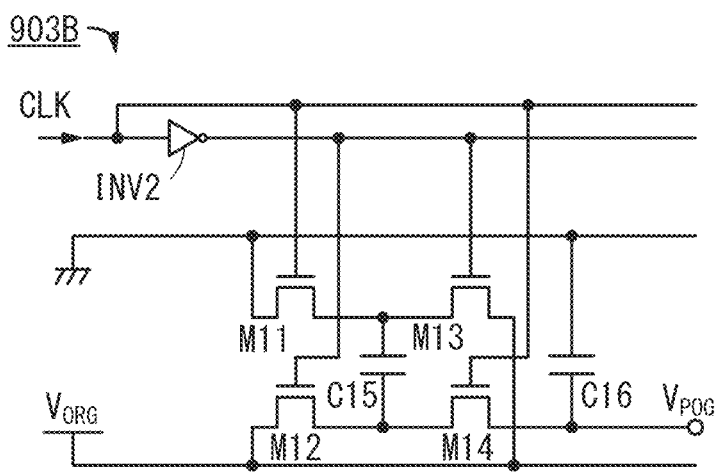
Figure 36C:
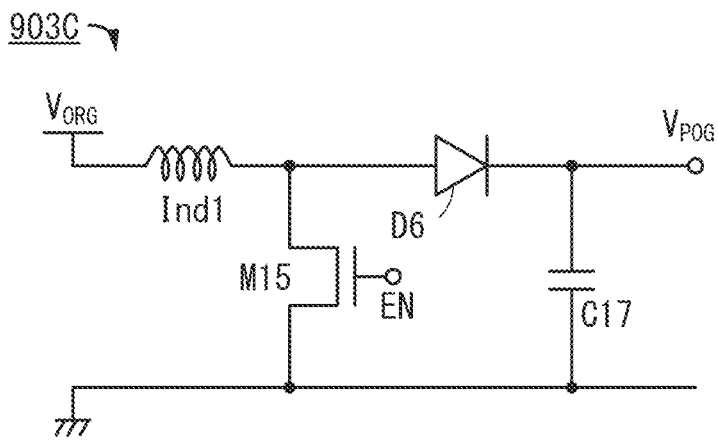

Note that the circuit configuration of the voltage generation circuit 903 is not limited to the configuration in the circuit diagram illustrated in FIG. 35A. For example, modification examples of the voltage generation circuit 903 are illustrated in FIG. 36A to FIG. 36C. Note that modification examples of the voltage generation circuit 903 can be realized by changing voltages supplied to wirings or arrangement of elements in voltage generation circuits 903A to 903C illustrated in FIG. 36A to FIG. 36C.

The voltage generation circuit 903A illustrated in FIG. 36A includes transistors M1 to M10, capacitors C11 to C14, and an inverter INV1. The clock signal CLK is supplied to gates of the transistors M1 to M10 directly or through the inverter INV1. By the clock signal CLK, the voltage $V_{POG}$, which has been increased to a positive voltage having a positively quadrupled value of the voltage $V_{ORG}$, can be obtained. Note that the number of stages can be changed to obtain a desired voltage $V_{POG}$. In the voltage generation circuit 903A in FIG. 36A, off-state current of each of the transistors M1 to M10 can be small when the transistors are OS transistors, and leakage of charge held in the capacitors C11 to C14 can be suppressed. Accordingly, the voltage $V_{ORG}$ can be efficiently increased to the voltage $V_{POG}$.

Furthermore, the voltage generation circuit 903B illustrated in FIG. 36B includes transistors M11 to M14, capacitors C15 and C16, and an inverter INV2. The clock signal CLK is supplied to gates of the transistors M11 to M14 directly or through the inverter INV2. By the clock signal CLK, the voltage $V_{POG}$, which has been increased to a positive voltage having a positively doubled value of the voltage $V_{ORG}$, can be obtained. In the voltage generation circuit 903B in FIG. 36B, off-state current of each of the transistors M11 to M14 can be small when the transistors are OS transistors, and leakage of charge held in the capacitors C15 and C16 can be suppressed. Accordingly, the voltage $V_{ORG}$ can be efficiently increased to the voltage $V_{POG}$.

The voltage generation circuit 903C illustrated in FIG. 36C includes an inductor Ind1, a transistor M15, a diode D6, and a capacitor C17. The conduction state of the transistor M15 is controlled by a control signal EN. Owing to the control signal EN, the voltage $V_{POG}$ increased from the voltage $V_{ORG}$ can be obtained. Since the voltage generation circuit 903C in FIG. 36C increases the voltage using the inductor Ind1, the voltage can be efficiently increased.

As described above, in any of the structures of this embodiment, a voltage required for circuits included in a semiconductor device can be internally generated. Thus, in the semiconductor device, the number of power supply voltages supplied from the outside can be reduced.

Note that the structures and the like described in this embodiment can be combined as appropriate with any of the structures described in the other embodiments.

Embodiment 7

In this embodiment, a display module and electronic devices, each of which includes a semiconductor device of one embodiment of the present invention, are described with reference to FIG. 37 to FIG. 40.

<7-1. Display Module>

Figure 37:
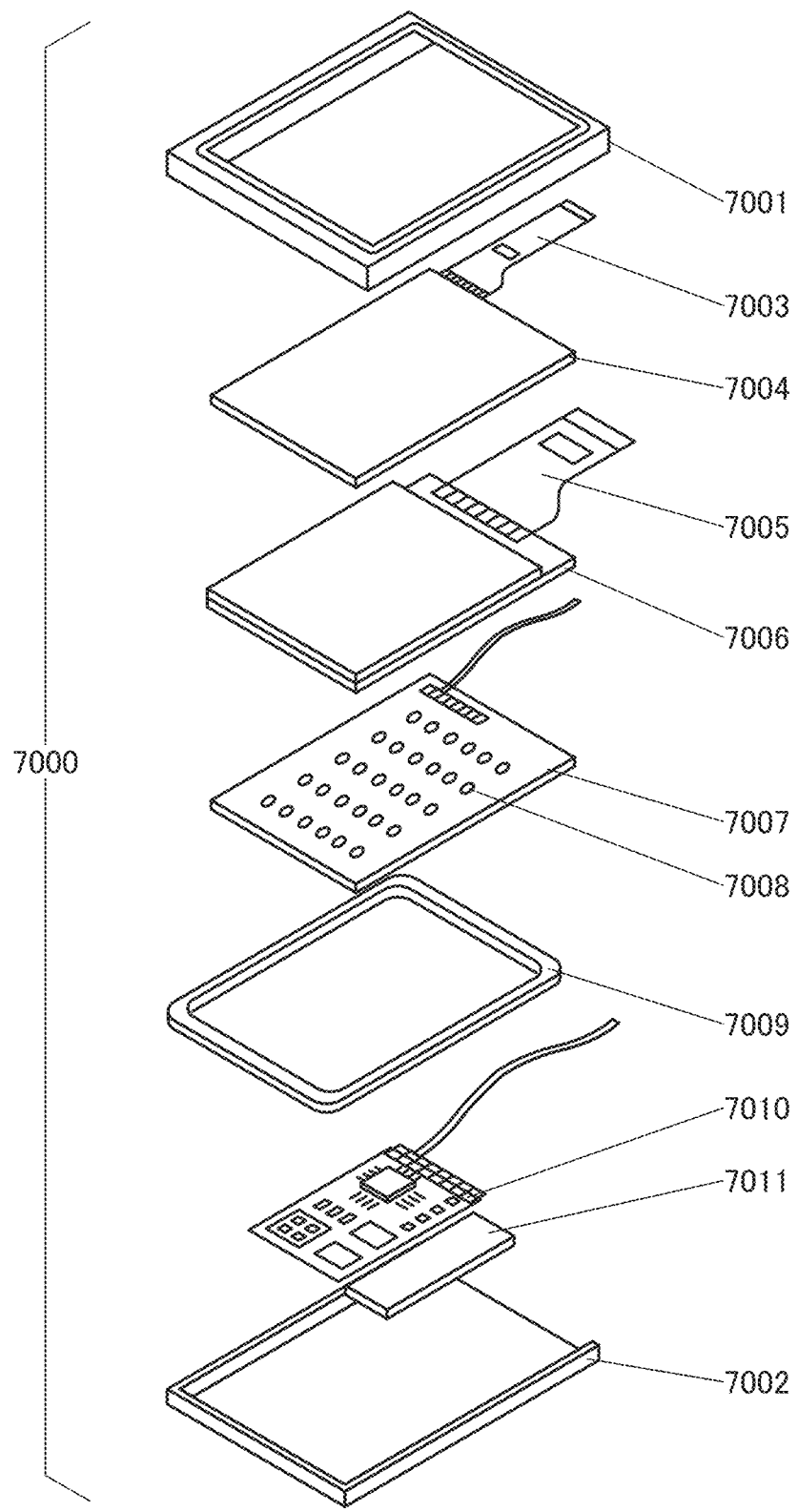
FIG. 37 A diagram illustrating a display module.

In a display module 7000 illustrated in FIG. 37, a touch panel 7004 connected to an FPC 7003, a display panel 7006 connected to an FPC 7005, a backlight 7007, a frame 7009, a printed board 7010, and a battery 7011 are provided between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

The touch panel 7004 can be a resistive or capacitive touch panel and overlap with the display panel 7006. Alternatively, a counter substrate (sealing substrate) of the display panel 7006 can have a touch panel function. Alternatively, a photosensor may be provided in each pixel of the display panel 7006 to obtain an optical touch panel.

The backlight 7007 includes a light source 7008. Note that one embodiment of the present invention is not limited to the structure in FIG. 37, in which the light source 7008 is provided over the backlight 7007. For example, a structure in which the light source 7008 is provided at an end portion of the backlight 7007 and a light diffusion plate is further provided may be employed. Note that the backlight 7007 need not be provided in the case where a self-luminous light-emitting element such as an organic EL element is used or in the case where a reflective panel or the like is employed.

The frame 7009 has a function of protecting the display panel 7006 and a function as an electromagnetic shield for blocking electromagnetic waves generated by the operation of the printed board 7010. The frame 7009 may also have a function as a radiator plate.

The printed board 7010 includes a power supply circuit and a signal processing circuit for outputting a video signal and a clock signal. As a power source for supplying power to the power supply circuit, an external commercial power source or a power source using the battery 7011 provided separately may be used. The battery 7011 can be omitted in the case where a commercial power source is used.

Furthermore, the display module 7000 may be additionally provided with a member such as a polarizing plate, a retardation plate, or a prism sheet.

<7-2. Electronic Device 1>

Next, FIG. 38A to FIG. 38E illustrate examples of electronic devices.

Figure 38A:
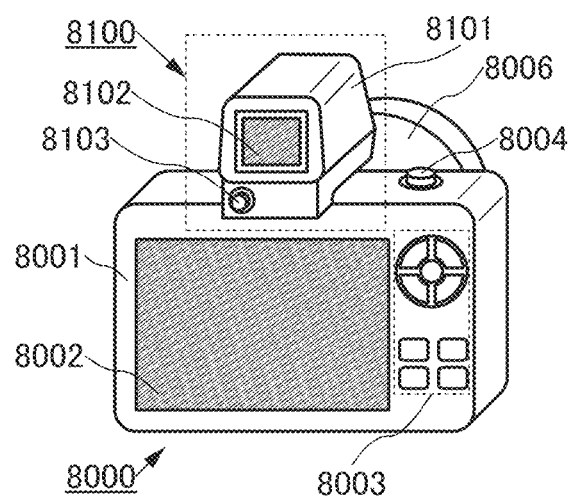
FIGS. 38A-E Diagrams illustrating electronic devices.

FIG. 38A is an external view of a camera 8000 to which a finder 8100 is attached.

The camera 8000 includes a housing 8001, a display portion 8002, operation buttons 8003, a shutter button 8004, and the like. Furthermore, an attachable lens 8006 is attached to the camera 8000.

Although the lens 8006 of the camera 8000 here is detachable from the housing 8001 for replacement, the lens 8006 may be included in the housing.

Images can be taken with the camera 8000 at the press of the shutter button 8004. In addition, the display portion 8002 functions as a touch panel; thus, images can be taken at the touch of the display portion 8002.

The housing 8001 of the camera 8000 includes a mount including an electrode, so that the finder 8100, a stroboscope, or the like can be connected to the housing.

The finder 8100 includes a housing 8101, a display portion 8102, a button 8103, and the like.

The housing 8101 includes a mount for engagement with the mount of the camera 8000 so that the finder 8100 can be connected to the camera 8000. Furthermore, the mount includes an electrode, and an image or the like received from the camera 8000 through the electrode can be displayed on the display portion 8102.

The button 8103 functions as a power button. The on/off state of the display portion 8102 can be switched with the button 8103.

A display device of one embodiment of the present invention can be used in the display portion 8002 of the camera 8000 and the display portion 8102 of the finder 8100.

Note that although the camera 8000 and the finder 8100 are separate and detachable electronic devices in FIG. 38A, the housing 8001 of the camera 8000 may include a finder having a display device.

Figure 38B:
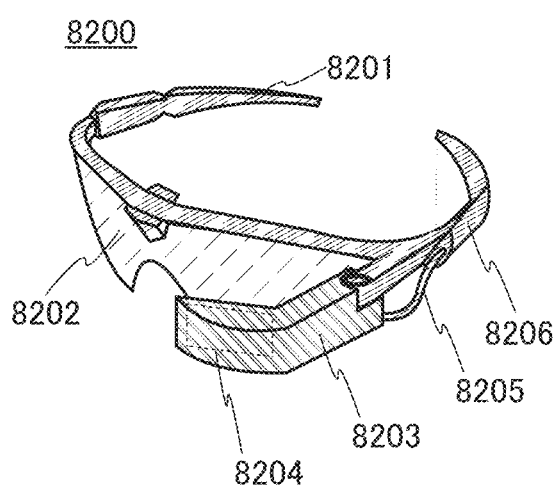

FIG. 38B is an external view of a head-mounted display 8200.

The head-mounted display 8200 includes a mounting portion 8201, a lens 8202, a main body 8203, a display portion 8204, a cable 8205, and the like. Furthermore, the mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. Furthermore, the movement of the eyeball and the eyelid of a user is captured by a camera in the main body 8203 and then coordinates of the points the user looks at are calculated using the captured data to utilize the eye of the user as an input means.

Furthermore, the mounting portion 8201 may include a plurality of electrodes to be in contact with the user. The main body 8203 may have a function of sensing current flowing through the electrodes with the movement of the user's eyeball to recognize the points the user looks at. Furthermore, the main body may have a function of sensing current flowing through the electrodes to monitor the user's pulse. Furthermore, the mounting portion 8201 may include sensors, such as a temperature sensor, a pressure sensor, and an acceleration sensor so that the user's biological information can be displayed on the display portion 8204. Furthermore, the main body may have a function of sensing the movement of the user's head or the like to change an image displayed on the display portion 8204 in synchronization with the movement.

The display device of one embodiment of the present invention can be used in the display portion 8204.

Figure 38C:
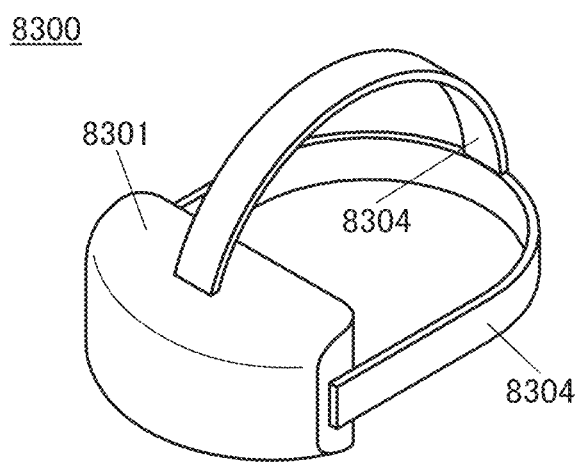
Figure 38D:
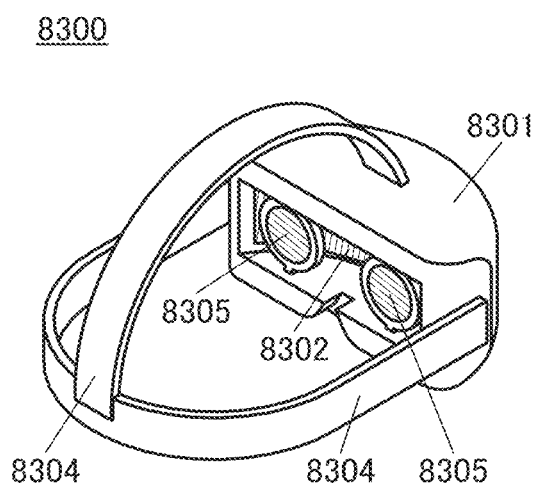

FIGS. 38C, D, and E are external views of a head-mounted display 8300. The head-mounted display 8300 includes a housing 8301, a display portion 8302, fixing bands 8304, and a pair of lenses 8305.

A user can see display on the display portion 8302 through the lenses 8305. Note that it is suitable that the display portion 8302 be curved. When the display portion 8302 is curved, a user can feel high realistic sensation. Note that although the structure in which one display portion 8302 is provided is described in this embodiment, the structure is not limited thereto, and two display portions 8302 may be provided. In this case, one display portion is provided for one corresponding user's eye, so that three-dimensional display using parallax or the like is possible.

Figure 38E:
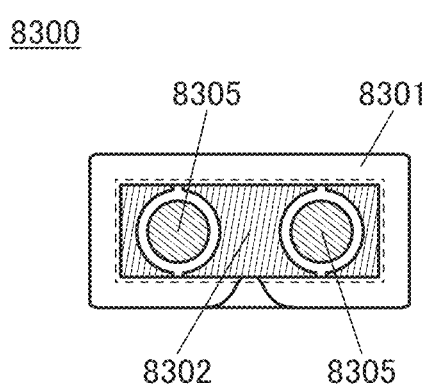

Note that the display device of one embodiment of the present invention can be used in the display portion 8302. The display device including the semiconductor device of one embodiment of the present invention has an extremely high resolution; thus, even when an image is magnified using the lenses 8305 as illustrated in FIG. 38E, the user does not perceive pixels, and thus a more realistic image can be displayed.

<7-3. Electronic Device 2>

Next, FIG. 39A to FIG. 39G illustrate examples of electronic devices that are different from the electronic devices illustrated in FIG. 38A to FIG. 38E.

The electronic devices illustrated in FIG. 39A to FIG. 39G each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIG. 39A to FIG. 39G have a variety of functions. For example, the electronic devices can have a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Note that functions of the electronic devices in FIG. 39A to FIG. 39G are not limited thereto, and the electronic devices can have a variety of functions. Furthermore, although not illustrated in FIG. 39A to FIG. 39G, the electronic devices may each have a plurality of display portions. Furthermore, the electronic devices may each be provided with a camera and the like to have a function of taking a still image, a function of taking a moving image, a function of storing the taken image in a memory medium (an external memory medium or a memory medium incorporated in the camera), a function of displaying the taken image on the display portion, or the like.

The electronic devices in FIG. 39A to FIG. 39G are described in detail below.

Figure 39A:
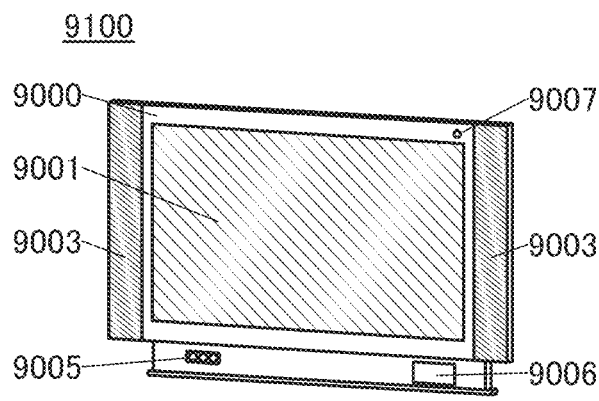
FIGS. 39A-G Diagrams illustrating electronic devices.

FIG. 39A is a perspective view illustrating a television device 9100. The television device 9100 can include the display portion 9001 having a large screen size of, for example, 50 inches or more, or 100 inches or more.

Figure 39D:
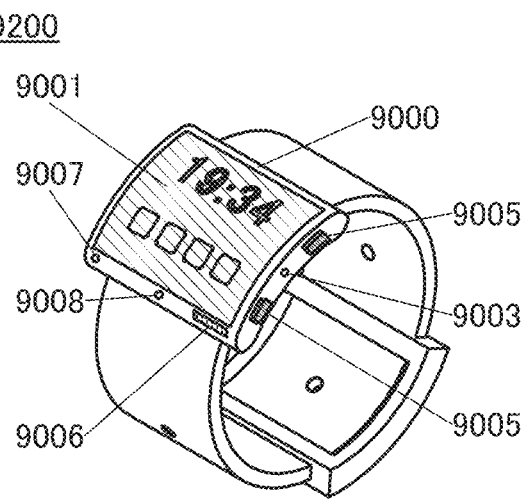
Figure 39B:
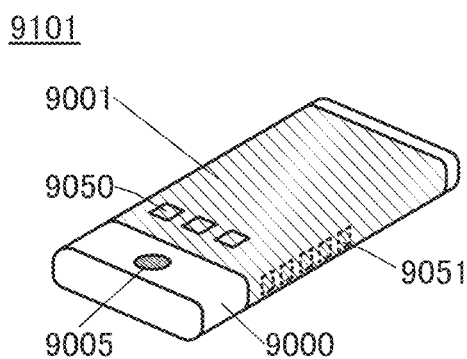

FIG. 39B is a perspective view of a portable information terminal 9101. The portable information terminal 9101 has, for example, one or more functions selected from a telephone set, a notebook, and an information browsing system. Specifically, the portable information terminal can be used as a smartphone. Note that the portable information terminal 9101 may include a speaker 9003, a connection terminal 9006, a sensor 9007, or the like. Furthermore, the portable information terminal 9101 can display text and image information on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Note that examples of the information 9051 include display indicating reception of an e-mail, an SNS (social networking service) message, or a telephone call, the title of an e-mail or an SNS message, the sender of an e-mail or an SNS message, date, time, remaining battery, and reception strength of an antenna. Alternatively, in place of the information 9051, the operation buttons 9050 or the like may be displayed on the position where the information 9051 is displayed.

Figure 39E:
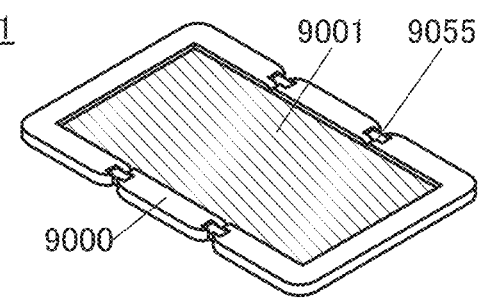
Figure 39C:
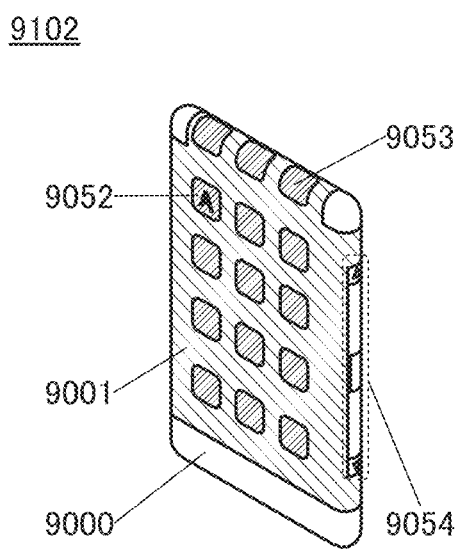

FIG. 39C is a perspective view of a portable information terminal 9102. The portable information terminal 9102 has a function of displaying information on three or more surfaces of the display portion 9001. Here, an example in which information 9052, information 9053, and information 9054 are displayed on different surfaces is illustrated. For example, a user of the portable information terminal 9102 can see the display (here, the information 9053) on the portable information terminal 9102 put in a breast pocket of the clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 39D is a perspective view of a watch-type portable information terminal 9200. The portable information terminal 9200 is capable of executing a variety of applications such as mobile phone calls, e-mailing, viewing and editing texts, music reproduction, Internet communication, and a computer game. Furthermore, the display surface of the display portion 9001 is curved, and display can be performed on the curved display surface. Furthermore, the portable information terminal 9200 can employ near field communication conformable to a communication standard. For example, hands-free calling can be achieved by mutual communication with a headset capable of wireless communication. Moreover, the portable information terminal 9200 includes the connection terminal 9006 and can perform direct data communication with another information terminal via a connector. Furthermore, charging through the connection terminal 9006 is possible. Note that the charging operation may be performed by wireless power feeding without using the connection terminal 9006.

Figure 39F:
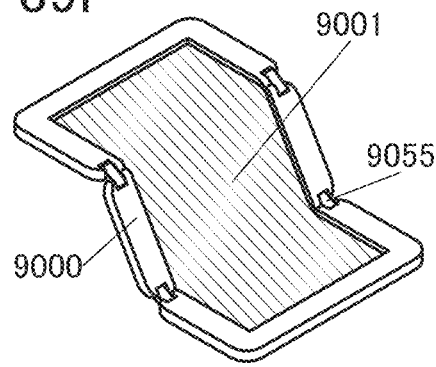
Figure 39G:
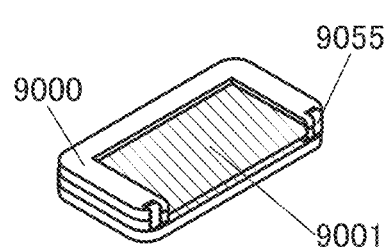

FIGS. 39E, F, and G are perspective views of a foldable portable information terminal 9201. Furthermore, FIG. 39E is the perspective view of the portable information terminal 9201 that is opened, FIG. 39F is the perspective view of the portable information terminal 9201 that is shifted from one of the opened state and the folded state to the other, and FIG. 39G is the perspective view of the portable information terminal 9201 that is folded. The portable information terminal 9201 is highly portable when folded, and is highly browsable when opened owing to a seamless large display region. The display portion 9001 of the portable information terminal 9201 is supported by three housings 9000 joined by hinges 9055. By being folded at the hinges 9055 between the two adjacent housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

Figure 40A:
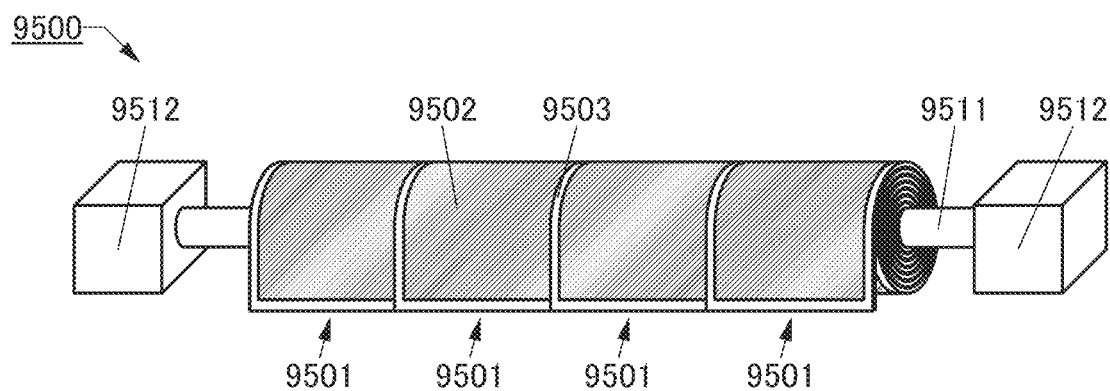
FIGS. 40A-B Perspective views illustrating a display device.
Figure 40B:
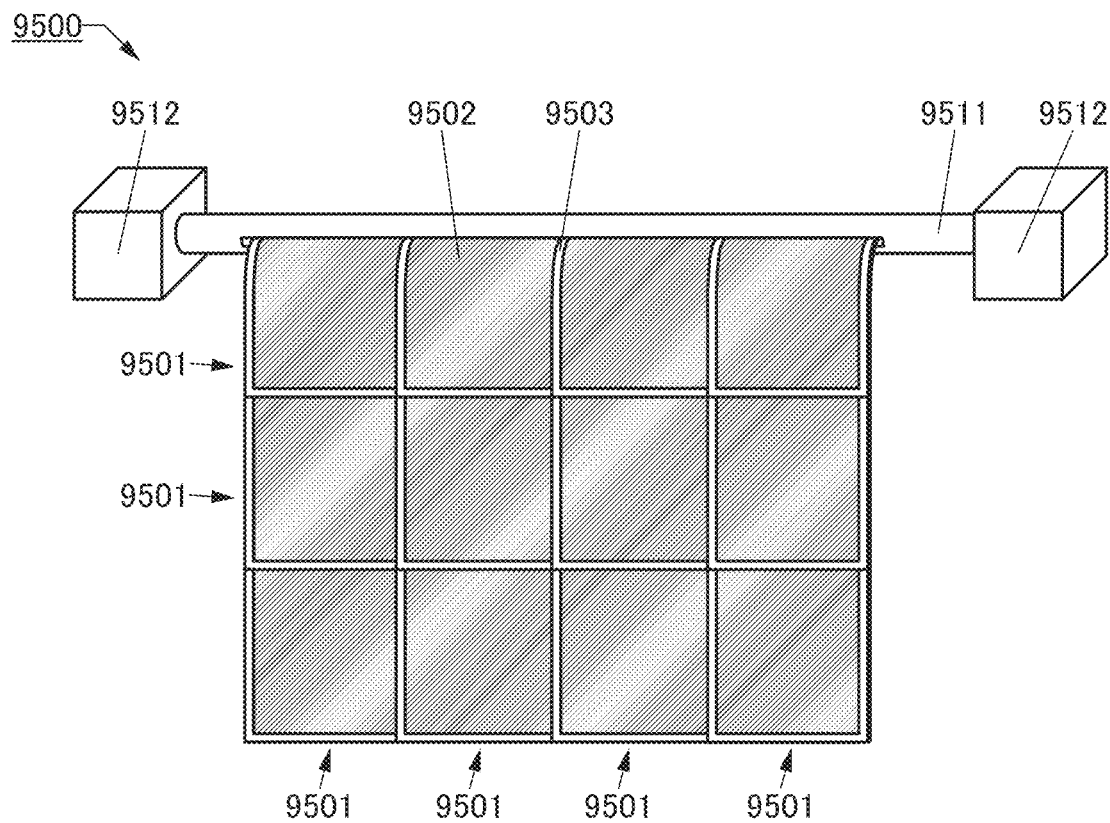

Next, an example of an electronic device that is different from the electronic devices illustrated in FIG. 38A to FIG. 38E and the electronic devices illustrated in FIG. 39A to FIG. 39G is illustrated in FIGS. 40A and B. FIGS. 40A and B are perspective views of a display device including a plurality of display panels. Note that the plurality of display panels are wound in the perspective view in FIG. 40A, and the plurality of display panels are unwound in the perspective view in FIG. 40B.

A display device 9500 illustrated in FIGS. 40A and B includes a plurality of display panels 9501, a hinge 9511, and a bearing 9512. Furthermore, the plurality of display panels 9501 each include a display region 9502 and a light-transmitting region 9503.

Furthermore, each of the plurality of display panels 9501 is flexible. Furthermore, two adjacent display panels 9501 are provided to partly overlap with each other. For example, the light-transmitting regions 9503 of the two adjacent display panels 9501 can overlap with each other. A display device having a large screen can be obtained with the plurality of display panels 9501. Furthermore, the display device is highly versatile because the display panels 9501 can be wound depending on its use.

Furthermore, although the display regions 9502 of the adjacent display panels 9501 are separated from each other in FIGS. 40A and B, without limitation to this structure, the display regions 9502 of the adjacent display panels 9501 may overlap with each other without any space so that a continuous display region 9502 is obtained, for example.

The electronic devices described in this embodiment are characterized by having a display portion for displaying some sort of information. Note that the semiconductor device of one embodiment of the present invention can also be used for an electronic device that does not have a display portion.

Note that the structures described in this embodiment can be combined as appropriate with any of the structures described in the other embodiments.

EXPLANATION OF REFERENCE

100 transistor
100A transistor
100B transistor
100C transistor
100D transistor
100E transistor
102 substrate
104 conductive film
106 insulating film
107 insulating film
108 oxide semiconductor film
108a oxide semiconductor film
108b oxide semiconductor film
108b_0 oxide semiconductor film
108c oxide semiconductor film
108c_ oxide semiconductor film
108c_0 oxide semiconductor film
112_1 conductive film
112_2 conductive film
112_3 conductive film
112a conductive film
112a_1 metal film
112a_2 metal film
112a_3 metal film
112b_ conductive film
112b conductive film
112b_1 metal film
112b_2 metal film
112b_3 metal film
112c conductive film
112c_1 metal film
112c_2 metal film
112c_3 metal film
114 insulating film
115 insulating film
116 insulating film
118 insulating film
120_1 oxide conductive film
120_2 metal film
120a conductive film
120a_1 oxide conductive film
120a_2 metal film
120b conductive film
120b_1 oxide conductive film
120b_2 metal film
141a mask
141b mask
141c mask
142a mask
142b mask
142c mask
151 opening
152a opening
152b opening
191 target
192 plasma
193 target
194 plasma
501 pixel circuit
502 pixel portion
504 driver circuit portion
504a gate driver
504b source driver
506 protection circuit
507 terminal portion
550 transistor
552 transistor
554 transistor
560 capacitor
562 capacitor
570 liquid crystal element
572 light-emitting element
664 electrode
665 electrode
667 electrode
700 display device
701 substrate
702 pixel portion
704 source driver circuit portion
705 substrate
706 gate driver circuit portion
708 FPC terminal portion 710 signal line
711 wiring portion
712 sealant
716 FPC
730 insulating film
732 sealing film
734 insulating film
736 coloring film
738 light-blocking film
750 transistor
752 transistor
760 connection electrode
770 planarization insulating film
772 conductive film
773 insulating film
774 conductive film
775 liquid crystal element
776 liquid crystal layer
777 conductive film
778 structure body
780 anisotropic conductive film
782 light-emitting element
786 EL layer
788 conductive film
790 capacitor
791 touch panel
792 insulating film
793 electrode
794 electrode
795 insulating film
796 electrode
797 insulating film
800 inverter
810 OS transistor
820 OS transistor
831 signal waveform
832 signal waveform
840 dashed line
841 solid line
850 OS transistor
860 CMOS inverter
900 semiconductor device
901 power supply circuit
902 circuit
903 voltage generation circuit
903A voltage generation circuit
903B voltage generation circuit
903C voltage generation circuit
904 circuit
905 voltage generation circuit
906 circuit
911 transistor
912 transistor
912A transistor
912B transistor
921 control circuit
922 transistor
7000 display module
7001 upper cover
7002 lower cover
7003 FPC
7004 touch panel
7005 FPC
7006 display panel
7007 backlight
7008 light source
7009 frame
7010 printed board
7011 battery
8000 camera
8001 housing
8002 display portion
8003 operation button
8004 shutter button
8006 lens
8100 finder
8101 housing
8102 display portion
8103 button
8200 head-mounted display
8201 mounting portion
8202 lens
8203 main body
8204 display portion
8205 cable
8206 battery
8300 head-mounted display
8301 housing
8302 display portion
8304 fixing band
8305 lens
9000 housing
9001 display portion
9003 speaker
9005 operation key
9006 connection terminal
9007 sensor
9008 microphone
9050 operation button
9051 information
9052 information
9053 information
9054 information
9055 hinge
9100 television device
9101 portable information terminal
9102 portable information terminal
9200 portable information terminal
9201 portable information terminal
9500 display device
9501 display panel
9502 display region
9503 region
9511 hinge
9512 bearing

The invention claimed is:
1. A semiconductor device comprising:
a first gate electrode over a substrate;
an insulating film over the first gate electrode;
an oxide semiconductor layer over the insulating film;
a conductive layer over and electrically connected to the oxide semiconductor layer; and
a second gate electrode over the oxide semiconductor layer,
wherein the first gate electrode includes a layer containing titanium, and a layer containing copper over the layer containing titanium,
wherein the oxide semiconductor layer contains indium, gallium and zinc,
wherein the conductive layer includes a layer containing molybdenum and titanium, and a layer containing copper over the layer containing molybdenum and titanium, and wherein the second gate electrode contains molybdenum, titanium and copper.

2. The semiconductor device according to claim 1, wherein the second gate electrode is an alloy of molybdenum, titanium and copper.

3. The semiconductor device according to claim 1, wherein the oxide semiconductor layer does not extend ends of the first gate electrode.

4. The semiconductor device according to claim 1, wherein a width of the second gate electrode is larger than a width of the oxide semiconductor layer.

5. A semiconductor device comprising:
a first gate electrode over a substrate;
an insulating film over the first gate electrode;
an oxide semiconductor layer over the insulating film;
a conductive layer over and electrically connected to the oxide semiconductor layer; and
a second gate electrode over the oxide semiconductor layer,
wherein the first gate electrode includes a layer containing titanium, and a layer containing copper over the layer containing titanium,
wherein the layer containing copper is thicker than the layer containing titanium,
wherein the oxide semiconductor layer contains indium, gallium and zinc,
wherein the conductive layer includes a layer containing molybdenum and titanium, and a layer containing copper over the layer containing molybdenum and titanium, and
wherein the second gate electrode contains molybdenum, titanium and copper.

6. The semiconductor device according to claim 5, wherein the second gate electrode is an alloy of molybdenum, titanium and copper.

7. The semiconductor device according to claim 5, wherein the oxide semiconductor layer does not extend ends of the first gate electrode.

8. The semiconductor device according to claim 5, wherein a width of the second gate electrode is larger than a width of the oxide semiconductor layer.

\* \* \* \* \*